(12) United States Patent
Motoyoshi et al.

(10) Patent No.: US 7,345,367 B2
(45) Date of Patent: Mar. 18, 2008

(54) MAGNETIC MEMORY DEVICE AND PRODUCING METHOD THEREOF

(75) Inventors: Makoto Motoyoshi, Kanagawa (JP); Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 18 days.

(21) Appl. No.: 10/508,924

(22) PCT Filed: Mar. 26, 2003

(86) PCT No.: PCT/JP03/03712

§ 371 (c)(1),
(2), (4) Date: Sep. 24, 2004

(87) PCT Pub. No.: WO03/081672

PCT Pub. Date: Oct. 2, 2003

(65) Prior Publication Data

US 2005/0162970 A1    Jul. 28, 2005

(30) Foreign Application Priority Data

Mar. 26, 2002 (JP) .............................. 2002-085095

(51) Int. Cl.
 *H01L 23/48* (2006.01)
 *H01L 23/52* (2006.01)
 *H01L 29/40* (2006.01)

(52) U.S. Cl. ............... 257/773; 257/773; 257/295; 257/E21.665; 365/158; 365/171; 365/173; 365/66

(58) Field of Classification Search ........... 257/773, 257/295, 421, 422, 427, E21.665; 365/130, 365/158, 171, 173, 66; 438/3, 48, 73
See application file for complete search history.

(56) References Cited

U.S. PATENT DOCUMENTS 6,211,090 B1 * 4/2001 Durlam et al. ............ 438/692
6,724,652 B2 * 4/2004 Deak ........................ 365/158

(Continued)

FOREIGN PATENT DOCUMENTS

EP    0776011    5/1997

(Continued)

*Primary Examiner*—Steven Loke
*Assistant Examiner*—Tram H Nguyen
(74) *Attorney, Agent, or Firm*—Robert J. Depke; Rockey, Depke & Lyons, LLC.

(57) ABSTRACT

A magnetic memory device exhibits improved writing characteristics by providing a magnetic flux concentrator which efficiently applies the magnetic field, which is generated by the writing word line, to the memory layer of the TMR element. The magnetic memory device (1) is composed of the TMR element (13), the writing word line (the first wiring) (11) which is electrically insulated from the TMR element (13), and the bit line (the second wiring) (12) which is electrically connected to the TMR element (13) and intersecting three-dimensionally with the writing word line (11), with the TMR element (13) interposed therebetween. The magnetic memory device (1) is characterized as follows. The magnetic flux concentrator (51) of high-permeability layer is formed along at least the lateral sides of the writing word line (11) and the side of the writing word line (11) which is opposite to the side facing the TMR element (13). At least either of the side walls of the magnetic flux concentrator (51) projects from the writing word line (11) toward the TMR element (11).

5 Claims, 33 Drawing Sheets

U.S. PATENT DOCUMENTS

| | | | |
|---|---|---|---|
| 6,833,278 B2 * | 12/2004 | Deak | 438/3 |
| 6,992,342 B2 * | 1/2006 | Motoyoshi et al. | 257/295 |
| 7,169,622 B2 * | 1/2007 | Grynkewich et al. | 438/3 |
| 2001/0036675 A1 | 11/2001 | Anthony | |
| 2001/0050859 A1 | 12/2001 | Schwarzl | |
| 2002/0034094 A1 * | 3/2002 | Saito et al. | 365/158 |
| 2003/0175997 A1 * | 9/2003 | Kyler et al. | 438/3 |
| 2003/0203509 A1 * | 10/2003 | Rizzo et al. | 438/3 |
| 2004/0099908 A1 * | 5/2004 | Durlam et al. | 257/347 |

FOREIGN PATENT DOCUMENTS

| | | |
|---|---|---|
| EP | 1054449 | 11/2000 |
| JP | 2002-246566 | 8/2002 |
| JP | 2003-031773 | 1/2003 |

* cited by examiner

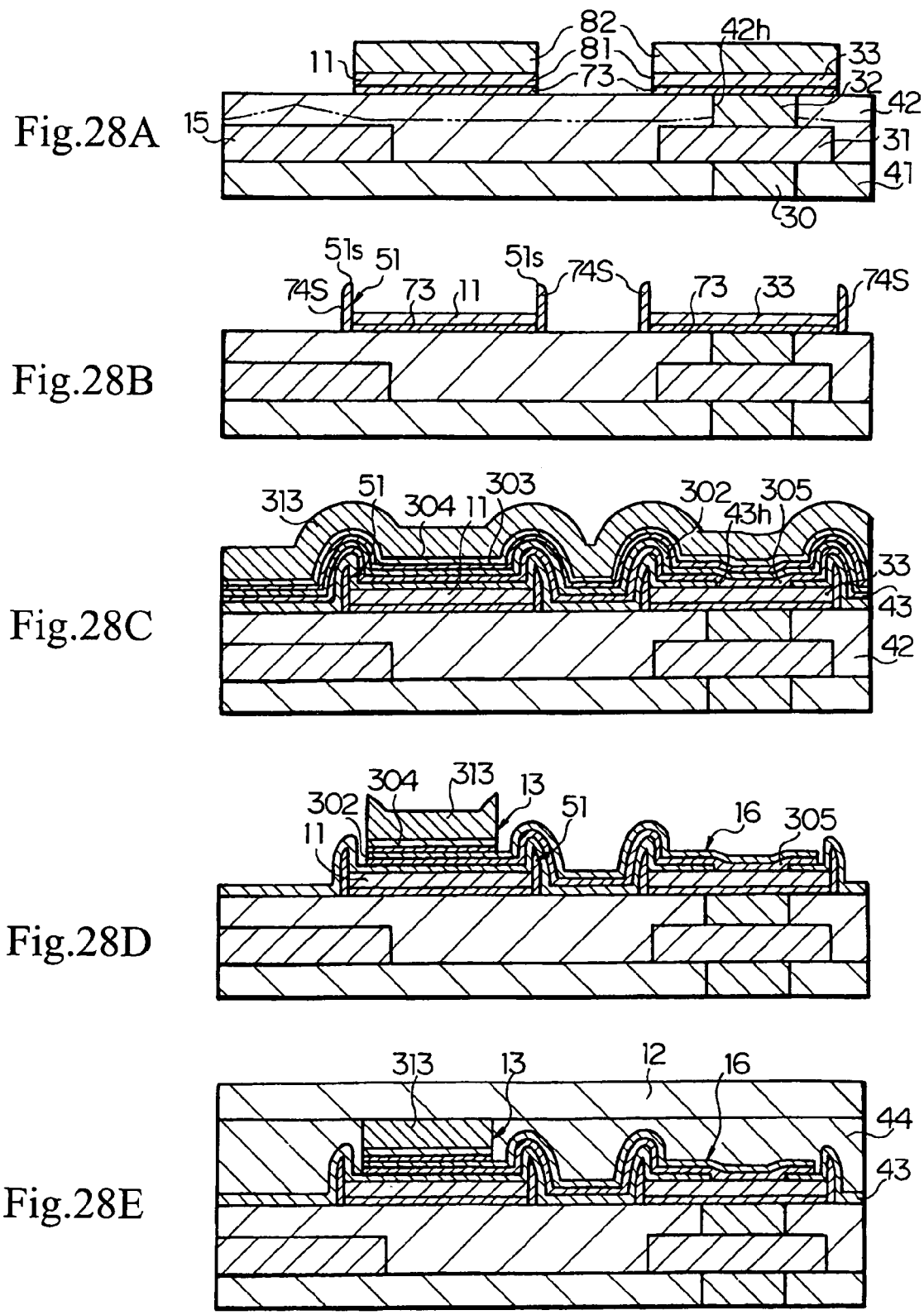

MAGNETIC MEMORY DEVICE AND PRODUCING METHOD THEREOF

This application claims priority to Japanese Patent Application Number JP2002-85095, filed Mar. 26, 2002 which is incorporated herein by reference.

1. Technical Field

The present invention relates to a magnetic memory device and a producing method thereof, and more particularly, to a non-volatile magnetic memory device and a producing method thereof. The magnetic memory device is designed to record information by utilizing the fact that the ferromagnetic body constituting the tunnel magnetoresistance element changes in resistance depending on whether the spin direction is parallel or anti-parallel.

2. Background Art

The recent wide spread of information and communications equipment, particularly personal small ones such as portable terminals, requires their constituents (such as memory elements and logic elements) to have improved performance, including high integration, high speed, and low power consumption. Particularly, non-volatile memory is regarded as an indispensable element in the age of ubiquitous computing.

Non-volatile memory preserves personal important information in case of dead battery and network failure. Moreover, non-volatile memory with a higher recording density and a larger recording capacity is expected to replace the existing hard disks and optical disks, which are essentially limited in further miniaturization, containing moving parts.

Recent portable equipment is so designed as to reduce power consumption as much as possible by keeping idle circuit blocks in stand-by mode. It would be possible to save power and memory if non-volatile memory is realized functioning as both high-speed network memory and large-capacity storage memory. Moreover, such high-speed large-capacity non-volatile memory would lead to the so-called instant-on function, which permits the equipment to start working instantaneously when power is turned on.

Among non-volatile memory are flush memory, which uses on semiconductors, and FRAM (Ferroelectric Random Access Memory), which uses ferroelectric substances. Flush memory is limited in writing speed (of the order of microseconds). FRAM is limited in rewriting cycles $10^{12}$ to $10^{14}$ and hence is low in durability to displace to SRAM (Static Random Access Memory) and DRAM (Dynamic Random Access Memory). Moreover, FRAM encounters difficulties in microprocessing of ferroelectric capacitors.

Magnetic memory called MRAM (Magnetic Random Access Memory) is noteworthy non-volatile memory free of these disadvantages. MRAM in the early stage is based on spin valve. It utilizes the AMR (Anisotropic Magneto Resistive) effect, which was reported by J. M. Daughton "Thin Solid Films" Vol. 216 (1992), p. 162 to 168. Alternatively, it utilizes the GMR (Giant Magneto Resistance) effect, which was reported by D. D. Tang et al., "IEDM Technical Digest" (1997), p. 995 to 997. Unfortunately, they have the disadvantage that the memory cell has a low resistance of 10 to 100Ω, which leads to a large power consumption per bit for reading. This disadvantage makes it difficult to realize a large-capacity memory.

Another type of MRAM utilizing the TMR (Tunnel Magneto Resistance) effect has come to attract attention, because the rate of change in resistance has recently jumped from 1-2% at room temperature (as reported by R. Meservey et al., "Physics Reports" Vol. 28 (1994), p. 214 to 217) to nearly 20% (as reported by T. Miyazaki et al., "J. Magnetism & Magnetic Material" Vol. 139 (1995), L231).

MRAM is simple in structure and hence is suitable for high integration. In addition, it is expected to be capable of rewriting many times, because it relies on the rotation of magnetic moment for recording. It is also expected to permit high-speed access. In fact, operation at 100 MHz has been reported by R. Scheuerlein et al., "ISSCC Digest of Technical Papers" (February 2000), p. 128 to 129.

Unfortunately, the advantage of MRAM, which is high speed and large integration as mentioned above, is offset by high power consumption due to MRAM's inherent structure. The reason is as follows. MRAM performs writing by means of the magnetic field, which is generated when current is applied to the writing bit line and the writing writing word line both arranged near individual TMR elements. The strength of the magnetic field to reverse the memory layer (memory layer) of the TMR element is 20 to 200 Oe, depending on the material, and the magnitude of the current to produce this magnetic field is several mA to tens of mA. High power consumption is contrary to power saving required of portable equipment.

Moreover, MRAM involves problems with large integration, because the bit lines and writing word lines should have the minimum line width determined by the lithography technology. Assume that the bit lines and writing word lines are 0.6 μm wide and 500 nm thick. Then, the current density would be 3 MA/cm². This current density is large enough to pose problems with short life due to electromigration, even though the bit lines and word lines are made of copper (whose practical current density is 0.5 MA/cm²). If the design rule is reduced further, the reversal magnetic field of the ferroelectric substance increases and it becomes necessary to reduce the dimension of the wiring. This poses a serious problem with wiring reliability.

Further, large integration is impeded, because the bit lines and writing word lines need high-current drivers occupying large areas. In addition, greatly miniaturized element causes the leakage of magnetic flux, which generates the magnetic field in adjacent bits. This poses a problem with disturbance. A solution to this problem is disclosed in U.S. Pat. No. 5,940,319. This patent claims that a material to concentrate magnetic flux should be applied to the lines at either or both of the upper and lower sides of the TMR element except for that part facing the TMR element. The claimed measure, however, does not fully produce the effect of concentrating magnetic flux and hence does not reduce power consumption as expected.

DISCLOSURE OF INVENTION

The present invention was completed to address the above-mentioned problem. It is an object of the present invention to provide a magnetic memory device and a producing method thereof.

The present invention is directed to a nonvolatile magnetic memory device of the first type having a first wiring, a second wiring intersecting three-dimensionally with the first wiring, and a tunnel magnetoresistance element which is electrically insulated from the first wiring and electrically connected to the second wiring and which is formed in the region of intersection of the first wiring and the second wiring such that a tunnel insulating layer is sandwiched between ferromagnetic materials which change in resistance depending on whether the spin direction is parallel or antiparallel, thereby recording information. A magnetic flux concentrator of high-permeability layer is formed at least on the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element.

The first magnetic memory device mentioned above has a magnetic flux concentrator of high-permeability layer formed at least on the lateral sides of a first wiring and on the side of the first wiring which is opposite to the side facing the tunnel magnetoresistance element. At least either of the high-permeability layer formed on the lateral sides of the first wiring projects from the first wiring toward the tunnel magnetoresistance element. Therefore, the magnetic field generated by the first wiring is efficiently concentrated at the memory layer of the tunnel magnetoresistance element by part of the magnetic flux concentrator projecting toward the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a nonvolatile magnetic memory device of the second type having a first wiring, a second wiring intersecting three-dimensionally with the first wiring, and a tunnel magnetoresistance element which is electrically insulated from the first wiring and electrically connected to the second wiring and which is formed in the region of intersection of the first wiring and the second wiring such that a tunnel insulating layer is sandwiched between ferromagnetic materials which change in resistance depending on whether the spin direction is parallel or antiparallel, thereby recording information. A magnetic flux concentrator of high-permeability layer is formed at least on the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element.

The second magnetic memory device mentioned above has a magnetic flux concentrator of high-permeability layer formed at least on the lateral sides of a second wiring and on the side of the second wiring which is opposite to the side facing the tunnel magnetoresistance element. At least either of the high-permeability layer formed on the lateral sides of the second wiring projects from the second wiring toward the tunnel magnetoresistance element. Therefore, the magnetic field generated by the second wiring is efficiently concentrated at the memory layer of the tunnel magnetoresistance element by part of the magnetic flux concentrator projecting toward the tunnel magnetoresistance element. The effect of the foregoing is that it is possible to reduce the current value necessary for writing. This leads to the saving of power consumption and extends the life on electromigration of the second wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a nonvolatile magnetic memory device of the third type having a first wiring, a second wiring intersecting three-dimensionally with the first wiring, and a tunnel magnetoresistance element which is electrically insulated from the first wiring and electrically connected to the second wiring and which is formed in the region of intersection of the first wiring and the second wiring such that a tunnel insulating layer is sandwiched between ferromagnetic materials which change in resistance depending on whether the spin direction is parallel or antiparallel, thereby recording information. A magnetic flux concentrator of high-permeability layer is formed between the first wiring and the tunnel magnetoresistance element and on the lateral sides of the tunnel magnetoresistance element, with an insulating film interposed therebetween.

The third magnetic memory device mentioned above has a magnetic flux concentrator of high-permeability layer formed between a first wiring and a tunnel magnetoresistance element and on the lateral sides of the tunnel magnetoresistance element, with an insulating film interposed therebetween. Therefore, the magnetic field generated by the first wiring is efficiently concentrated at the memory layer of the tunnel magnetoresistance element by the magnetic flux concentrator formed on the lower lateral sides of the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a nonvolatile magnetic memory device of the fourth type having a first wiring, a second wiring intersecting three-dimensionally with the first wiring, and a tunnel magnetoresistance element which is electrically insulated from the first wiring and electrically connected to the second wiring and which is formed in the region of intersection of the first wiring and the second wiring such that a tunnel insulating layer is sandwiched between ferromagnetic materials which change in resistance depending on whether the spin direction is parallel or antiparallel, thereby recording information. A first magnetic flux concentrator of high-permeability layer is formed at least on the lateral sides of the first wiring and on the side of the first wiring which is opposite to the side facing the tunnel magnetoresistance element. A second magnetic flux concentrator of high-permeability layer is formed between the first wiring and the tunnel magnetoresistance element and on the lateral sides of the tunnel magnetoresistance element, with an insulating film interposed therebetween.

In the fourth magnetic memory device mentioned above, a magnetic flux concentrator of high-permeability layer is formed at least on the lateral sides of a first wiring and on the side of the first wiring and is opposite to the side facing the tunnel magnetoresistance element. A second magnetic flux concentrator of high-permeability layer is formed between the first wiring and the tunnel magnetoresistance element and on the lateral sides of the tunnel magnetoresistance element, with an insulating film interposed therebetween. Therefore, the magnetic field generated by the first wiring is transmitted from the first magnetic flux concentrator to the second magnetic flux concentrator and is efficiently concentrated at the memory layer of the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a nonvolatile magnetic memory device of the fifth type having a first wiring, a second wiring intersecting three-dimensionally with the first wiring, and a tunnel magnetoresistance element which is electrically connected to the first wiring through a switching element and is electrically connected to the second wiring and which is formed in the region of intersection of the first wiring and the second wiring such that a tunnel insulating layer is sandwiched between ferromagnetic materials which change in resistance depending on whether the spin direction is parallel or antiparallel, thereby recording information. A magnetic flux concentrator of high-permeability layer is formed at least on the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element.

The fifth magnetic memory device mentioned above has a magnetic flux concentrator of high-permeability layer formed at least on the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element. Therefore, as in the first magnetic memory device mentioned above, the magnetic field generated by the first wiring is efficiently concentrated at the memory layer of the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a nonvolatile magnetic memory device of the sixth type having a first wiring, a second wiring intersecting three-dimensionally with the first wiring, and a tunnel magnetoresistance element which is electrically connected to the first wiring through a switching element and is electrically connected to the second wiring and which is formed in the region of intersection of the first wiring and the second wiring such that a tunnel insulating layer is sandwiched between ferromagnetic materials which change in resistance depending on whether the spin direction is parallel or antiparallel, thereby recording information. A magnetic flux concentrator of high-permeability layer is formed at least on the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element.

The sixth magnetic memory device mentioned above has a magnetic flux concentrator of high-permeability layer formed at least on the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element. Therefore, as in the second magnetic memory device mentioned above, the magnetic field generated by the second wiring is efficiently concentrated at the memory layer of the tunnel magnetoresistance element. The effect of the foregoing is that it is possible to reduce the current value necessary for writing. This leads to the saving of power consumption and extends the life on electromigration of the second wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The first, second, fourth, fifth, and sixth memory devices mentioned above may have an insulating film formed between the high-permeability layer and the first or second wiring. This modified structure also produces the same effect as mentioned above.

The present invention is directed to a producing method of a nonvolatile magnetic memory device of the first type by the steps of forming a first wiring, a tunnel magnetoresistance element which has a tunnel insulating layer sandwiched between ferromagnetic materials and is electrically isolated from the first wiring, and a second wiring which is electrically connected to the tunnel magnetoresistance element and intersects three-dimensionally with the first wiring, with the tunnel magnetoresistance element interposed therebetween. The method includes a step of forming a magnetic flux concentrator of high-permeability layer at least on the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element.

The method of producing the first magnetic memory device mentioned above includes a step of forming a magnetic flux concentrator of high-permeability layer at least on the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element. Therefore, the magnetic field generated by current flowing through the first wiring is efficiently concentrated at the memory layer (or recording layer) of the tunnel magnetoresistance element by the high-permeability layer formed on both of the lateral sides of the first wiring. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a method of producing a nonvolatile magnetic memory device of the second type by steps of forming a first wiring, a tunnel magnetoresistance element which has a tunnel insulating layer sandwiched between ferromagnetic materials and is electrically isolated from the first wiring, and a second wiring which is electrically connected to the tunnel magnetoresistance element and intersects three-dimensionally with the first wiring, with the tunnel magnetoresistance element interposed therebetween. The method includes a step of forming a magnetic flux concentrator of high-permeability layer at least on the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element.

The method of producing the second magnetic memory device mentioned above includes a step of forming a magnetic flux concentrator of high-permeability layer at least on the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element. Therefore, the magnetic field generated by current flowing through the second wiring is efficiently concentrated at the memory layer (or recording layer) of the tunnel magnetoresistance element. The effect of the foregoing is that it is possible to reduce the current value necessary for writing. This leads to the saving of power consumption and extends the life on electromigration of the second wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a method of producing a nonvolatile magnetic memory device of the third type by the steps of forming a first wiring, a tunnel magnetoresistance element which has a tunnel insulating layer sandwiched between ferromagnetic materials and is electrically isolated from the first wiring, and a second wiring which is electrically connected to the tunnel magnetoresistance element and intersects three-dimensionally with the first wiring, with the tunnel magnetoresistance element interposed therebetween. The method includes a step of forming, after forming the first wiring, a magnetic flux concentrator of high-permeability layer between the first wiring and the tunnel magnetoresistance element and on the lateral sides of the tunnel magnetoresistance element, with an insulating film interposed therebetween.

The method of producing the third magnetic memory device mentioned above includes a step of forming, after forming the first wiring, a magnetic flux concentrator of high-permeability layer between the first wiring and the tunnel magnetoresistance element and on the lateral sides of the tunnel magnetoresistance element, with an insulating film interposed therebetween. Therefore, the magnetic field generated by current flowing through the first wiring is efficiently concentrated at the memory layer (or recording layer) of the tunnel magnetoresistance element by the magnetic flux concentrator along on the lower lateral sides of tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a method of producing a nonvolatile magnetic memory device of the fourth type by the steps of forming a first wiring, a tunnel magnetoresistance element which has a tunnel insulating layer sandwiched between ferromagnetic materials and is electrically isolated from the first wiring, and a second wiring which is electrically connected to the tunnel magnetoresistance element and intersects three-dimensionally with the first wiring, with the tunnel magnetoresistance element interposed therebetween. The method includes a step of forming a first magnetic flux concentrator of high-permeability layer at least on the lateral sides of the first wiring and on the side of the first wiring which is opposite to the side facing the tunnel magnetoresistance element, and forming, after forming the first wiring, a second magnetic flux concentrator of high-permeability layer between the first wiring and the tunnel magnetoresistance element and on the lateral sides of the tunnel magnetoresistance element, with an insulating film interposed therebetween.

The method of producing the fourth magnetic memory device mentioned above includes a step of forming a first magnetic flux concentrator of high-permeability layer at least on the lateral sides of the first wiring and on the side of the first wiring which is opposite to the side facing the tunnel magnetoresistance element, and forming, after forming the first wiring, a second magnetic flux concentrator of high-permeability layer between the first wiring and the tunnel magnetoresistance element and on the lateral sides of the tunnel magnetoresistance element, with an insulating film interposed therebetween. Therefore, the magnetic field generated by current flowing through the first wiring is transmitted from the first magnetic flux concentrator to the second magnetic flux concentrator and efficiently concentrated at the memory layer (or recording layer) of the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a method of producing a nonvolatile magnetic memory device of the fifth type by the steps of forming a first wiring, a switching element on the first wiring, a tunnel magnetoresistance element which has a tunnel insulating layer sandwiched between ferromagnetic materials and is connected to the first wiring through the switching element, and a second wiring which is electrically connected to the tunnel magnetoresistance element and intersects three-dimensionally with the first wiring, with the tunnel magnetoresistance element interposed therebetween. The method includes a step of forming a magnetic flux concentrator of high-permeability layer at least on the lateral sides of the first wiring and on the side of the first wiring which is opposite to the side facing the tunnel magnetoresistance element. At least either of the high-permeability layers formed on both of the lateral sides of the first wiring projects from the first wiring toward the tunnel magnetoresistance element.

The method of producing the firth magnetic memory device mentioned above includes a step of forming a magnetic flux concentrator of high-permeability layer at least on the lateral sides of the first wiring and on the side of the first wiring which is opposite to the side facing the tunnel magnetoresistance element. At least either of the high-permeability layers formed on both of the lateral sides of the first wiring projects from the first wiring toward the tunnel magnetoresistance element. Therefore, as in the method of producing the first magnetic memory device, the magnetic field generated by current flowing through the first wiring is efficiently concentrated at the memory layer (or recording layer) of the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The present invention is also directed to a method of producing a nonvolatile magnetic memory device of the sixth type by steps of forming a first wiring, a switching element on the first wiring, a tunnel magnetoresistance element which has a tunnel insulating layer sandwiched between ferromagnetic materials and is connected to the first wiring through the switching element, and a second wiring which is electrically connected to the tunnel magnetoresistance element and intersects three-dimensionally with the first wiring, with the tunnel magnetoresistance element interposed therebetween. The method includes a step of forming a magnetic flux concentrator of high-permeability layer at least on the lateral sides of the second wiring and on the side of the second wiring which is opposite to the side facing the tunnel magnetoresistance element. At least either of the high-permeability layers formed on both of the lateral sides of the second wiring projects from the second wiring toward the tunnel magnetoresistance element.

The method of producing the sixth magnetic memory device mentioned above includes a step of forming a magnetic flux concentrator of high-permeability layer at least on the lateral sides of the second wiring and on the side of the second wiring which is opposite to the side facing the tunnel magnetoresistance element. At least either of the high-permeability layers formed on both of the lateral sides of the second wiring projects from the second wiring toward the tunnel magnetoresistance element. Therefore, as in the method of producing the second magnetic memory device, the magnetic field generated by current flowing through the second wiring is efficiently concentrated at the memory layer (or recording layer) of the tunnel magnetoresistance element. The effect of the foregoing is that it is possible to reduce the current value necessary for writing. This leads to the saving of power consumption and extends the life on electromigration of the second wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The above-mentioned method of producing the first, second, fourth, fifth, and sixth memory devices produces the same effect as mentioned above even though an insulating film is formed between the high-permeability layer and the first or second wiring.

BRIEF DESCRIPTION OF DRAWINGS

FIGS. 28A to 28E are schematic sectional views showing the producing method of the first magnetic memory device of the second embodiment according to the present invention.

BEST MODE FOR CARRYING OUT THE INVENTION

First of all, a description is given below of the ordinary MRAM (Magnetic Random Access Memory) with reference to FIG. 2, which is a simplified schematic perspective view showing main constituents, with reading circuits omitted.

Figure 2:
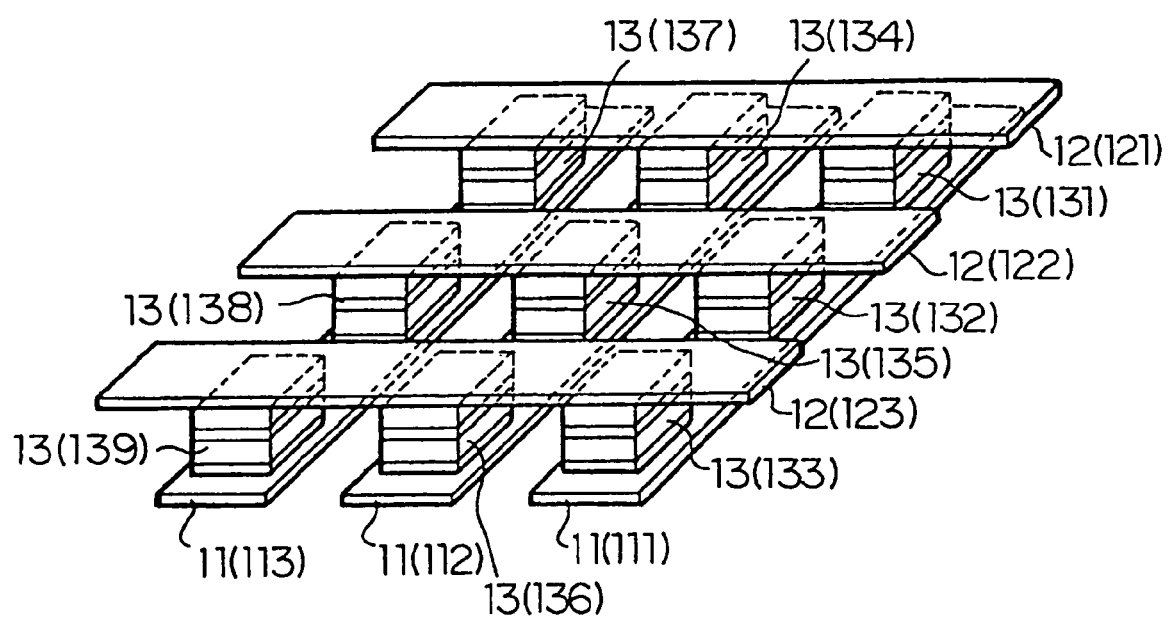
FIG. 2 is a simplified schematic perspective view showing the structure of the major parts of the ordinary MRAM.

The MRAM shown in FIG. 2 is composed of nine memory cells, which have writing word lines 11 (111, 112, and 113) and bit lines 12 (121, 122, and 123), which intersect each other. In each region of the intersection of the writing word line 11 and the bit line 12 is arranged the TMR element 13 (131 to 139), which is formed on the writing word line 11, with an insulating film (not shown) interposed therebetween, and is connected to the bit line 12. Writing into the TMR element 13 is accomplished as the bit line 12 and the writing word line 11 are activated. Current flowing through these lines generates a combined magnetic field, which magnetizes the memory layer 304 (see FIG. 5 for detail) of the TMR element 13 in the direction parallel or anti-parallel to the magnetization pinned layer 302 (see FIG. 5 for detail). Incidentally, the TMR element 13 is formed in the region of the intersection of the writing word line 11 and the bit line 12.

Figure 3:
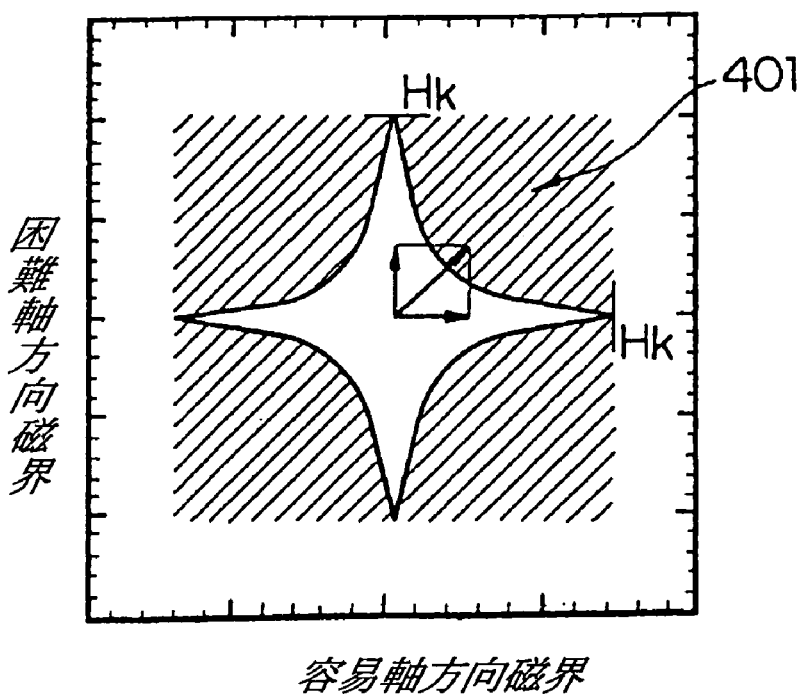
FIG. 3 is an asteroid curve showing the threshold value at which the magnetization direction of the memory layer is reversed by the magnetic field $H_{EA}$ in the direction of easy axis and the magnetic field $H_{HA}$ in the direction of hard axis.

The asteroid curve shown in FIG. 3 represents the reversal threshold value in the magnetization direction of the memory layer by the magnetic field $H_{EA}$ applied in the direction of easy axis and the magnetic field $H_{HA}$ applied in the direction of hard axis. The combined magnetic field vector outside the asteroid curve brings about the reversal of magnetic field. By contrast, the combined magnetic field vector within the asteroid curve does not reverse the cell from one bistable state into the other. Any cell which is not at the intersection of the word line and the bit line receives the magnetic field generated individually by the lines, and it has its magnetization direction reversed if the magnitude of the magnetic field is larger than the one direction reversal magnetic field $H_k$. Consequently, only if the combined magnetic field is in the hatched area 401, the selected cell permits selective writing.

As mentioned above, the MRAM array contains memory cells arranged at the intersections of the grid composed of bit lines and writing word lines. In the case of MRAM, selective writing in individual memory cells is usually accomplished by means of the writing word lines and bit lines which have the characteristics of asteroid magnetization reversal.

The combined magnetization at a single memory region is determined by the vector synthesis of the magnetic field $H_{EA}$ in the direction of easy axis and the magnetic field $H_{HA}$ in the direction of hard axis, both applied to the memory region. Current flowing through the bit line applies to the cell the magnetic field $H_{EA}$ in the direction of easy axis, and current flowing through the writing word line applies to the cell the magnetic field $H_{HA}$ in the direction of hard axis.

Next, a description is given below of the first magnetic memory device of the first embodiment according to the present invention with reference to FIGS. 1A and 1B, which are schematic sectional views. The first embodiment of the magnetic memory device according to the present invention is basically identical with the magnetic memory device explained above with reference to FIG. 2, except that it is designed such that the magnetic field generated by the writing word line is efficiently concentrated at the memory layer.

Figure 1A:
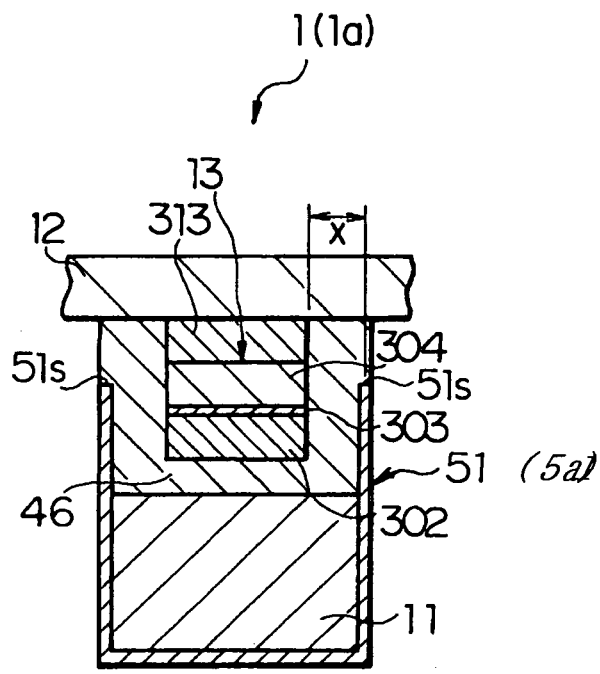
FIGS. 1A and 1B are schematic sectional views showing the structure of the first magnetic memory device of the first embodiment according to the present invention.

The first magnetic memory device 1 (1a) is constructed essentially as shown in FIG. 1A. The device 1 (1a) has a writing word line 11 and a bit line 12. The bit line 12 is provided above the word line 11 and intersects (for example, at right angles) with the word line 11. The device 1 (1a) also has a Tunnel Magnetoresistance Element (hereinafter called TMR element) 13, which is formed above the word line 11 and in the region of the intersection of the lines 11 and 12. The TMR element 13 is separated from the word line 11 by an insulating film 46 interposed therebetween, and it is connected to the bit line 12.

The writing word line 11 has its lateral and lower sides covered by a high-permeability layer, which functions as a magnetic flux concentrator 51 (51a). (The lower side is opposite to the side facing the TMR 13.) Either or both of the magnetic flux concentrator 51 formed on the lateral sides of the writing word line 11 project toward the TMR element 13 from the writing word line 11. (Projections on both sides are shown in the figure.) In other words, the magnetic flux concentrator 51 projects toward the TMR element 13, with an insulating film 46 interposed between the projection of the magnetic flux concentrator 51 and the TMR element 13. The end 51s of the magnetic flux concentrator 51 may extend up to the same height as the interface between the memory layer 304 and the cap layer (not shown) in the TMR element 13. The height should preferably range from the interface between the tunnel insulating film 303 and the memory layer 304 to the interface between the memory layer 304 and the cap layer 313. The end 51s of the magnetic flux concentrator 51 should be within a distance x from the TMR element 13. The distance x should preferably be no larger than 200 nm so that the magnetic flux concentrated at the end 51s of the magnetic flux concentrator 51 efficiently reaches the memory layer 304.

The magnetic flux concentrator 51 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

In the case where any electrical insulating layer is not interposed between the writing word line 11 and the magnetic flux concentrator 51 as shown in the figure, it is desirable that the magnetic flux concentrator 51 be a soft magnetic film having a high resistivity to prevent current loss. Although the magnetic flux concentrator 51 formed on both sides of the writing word line 11 projects toward the TMR element 13 as shown in the figure, the projected part on either side may be omitted.

Figure 1B:
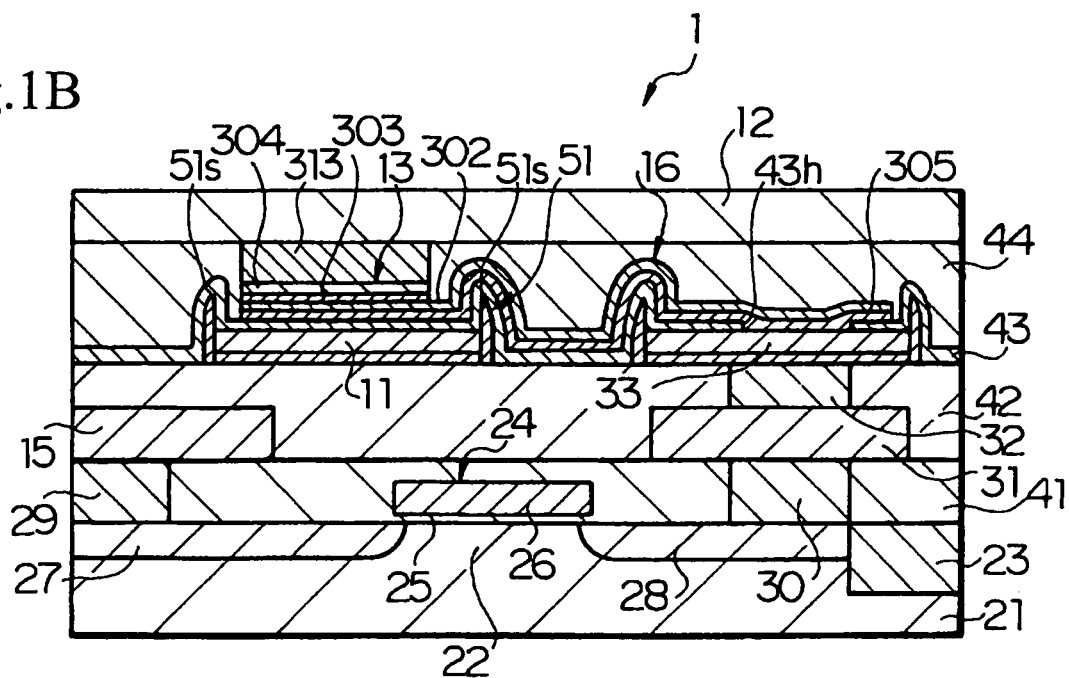

A description is given below of the first magnetic memory device 1 incorporated with the above-mentioned basic structure as shown in FIG. 1B.

In FIG. 1B, a semiconductor substrate 21 (such as p-type semiconductor substrate) is shown. On the surface of the semiconductor substrate 21 is formed a p-type well region 22. In this p-type well region 22 is formed an element separating region 23, which separates the transistor forming region, by so-called STI (Shallow Trench Isolation). On the p-type well region 22 is formed a gate electrode (word line) 26, with a gate insulating film 25 interposed therebetween. At both sides of the gate electrode 26 in the p-type well region 22 are formed diffusion layer regions 27 and 28 (such as $N^+$ diffusion layer region). These components constitute the field effect transistor 24 for selection.

The above-mentioned field effect transistor 24 (or n-type or p-type) functions as a switching element for reading. It may be replaced by any other switching element such as diode and bipolar transistor.

The field effect transistor 24 is covered by a first insulating film 41. Adjacent to the first insulating film 41 are contacts 29 and 30 (such as tungsten plug), which are connected to the diffusion layer regions 27 and 28, respectively. In addition, on the first insulating film 41 are formed a sense line 15 (connected to a contact 29) and a first landing pad 31 for the sense line (which is connected to a contact 30).

On the first insulating film 41 is formed a second insulating film 42, which covers the sense line 15 and the first landing pad 31. On the second insulating film 42 is formed a contact 32 (such as tungsten plug), which is connected to the first landing pad 31. In addition, on the second insulating film 42 are formed a second landing pad 33, which is connected to the contact 32, and a writing word line 11 as a first wiring.

The writing word line 11 has its both lateral sides and its lower side covered by a magnetic flux concentrator 51, which is the same one as explained with reference to FIG. 1A. The lower side is opposite to the side facing a Tunnel Magnetoresistance Element (hereinafter called TMR element) 13. Either or both (as illustrated) of the flux concentrators 51 formed on the lateral sides of the writing word line 11 project toward the TMR element 13 from the writing word line 11.

In FIG. 1A, the magnetic flux concentrator 51 with its ends projecting is formed on the lateral sides of the TMR element 13, with insulating films 43 and 44 interposed therebetween. The projected end 51s of the magnetic flux concentrator 51 is approximately as high as the memory layer 304 of the TMR element 13. The distance between the end 51s of the magnetic flux concentrator 51 and the TMR element should be such that the magnetic flux concentrated at the end 51s of the magnetic flux concentrator 51 efficiently reaches the memory layer 304. The distance is, for example, no longer than 200 nm.

The magnetic flux concentrator 51 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

On the second insulating film 42 is formed a third insulating film 43, which covers the writing word line 11, the magnetic flux concentrator 51, and the second landing pad 33. In the third insulating film 43 is formed an opening 43h, which reaches the second landing pad 33.

Further, on the third insulating film 43 is formed an antiferromagnetic material layer 305, which extends from the upper part of the writing word line 11 to the opening 43h. On the antiferromagnetic material layer 305 and above the writing word line 11 are formed a magnetization pinned layer 302 of ferromagnetic material, a memory layer 304 whose magnetization rotates comparatively easily, with a tunnel insulating film 303 interposed therebetween, and the cap layer 313. The ferromagnetic material layer 305 and the cap layer 313 constitute an information memory device (hereinafter is called the TMR element) 13. One example of the TMR element 13 will be described later. Incidentally, in this figure, the by-pass line 16 is formed on the antiferromagnetic material layer 305 such that the magnetization pinned layer 302 is extended.

On the third insulating film 43 is formed a fourth insulating film 44, which covers the by-pass line 16 and the TMR element 13. The fourth insulating film 44 has its surface planarized so that the surface of the cap layer 313, which is the uppermost layer of the TMR element 13, is exposed. On the fourth insulating film 44 is formed a bit line 12 as a second wiring, which is connected to the upper surface of the TMR element 13 and intersects three-dimensionally with the writing word line 11 (at right angles) and with the TMR element 13 held therebetween.

Figure 4:
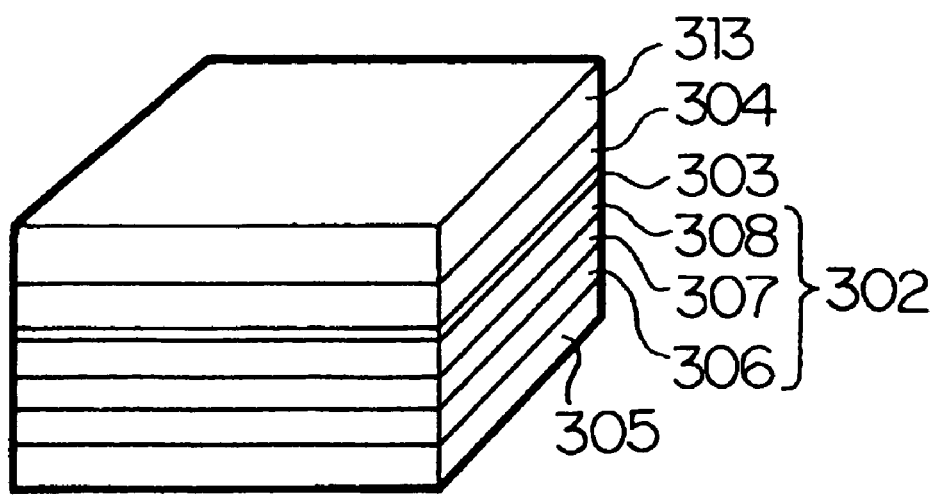
FIG. 4 is a schematic perspective view showing the structure of one example of the TMR element.

Next, a description is given below of one example of the TMR element with reference to FIG. 4, which is a schematic perspective view. FIG. 4 shown an antiferromagnetic material layer 305, a magnetization pinned layer 302, a tunnel insulating film 303, a memory layer 304, and a cap layer 313, which are sequentially placed one over another. The magnetization pinned layer 302 is composed of a first magnetization pinned layer 306, a conductor layer 307, and a second magnetization pinned layer 308. The conductor layer 307 makes the magnetic layer form an antiferromagnetic coupling. The laminate structure of the magnetization pinned layer 302 may be replaced by a single layer structure of ferromagnetic material or a laminate structure composed of three or more layers of ferromagnetic material, with a conductor layer held therebetween. The antiferromagnetic material layer 305 may have an underlying conductor layer (not shown) for connection with a switching element to be connected in series with the TMR element. Alternatively, the underlying conductor layer may function as the antiferromagnetic material layer 305.

The memory layer 304, the first magnetization pinned layer 306, and the second magnetization pinned layer 308 are formed from a ferromagnetic material selected from nickel, iron, cobalt, and alloys composed of at least two members thereof.

The conductor layer 307 is formed from a conducting material such as ruthenium, copper, chromium, gold, and silver.

The first magnetization pinned layer 306 is in contact with the antiferromagnetic material layer 305, so that the layer 306 has a strong unidirectional magnetic anisotropy due to exchange interaction between these layers.

The antiferromagnetic material layer 305 may be formed from any one of iron-manganese alloy, nickel-manganese alloy, platinum-manganese alloy, iridium-manganese alloy, rhodium-manganese alloy, cobalt oxide, and nickel oxide.

The tunnel insulating film 303 is formed from any one of aluminum oxide, magnesium oxide, silicon oxide, aluminum nitride, magnesium nitride, silicon nitride, aluminum oxide nitride, magnesium oxide nitride, and silicon oxide nitride.

The tunnel insulating film 303 severs the magnetic coupling between the memory layer 304 and the magnetization pinned layer 302 and also permits the tunnel current to flow. The magnetic film and the conductor film are formed mainly by sputtering. The tunnel insulating layer may be obtained by oxidizing, nitriding, or oxidizing-nitriding the metal film formed by sputtering.

The cap layer 313 constitutes the uppermost layer. It prevents mutual diffusion between two wirings connecting one TMR element 13 to another TMR element 13. The layer 313 also reduces contact resistance and protects the memory layer 304 from oxidation. The layer 313 is usually formed from any one of copper, tantalum nitride, tantalum, and titanium nitride.

Next, a description is given below of the action of the above-mentioned magnetic memory device 1. The TMR element 13 detects the change in tunnel current due to magnetoresistance effect, thereby reading information. This effect depends on the relative magnetization direction in the memory layer 304 and the first and second magnetization pinned layers 306 and 308.

The TMR element 13 records "1" or "0" according to the magnetization direction of the memory layer 304 which changes as currents flowing through the bit line 12 and the writing word line 11 generate a combined magnetic field. Detection of change in tunnel current due to magnetoresistance effect permits reading. Resistance is low (representing "0"), when the memory layer 304 and the magnetization pinned layer 302 are magnetized in the parallel direction. Resistance is high (representing "1"), when the memory layer 304 and the magnetization pinned layer 302 are magnetized in the antiparallel direction.

Figure 5:
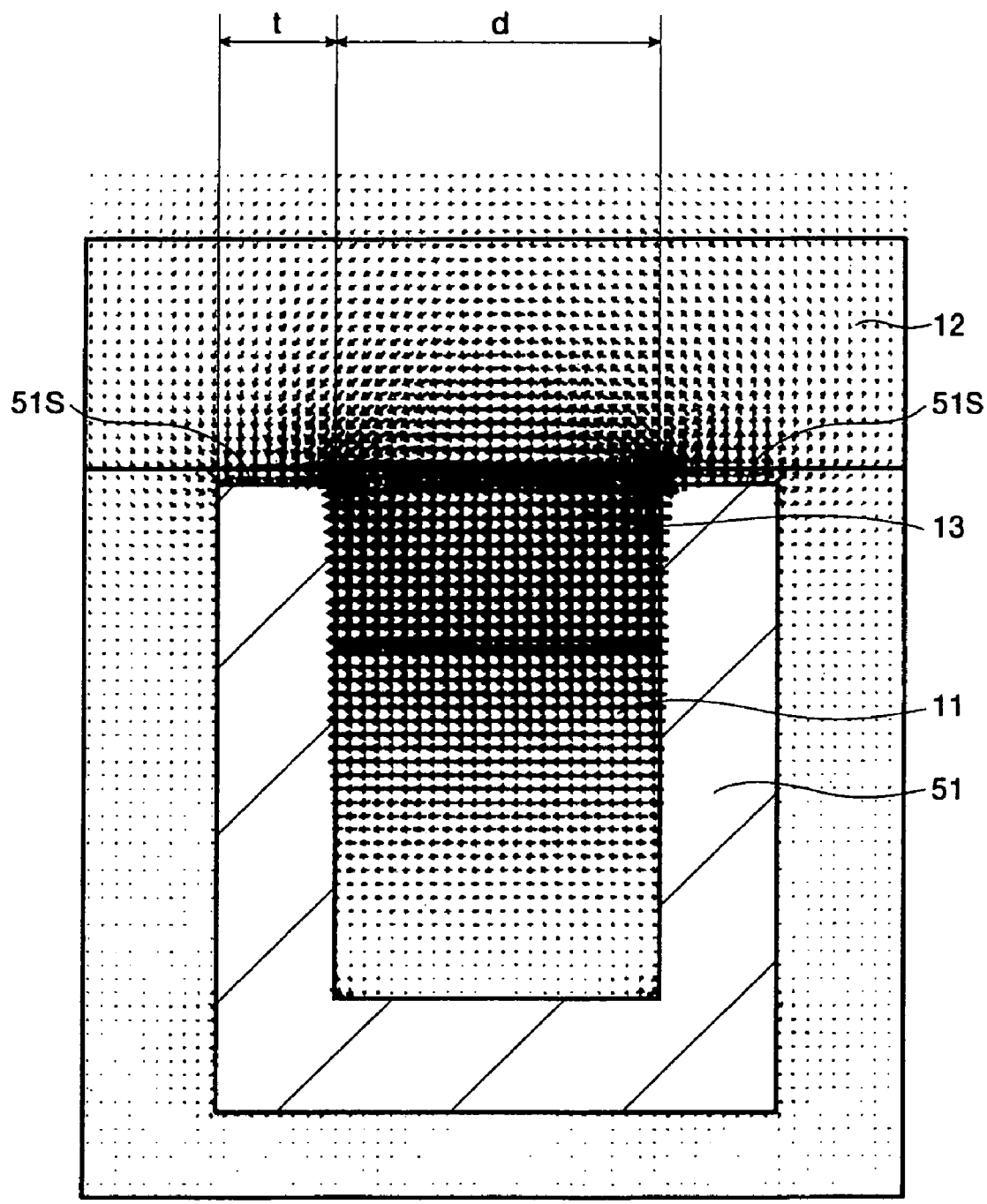
FIG. 5 is a diagram showing the result of simulation for the distribution of the magnetic field generated by current flowing through the writing word line in the first magnetic memory device of the first embodiment according to the present invention.

In the magnetic memory device 1 constructed as mentioned above, the writing word line 11 generates a magnetic field, whose distribution observed by simulation is shown in FIG. 5. FIG. 5 schematically shows the writing word line 11, the TMR element 13, and the magnetic flux concentrator 51. "t" represents the thickness of the end 51s of the magnetic flux concentrator 51 formed on the lateral sides of the writing word line 11. "d" represents the distance between one end 51s and the other end 51s. Simulation was carried out on the assumption that "t" is 0.21 μm and "d" is 0.59 μm. The magnetic field is indicated by arrows. The length of each arrow denotes the strength of magnetic field, and the direction of each arrow denotes the direction of magnetic field.

It is apparent from the distribution of magnetic field shown in FIG. 5, the magnetic memory device 1 works such that the writing word line 11 generates a magnetic field, which is transmitted to the magnetic flux concentrator 51 and is concentrated at the memory layer 304 of the TMR element 13 efficiently by the ends 51s of the magnetic flux concentrator 51. (The memory layer 304 is shown in FIGS. 1A and 1B and FIG. 4.)

Next, a description is given below of the first magnetic memory device of the second embodiment with reference to FIG. 6, which is a schematic sectional view. The first magnetic memory device of the second embodiment according to the present invention is identical with the magnetic memory device 1 explained above with reference to FIGS. 1A and 1B and FIG. 5, except that it is designed for efficient concentration of magnetic field generated by the writing word line at the memory layer. Incidentally, FIG. 6 only shows the writing word line, TMR element, and magnetic flux concentrator, with the insulating film and other constituents omitted. The magnetic field is indicated by arrows. The length of each arrow denotes the strength of magnetic field, and the direction of each arrow denotes the direction of magnetic field.

Figure 6:
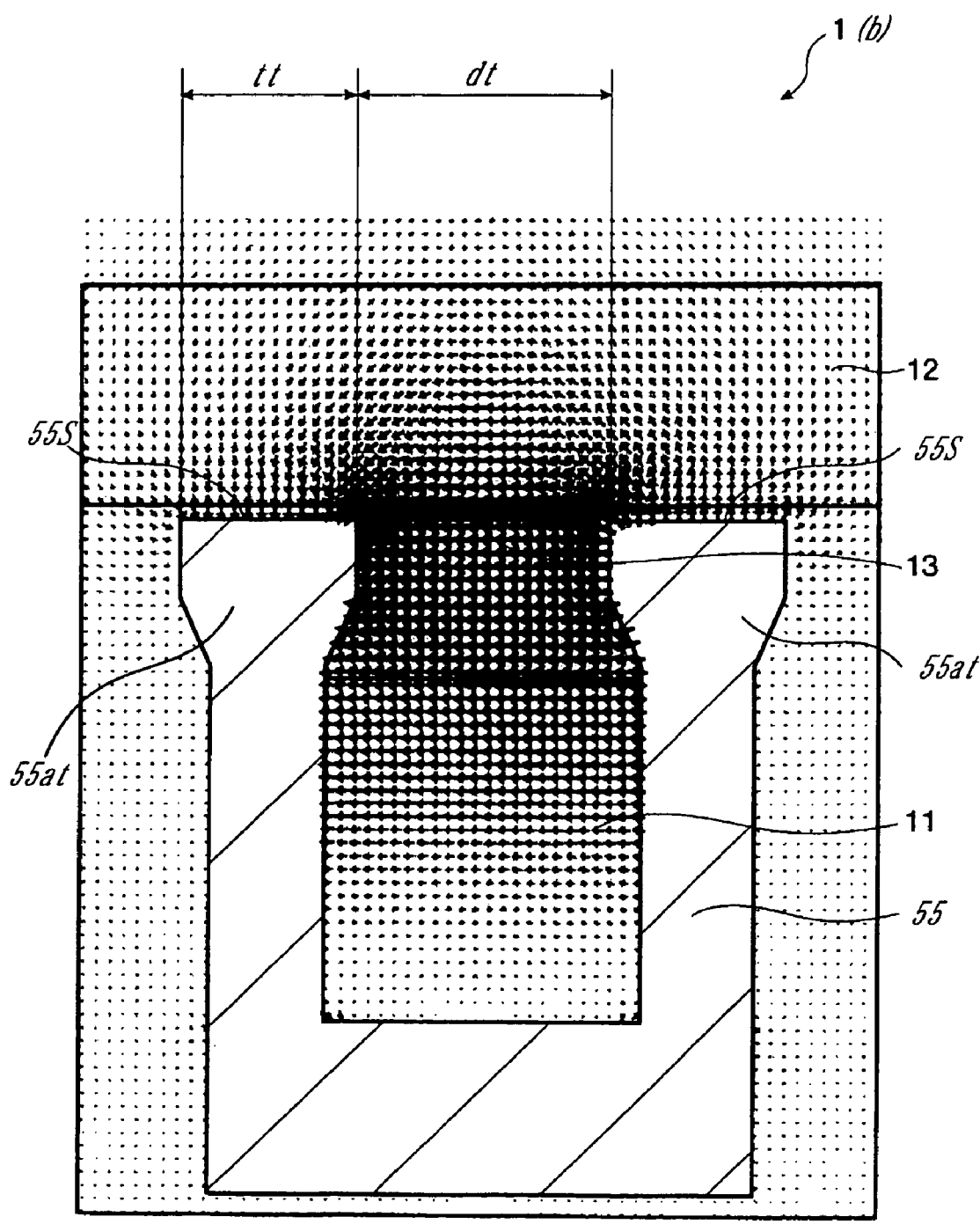
FIG. 6 is a schematic sectional view showing the structure of the first magnetic memory device of the second embodiment according to the present invention.

As shown in FIG. 6, the magnetic memory device 1 (1*b*) has a writing word line 11 and a bit line 12. The bit line 12 is provided above the word line 11 and is three-dimensionally intersects with the word line 11. In the region of intersection and on the writing word line 11 is formed the TMR element 13, with its upper surface connected to the bit line 12. On the lateral sides and the lower side of the writing word line 11 is formed a magnetic flux concentrator 55 of a high-permeability layer. The lower side is opposite to the side facing the TMR element 13. Either or both of the magnetic flux concentrator 55 formed on the lateral sides of the writing word line 11 project from the writing word line 11 toward the TMR element 13. The projecting end 55*s* swells in its thickness direction and forms a swollen part 55*at*. The thickness tt of the swollen part 55*at* is 0.328 µm, and the distance dt between both of the swollen parts 55*at* formed inside of the projecting end 55*s* is 0.472 µm.

In the embodiment shown in FIG. 6, the swollen part 55*at* of the projecting end 55*s* is formed on both sides. However, it may be formed only on one side. Moreover, as shown in the figure, the magnetic flux concentrator 55 is formed such that those parts formed on both of the lateral sides of the writing word line 11 project from the writing word line 11 toward the TMR element 13. However, this projecting part may be formed only on one side of the writing word line 11.

The magnetic flux concentrator 55 shown in the second embodiment reduces the leakage of magnetic flux more than the concentrator 51 in the first embodiment. Therefore, the concentrator 55 of the second embodiment concentrates the magnetic flux, which generated by the writing word line 11, at the memory layer 304 of the TMR element 13 more efficiently than the concentrator 51 of the first embodiment.

Figure 7:
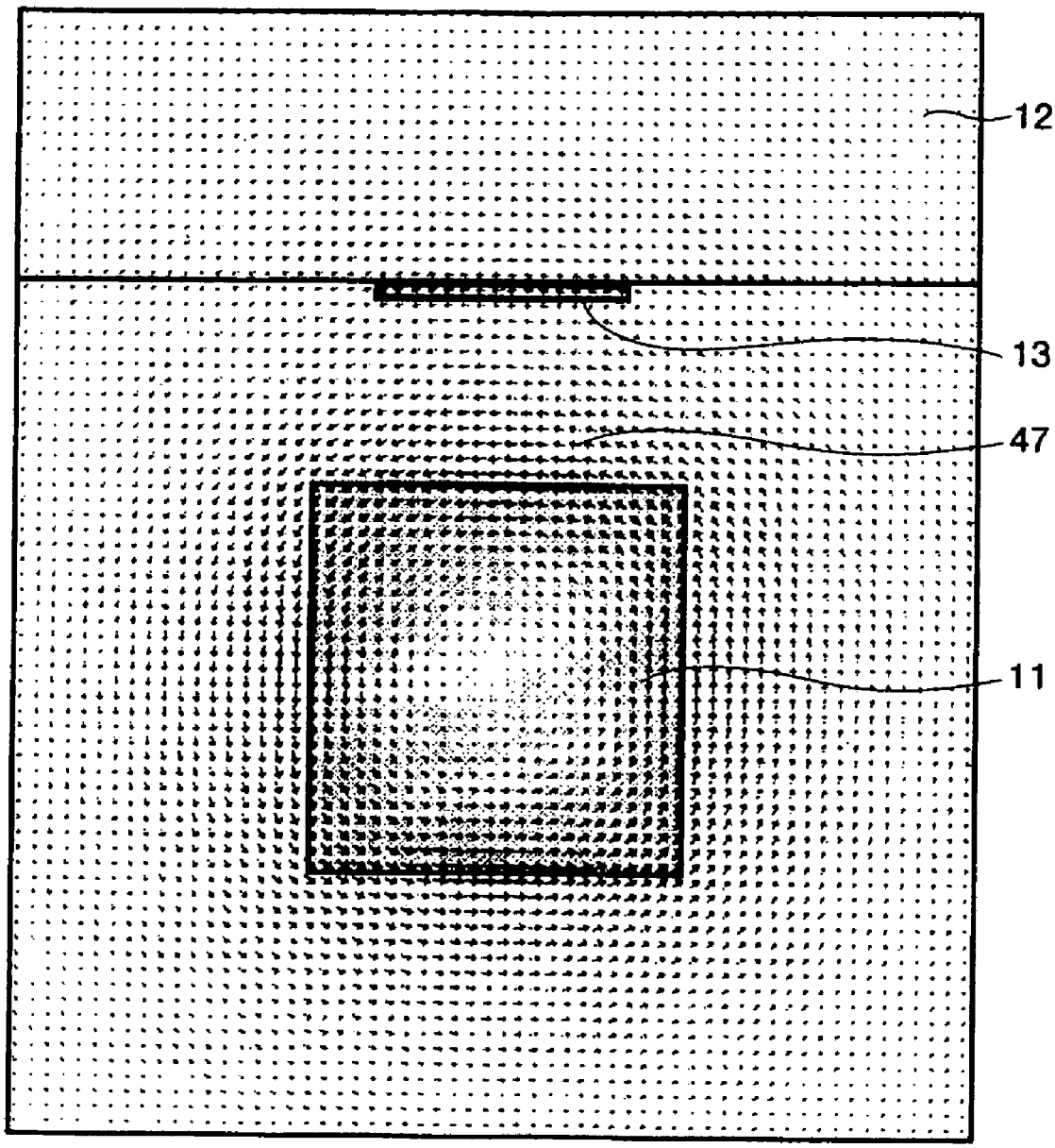
FIG. 7 is a schematic sectional view showing the writing word line, the surrounding structure thereof, and the distribution of the magnetic field due to current around the writing word line in the conventional MRAM cell as Comparative Example 1.

Next, Comparative Example 1 is explained with reference to FIG. 7, which is a sectional view showing the writing word line and its surroundings of an MRAM cell of conventional structure. FIG. 7 also shows the distribution of magnetic field around the writing word line and its surroundings. In FIG. 7, the magnetic field is indicated by arrows. The length of each arrow denotes the strength of magnetic field, and the direction of each arrow denotes the direction of magnetic field.

As shown in FIG. 7, above the writing word line 11 is formed a bit line 12, intersecting three-dimensionally with the writing word line 11. In the region of intersection is formed a TMR element 13 measuring 0.4 by 0.8 µm. This TMR element 13 is formed on the writing word line 11, with an insulating film 47 (300 nm thick) interposed therebetween. The upper side of the TMR element 13 is connected to the bit line 12.

Simulation was carried out to visualize the magnetic field generated by current flowing through the writing word line 11. As shown in FIG. 7, it was found that the magnetic field due to the writing word line 11, the TMR element 13, and the bit line 12 is distributed as if it surrounds the writing word line 11. This implies that the magnetic field generated by the writing word line 11 cannot be concentrated at the TMR element 13, unlike the above-mentioned embodiment having the magnetic flux concentrator 51 or 55. Moreover, the magnetic field generated by current flowing through the writing word line 11 steeply decreases as the distance increases between the TMR element 13 and the writing word line 11.

Figure 8:
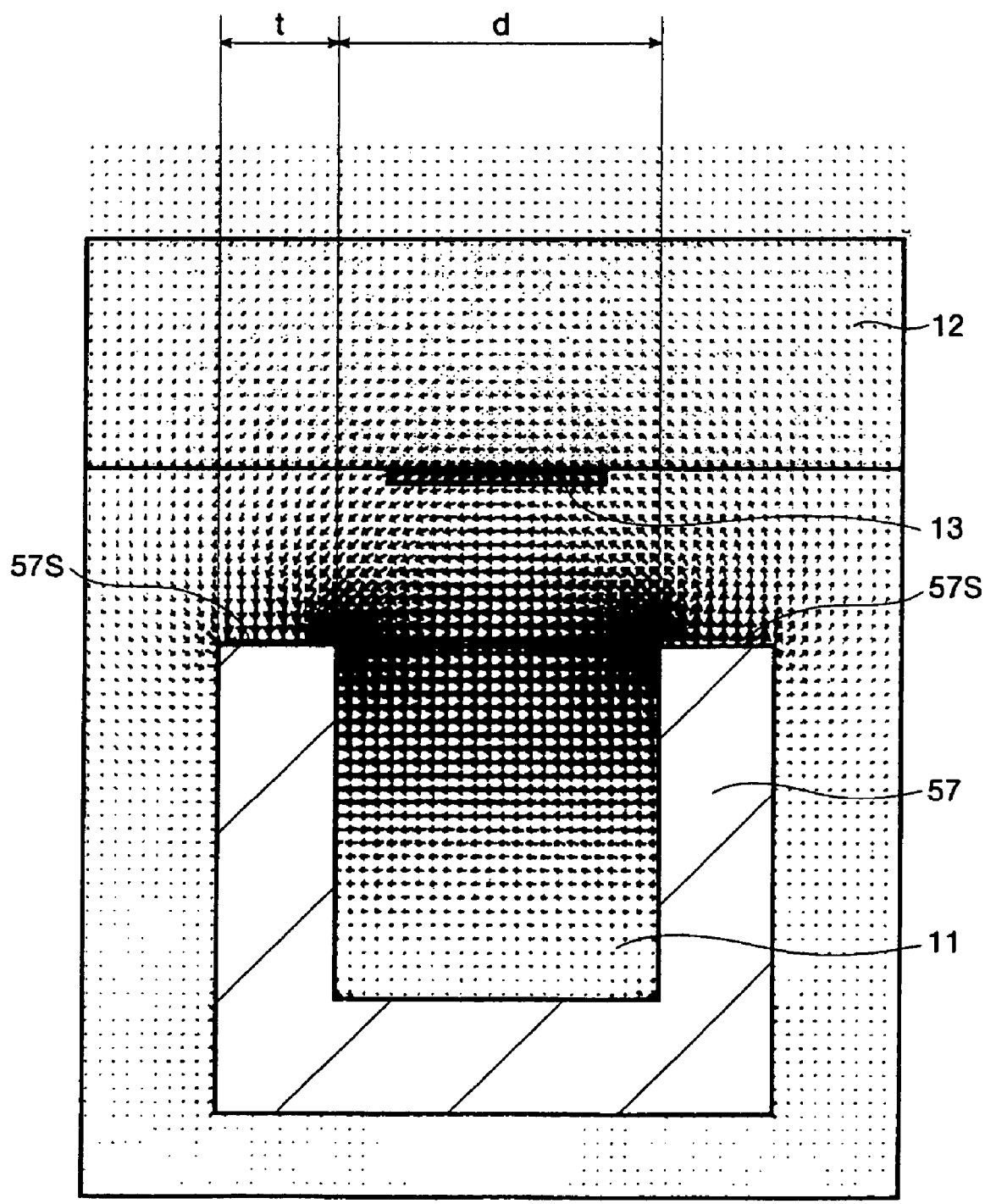
FIG. 8 is a schematic sectional view showing the writing word line, the surrounding structure thereof, and the distribution of the magnetic field due to current around the writing word line in the conventional MRAM cell as Comparative Example 2.

Next, Comparative Example 2 is explained below with reference to FIG. 8, which is a sectional view showing the writing word line and its surroundings. The illustrated structure is identical with the structure shown in U.S. Pat. No. 5,940,319. FIG. 8 also shows the distribution of magnetic field around the writing word line and its surroundings. In FIG. 8, the magnetic field is indicated by arrows. The length of each arrow denotes the strength of magnetic field, and the direction of each arrow denotes the direction of magnetic field.

As shown in FIG. 8, above the writing word line 11 is formed a bit line 12, intersecting three-dimensionally with the writing word line 11. In the region of intersection is formed a TMR element 13. This TMR element 13 is formed above the writing word line 11. The upper side of the TMR element 13 is connected to the bit line 12. The three sides of the writing word line 11 (excluding that side adjacent to the TMR element 13) are surrounded by a magnetic flux concentrator 57 of soft magnetic film. The end 57*s* of the magnetic flex concentrator 57 formed on the lateral sides of the writing word line 11 has the same height as the upper surface of the writing word line 11 facing the TMR element 13. In other words, the end 57*s* of the magnetic flux concentrator 57 does not project from the writing word line 11 toward the TMR element 13.

Then, simulation was carried out to visualize the magnetic field generated by current flowing through the writing word line 11. In simulation for Comparative Example 2. "t" represents the thickness of the end 57*s* of the magnetic flux concentrator 57 formed on the lateral side of the writing word line 11, and "d" represents the distance between one of the end 57*s* of the magnetic flux concentrator 57 and the other. The thickness t is 0.21 µm and the distance d is 0.59 µm.

The result of simulation indicates that the magnetic field generated by the writing word line 11 is transmitted by the magnetic flux concentrator 57 to the end 57*s* thereof. The magnetic field is most intensified in the gap between the respective ends 57*s* and 57*s* of the magnetic flux concentrators 57 formed on the lateral sides of the writing word line 11. However, it was found that the magnetic flux is not transmitted sufficiently to the TMR element 13 because of a large distance between the TMR element 13 and the ends 57*s* of the magnetic flux concentrator 57.

The magnetization directed to the magnetization direction is reversed as current is applied to the bit line. The current to be applied to the bit line depends on the current flowing through the writing word line. This was examined in the first embodiment, the second embodiment, Comparative Example 1, and Comparative Example 2. The result is shown in FIG. 9, which illustrates the relation between the current to produce the magnetic field in the direction of easy axis of magnetization and the current to produce the magnetic field in the direction of hard axis of magnetization.

Figure 9:
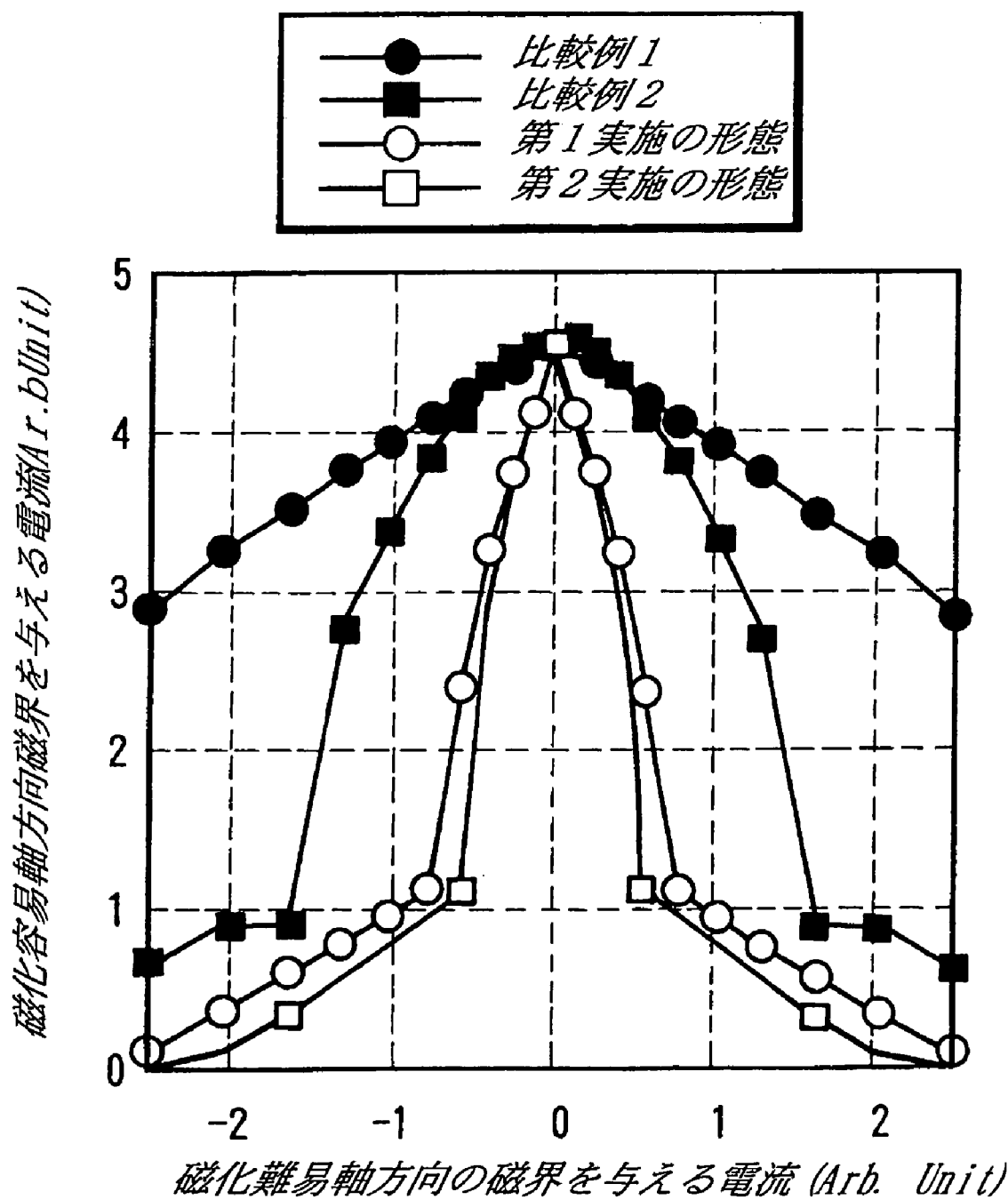
FIG. 9 is a diagram showing the relation between the current to produce the magnetic field in the direction of easy axis of magnetization and the current to produce the magnetic field in the direction of hard axis of magnetization. This diagram suggests how the bit line current required to reverse magnetization in the direction directed to the magnetization direction depends on the word line current. This diagram applies to the first magnetic memory device of the first embodiment, the second embodiment, Comparative Example 1, and Comparative Example 2 according to the present invention.

It is noted from FIG. 9 that the first and second embodiments are more improved than Comparative Examples 1 and 2 in the relation between the current to produce the magnetic field in the direction of easy axis of magnetization and the current to produce the magnetic field in the direction of hard axis of magnetization. In other words, the larger the current absolute value to produce the magnetic field in the direction of hard axis of magnetization, the smaller the current to produce the magnetic field in the direction of easy axis of magnetization. This tendency is more remarkable in the first and second embodiments than in Comparative Examples 1 and 2.

Figure 10:
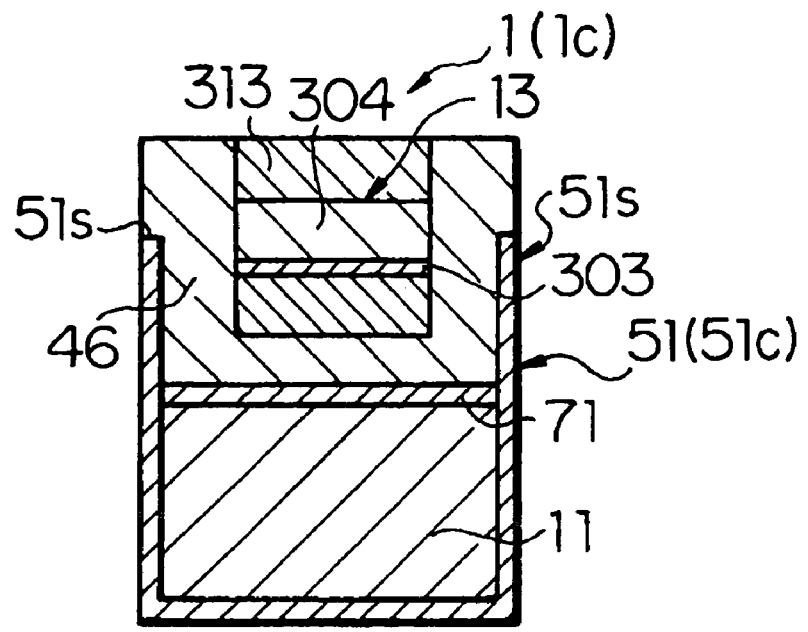
FIG. 10 is a schematic sectional view showing the structure of the first magnetic memory device of the third embodiment according to the present invention.

Next, a description is given below of the first magnetic memory device of the third embodiment with reference to FIG. 10, which is a schematic sectional view showing main constituents. FIG. 10 only shows the writing word line, TMR element, magnetic flux concentrator, and part of insulating film, with other constituents omitted. Like reference characters designate constituents corresponding to those in the first magnetic memory device of the first embodiment.

As shown in FIG. 10, the first magnetic memory device 1 (1c) of the third embodiment forms a high-permeability layer 71 on the surface of the word line 11, which faces the TMR element 13, inside the magnetic flux concentrator 51. In other words, the magnetic flux concentrator 51 (51c) contains the high-permeability layer 71 as its constituent. The magnetic flux concentrator 51 is formed in the same way as in the first magnetic memory device 1a of the first embodiment. Either or both of the high-permeability layers formed on the lateral sides of the writing word line 11 project toward the TMR element 13 from the high-permeability layer 71 formed on the word line 11. That is, the magnetic flux concentrator 51 projects toward the TMR element 13, with an insulating film 46 interposed between the projection of the magnetic flux concentrator 51 and the TMR element 13. The end 51s of the magnetic flux concentrator 51 may extend up to the same height as the interface between the memory layer 304 and the cap layer 313 in the TMR element 13. The height should preferably range from the interface between the tunnel insulating film 303 and the memory layer 304 to the interface between the memory layer 304 and the cap layer 313. The distance between the end 51s of the magnetic flux concentrator 51 and the TMR element 13 should preferably be no larger than 200 nm so that the magnetic flux concentrated at the end 51s of the magnetic flux concentrator 51 efficiently reaches the memory layer 304. The basic structure of the first magnetic memory device of the third embodiment may be incorporated into the magnetic memory device explained above with reference to FIG. 1B in place of the first magnetic memory device of the first embodiment.

Figure 11:
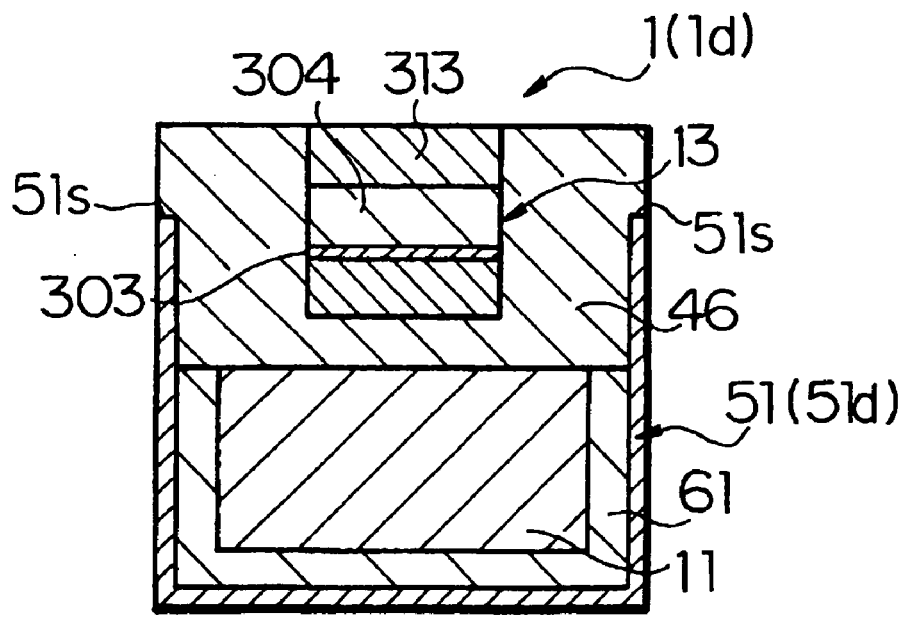
FIG. 11 is a schematic sectional view showing the structure of the first magnetic memory device of the fourth embodiment according to the present invention.

Next, a description is given below of the first magnetic memory device of the fourth embodiment with reference to FIG. 11, which is a schematic sectional view showing main constituents. FIG. 11 only shows the writing word line, TMR element, magnetic flux concentrator, and part of insulating film, with other constituents omitted. Like reference characters designate constituents corresponding to those in the first magnetic memory device of the first embodiment. Incidentally, the figure shows only the relation among the writing word line, TMR element, and magnetic flux concentrator, with the insulting film is omitted.

As shown in FIG. 11, the first magnetic memory device 1 (1d) of the fourth embodiment is similar to the first magnetic memory device of the first embodiment shown in FIG. 1A, except that an insulating film 61 is formed inside the magnetic flux concentrator 51 (51d) of high-permeability layer, such that it encloses the lateral sides and bottom of the writing word line 11. The magnetic flux concentrators 51 are formed on the lateral sides of the writing word line 11 such that either or both of the concentrator 51 project toward the TMR element 13 from the writing word line 11. In other words, the magnetic flux concentrator 51 projects toward the TMR element 13, with an insulating film 46 interposed between the projection of the magnetic flux concentrator 51 and the TMR element 13. The end 51s of the magnetic flux concentrator 51 may extend up to the same height as the interface between the memory layer 304 and the cap layer 313 in the TMR element 13. The height should preferably range from the interface between the tunnel insulating film 303 and the memory layer 304 to the interface between the memory layer 304 and the cap layer 313. The distance between the end 51s of the magnetic flux concentrator 51 and the TMR element 13 should preferably be no larger than 200 nm so that the magnetic flux concentrated at the end 51s of the magnetic flux concentrator 51 efficiently reaches the memory layer 304. The basic structure of the first magnetic memory device of the fourth embodiment may be incorporated into the magnetic memory device explained above with reference to FIG. 1B in place of the first magnetic memory device of the first embodiment.

Figure 12:
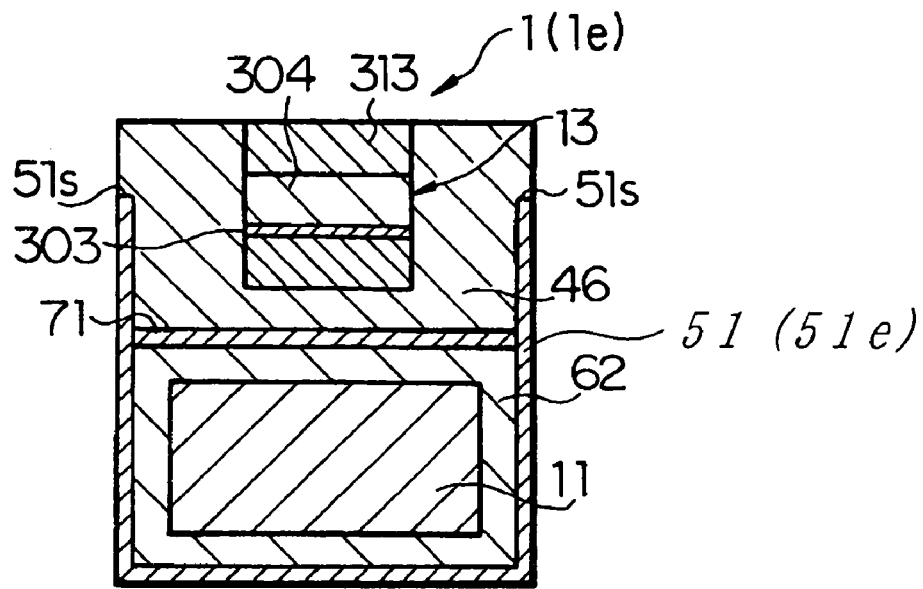
FIG. 12 is a schematic sectional view showing the structure of the first magnetic memory device of the fifth embodiment according to the present invention.

Next, a description is given below of the first magnetic memory device of the fifth embodiment with reference to FIG. 12, which is a schematic sectional view showing main constituents. FIG. 12 only shows the writing word line, TMR element, magnetic flux concentrator, and part of insulating film, with other constituents omitted. Like reference characters designate constituents corresponding to those in the first magnetic memory device of the first embodiment.

As shown in FIG. 12, the first magnetic memory device 1 (1e) of the fifth embodiment is similar to the first magnetic memory device of the fourth embodiment shown in FIG. 11, except that an insulating film 62 is formed inside the magnetic flux concentrator 51 (51e) of high-permeability layer, such that the insulting film 62 entirely encloses the writing word line 11. The magnetic flux concentrators 51 are formed on the lateral sides of the writing word line 11 such that either or both of the concentrators 51 project toward the TMR element 13 from the high-permeability layer 71 formed on the writing word line 11, with the insulating film 62 interposed therebetween. The end 51s of the magnetic flux concentrator 51 is separated from the side of the TMR element 13 by the insulating film 46. The end 51s may extend up to the same height as the interface between the memory layer 304 and the cap layer 313 in the TMR element 13. The height should preferably range from the interface between the tunnel insulating film 303 and the memory layer 304 to the interface between the memory layer 304 and the cap layer 313. The distance between the end 51s of the magnetic flux concentrator 51 and the TMR element 13 should preferably be no larger than 200 nm so that the magnetic flux concentrated at the end 51s of the magnetic flux concentrator 51 efficiently reaches the memory layer 304.

In other words, the magnetic flux concentrator 51e of high-permeability layer in the fifth embodiment differs from the magnetic flux concentrator 51d in the fourth embodiment (explained with reference to FIG. 11) in that the high-permeability layer is formed on the side of the writing word line 11, which faces the TMR element 13, with an insulating film interposed therebetween. That is, the magnetic flux concentrator 51e of high-permeability layer is formed around the writing word line 11, with the insulating film 62 interposed therebetween. Also in this construction, either or both (as illustrate) of the magnetic flux concentrator 51 formed the lateral sides of the writing word line 11 project from the writing word line 11 toward the TMR element 13. The basic structure of he first magnetic memory device of the fifth embodiment may be incorporated into the magnetic memory device explained above with reference to FIG. 1B in place of the magnetic memory device of the first embodiment.

The first magnetic memory device 1 (1a to 1e) is constructed as follows. The writing word line 11 is surrounded by the magnetic flux concentrator 51 of high-permeability layer. In other words, the magnetic flux concentrator 51 is formed at least on the lateral sides of the writing word line 11 and on the side of the writing word line 11 opposing the TMR element 13. Either or both of the magnetic flux concentrators 51 of high-permeability layer formed on the lateral sides of the writing word line 11 project from the writing word line 11 toward the TMR element 13. In the first embodiment, the end 51s of the magnetic flux concentrator 51 formed on the lateral side projects up to the same height as the memory layer 304. Therefore, the magnetic field generated by the writing word line 11 is transmitted to the end 51s of the magnetic flux concentrator 51 and the magnetic field is intensified most in the gap between the two ends 51s and 51s. Consequently, the magnetic field is efficiently concentrated at the memory layer 304 of the TMR element 13. The effect of the foregoing is that it is possible to reduce the current value necessary for writing. This leads to the saving of power consumption and extends the life on electromigration of the writing word line 11. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Figure 13:
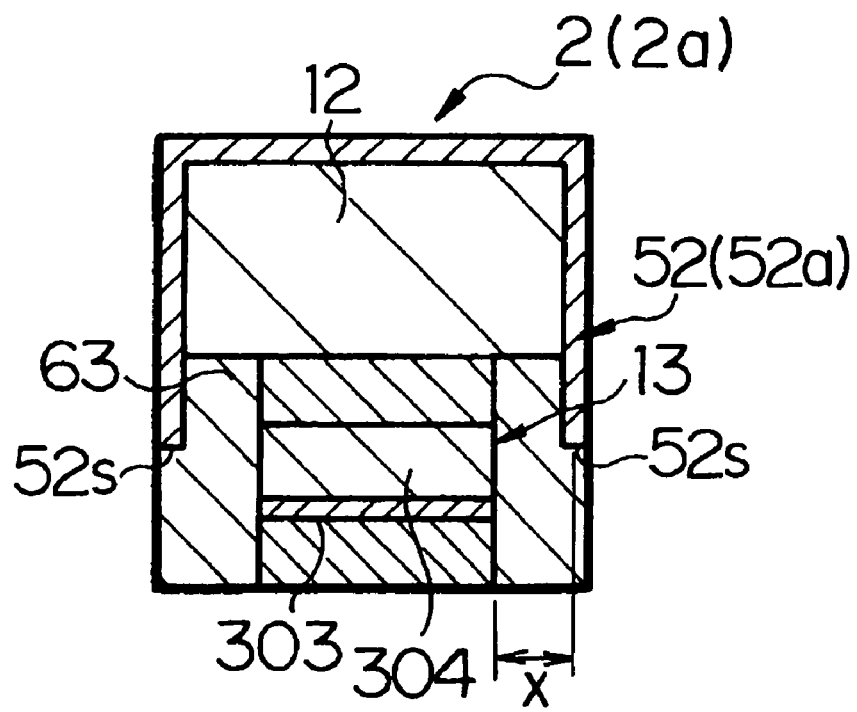
FIG. 13 is a schematic sectional view showing the structure of the second magnetic memory device of the first embodiment according to the present invention.

Next, a description is given below of the second magnetic memory device of the first embodiment according to the present invention with reference to FIG. 13, which is a schematic sectional view showing main constituents. FIG. 13 only shows the switching element, and writing word line, with sense line being omitted. Like reference characters designate constituents corresponding to those in the first magnetic memory device mentioned above.

As shown in FIG. 13, the second magnetic memory 2 (2a) of the first embodiment has a bit line 12, which is connected to the TMR element 13, with a cap layer 313 interposed therebetween, and also has a magnetic flux concentrator 52 (52a) of high-permeability layer, which is formed on both of the lateral sides of the bit line 12 and on the side of the bit line 12 which is opposite to the side facing the TMR element 13. Either or both (as illustrated) of the magnetic flux concentrators 52 of the high-permeability layer formed on the lateral sides of the bit line 12 project from the bit line 12 toward the TMR element 13. The side walls of the magnetic flux concentrator 52 are separated from the TMR element 13 by the insulating film 63.

The end 52s of the side wall of the magnetic flux concentrator 52 may extend down to the same height as the interface between the memory layer 304 and the tunnel insulating layer 303 in the TMR element 13. The height should preferably range from the interface between the tunnel insulating film 303 and the memory layer 304 to the interface between the memory layer 304 and the cap layer 313. The distance x between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304.

The magnetic flux concentrator 52 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

The second memory device 2 (2a) is constructed in the same way as the memory device explained above with reference to FIGS. 1A and 1B, except for the structure just mentioned above. Incidentally, the magnetic flux concentrator 51 explained with reference to FIGS. 1A and 1B may be omitted. However, the concentrator 51 should preferably be formed to effectively concentrate the magnetic field at the TMR element 13. In this case, the end 51s of the magnetic flux concentrator 51 should be separated from the end 52s of the magnetic flux concentrator 52.

Figure 14:
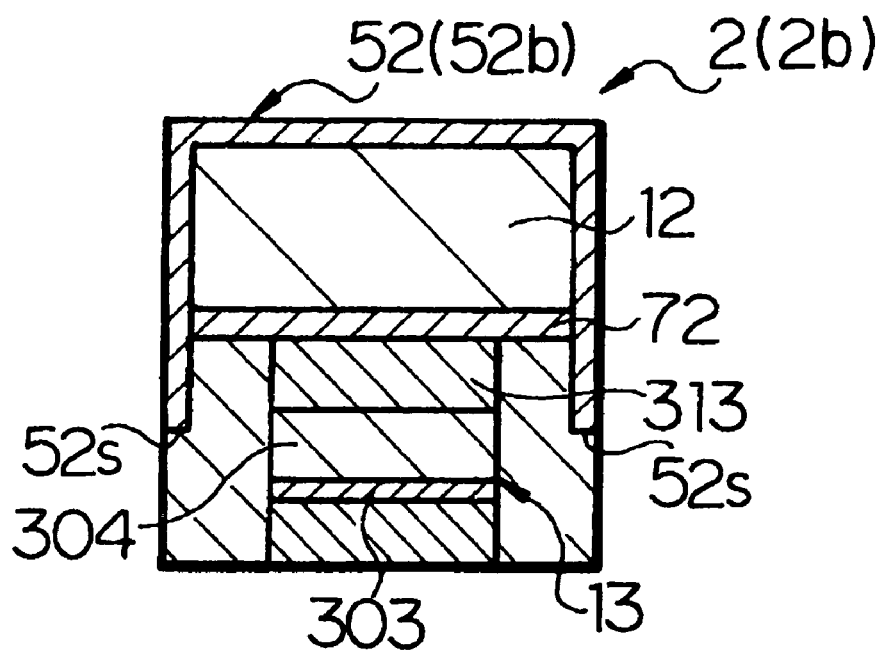
FIG. 14 is a schematic sectional view showing the structure of the second magnetic memory device of the second embodiment according to the present invention.

Next, a description is given below of the second magnetic memory device of the second embodiment according to the present invention with reference to FIG. 14, which is a schematic sectional view showing main constituents. FIG. 14 only shows the switching element, writing word line, with sense line being omitted. Like reference characters designate constituents corresponding to those in the first magnetic memory device mentioned above.

As shown in FIG. 14, the second magnetic memory 2 (2b) of the second embodiment is similar in structure to the second magnetic memory 2 (2a) of the first embodiment shown in FIG. 13, except that a high-permeability layer 72 is formed on the surface of the bit line 12, which is connected to the TMR element 13, with a cap layer 313 interposed therebetween. The high-permeability layer 72 is connected to the lateral parts of the magnetic flux concentrator 52 (52b). In other words, the cap layer 313 and the bit line 12 are connected to each other, with the high-permeability layer 72 interposed therebetween. Either or both (as illustrated) of the magnetic flux concentrators 52 formed on the lateral sides of the bit line 12 project toward the TMR element 13 from the high-permeability layer 72. The projecting parts of the magnetic flux concentrator 52 are separated from the TMR element 13 by the insulating film 63. The end 52s of the magnetic flux concentrator 52 may extend down to the same height as the interface between the memory layer 304 and the tunnel insulating layer 303 in the TMR element 13. The height should preferably range from the interface between the tunnel insulating film 303 and the memory layer 304 to the interface between the memory layer 304 and the cap layer 313. The distance between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304. The magnetic flux concentrator 52 in the second embodiment may be formed from the same high-permeability material as used for the first embodiment.

The second memory device 2 (2b) is constructed in the same way as the memory device explained above with reference to FIGS. 1A and 1B, except for the structure just mentioned above. Incidentally, the magnetic flux concentrator 51 explained with reference to FIGS. 1A and 1B may be omitted. However, The concentrator 51 should preferably be formed to effectively concentrate the magnetic field at the TMR element 13. In this case, the end 51s of the magnetic flux concentrator 51 should be separated from the end 52s of the magnetic flux concentrator 52.

Figure 15:
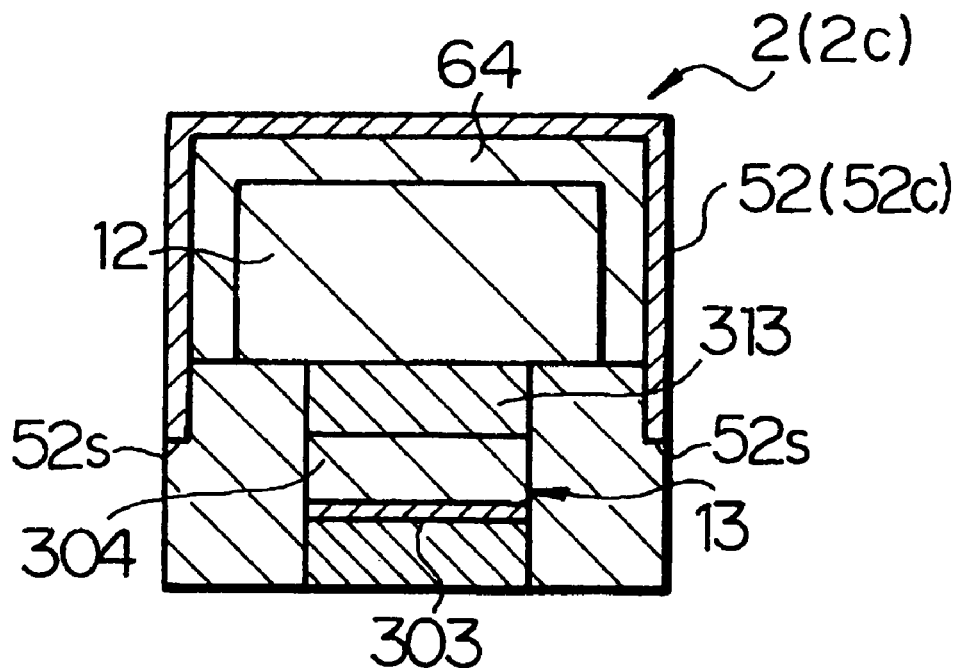
FIG. 15 is a schematic sectional view showing the structure of the second magnetic memory device of the third embodiment according to the present invention.

Next, a description is given below of the second magnetic memory device of the third embodiment according to the present invention with reference to FIG. 15, which is a schematic sectional view showing main constituents. FIG. 15 only shows the switching element, and writing word line, with sense line being omitted. Like reference characters designate constituents corresponding to those in the first magnetic memory device mentioned above.

As shown in FIG. 15, the second magnetic memory 2 (2c) of the third embodiment is similar in structure to the magnetic flux concentrator 52a of the first embodiment shown in FIG. 13, except that an insulating layer 64 is formed between the bit line 12 and the magnetic flux concentrator 52 (52c). The insulating layer 64 encloses the lateral sides and the upper side of the bit line 12. The upper side is opposite to the side facing the TMR element 13. The lateral parts of the magnetic flux concentrator 52 are separated from the TMR element 13 by the insulating film 63. (The TMR element 13 is connected to the bit line 12, with the cap layer 313 interposed therebetween.) The end 52s of the magnetic flux concentrator 52 may extend down to the same height as the interface between the memory layer 304 and the tunnel insulating layer 303 in the TMR element 13. The height should preferably range from the interface between the tunnel insulating film 303 and the memory layer 304 to the interface between the memory layer 304 and the cap layer 313. The distance between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304. The magnetic flux concentrator 52 in the third embodiment may be formed from the same high-permeability material as used for the first embodiment.

The second memory device 2 (2c) is constructed in the same way as the memory device explained above with reference to FIGS. 1A and 1B, except for the structure just mentioned above. Incidentally, the magnetic flux concentrator 51 explained with reference to FIGS. 1A and 1B may be omitted. However, the concentrator 51 should preferably be formed to effectively concentrate the magnetic field at the TMR element 13. In this case, the end 51s of the magnetic flux concentrator 51 should be separated from the end 52s of the magnetic flux concentrator 52. The third embodiment shown in FIG. 15 may have the high-permeability layer 72, which was explained with reference to FIG. 14.

The second memory device 2 (2a to 2c) is constructed as follows. The bit line 12 is surrounded by the magnetic flux concentrator 52 of high-permeability layer. In other words, the magnetic flux concentrator 52 is formed at least on the lateral sides of the bit line 12 and on the side of the bit line 12 which is opposite to the side facing the TMR element 13. Either or both of the magnetic flux concentrators 52 formed on the lateral sides of the bit line 12 project from the bit line 12 toward the TMR element 13. Therefore, the magnetic field generated by the bit line 12 is efficiently concentrated at the memory layer 304 of the TMR element 13. The effect of the foregoing is that it is possible to reduce the current value necessary for writing. This leads to the saving of power consumption and extends the life on electromigration of the bit line 12. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Figure 16:
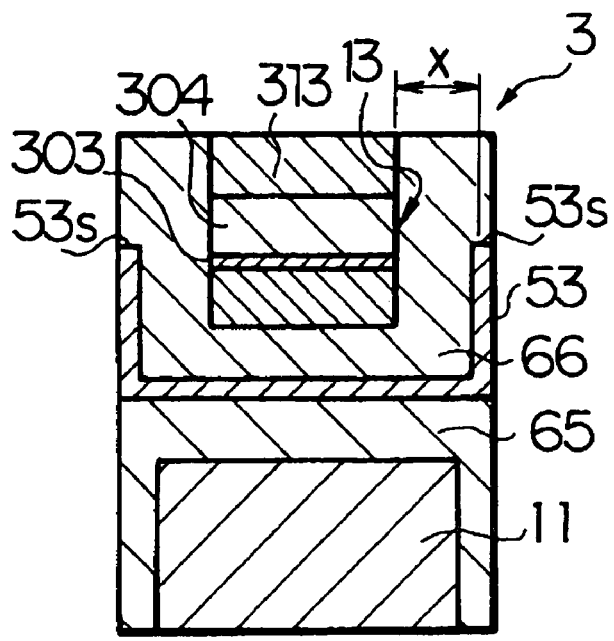
FIG. 16 is a schematic sectional view showing the structure of the third magnetic memory device according to the present invention.

Next, a description is given below of the third magnetic memory device of the first embodiment according to the present invention with reference to FIG. 16, which is a schematic sectional view showing main constituents. FIG. 16 only shows the switching element, and sense line, with bit line being omitted. Like reference characters designate constituents corresponding to those in the first magnetic memory device mentioned above.

As shown in FIG. 16, the third magnetic memory 3 has a writing word line 11, a magnetic flux concentrator 53, and a TMR element 13. The magnetic flux concentrator 53 of high-permeability layer is formed on the writing word line 11, with an insulating film 65 interposed therebetween. The TMR element 13 is formed on the magnetic flux concentrator 53, with an insulating film 66 interposed therebetween.

The lateral parts of the magnetic flux concentrator 53 extend along the lateral sides of the TMR element 13, with the insulating film 66 interposed therebetween. The end 53s of the magnetic flux concentrator 53 may extend up to the same height as the interface between the memory layer 304 and the cap layer 313 in the TMR element 13. The height should preferably range from the interface between the tunnel insulating film 303 and the memory layer 304 to the interface between the memory layer 304 and the cap layer 313. The distance x between the end 53s of the magnetic flux concentrator 53 and the TMR element 13 should preferably be no larger than 200 nm so that the magnetic flux concentrated at the end 53s of the magnetic flux concentrator 53 efficiently reaches the memory layer 304.

The magnetic flux concentrator 53 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

The third memory device 3 is constructed in the same way as the memory device explained above with reference to FIGS. 1A and 1B, except for the structure just mentioned above. Incidentally, the magnetic flux concentrator 51 explained with reference to FIGS. 1A and 1B may be omitted. The concentrator 51 should preferably be formed to effectively concentrate the magnetic field at the TMR element 13. This structure will be mentioned later. In the structure explained above with reference to FIG. 16, the magnetic flux concentrator 53 may be formed to be connected to the upper surface of the writing word line 11.

The third memory device 3 is constructed as follows. The magnetic flux concentrator 53 of high-permeability layer is formed between the writing word line 11 and the TMR element 13 and on the lateral sides of the TMR elements 13, with the insulating film 63 interposed therebetween. Therefore, the magnetic field generated by the writing word line 11 is efficiently concentrated at the memory layer 304 of the TMR element 13 by the magnetic flux concentrator 53 formed on the lower lateral sides of the TMR element 13. The effect of the foregoing is that it is possible to reduce the current value necessary for writing. This leads to the saving of power consumption and extends the life on electromigration of the writing word line 11. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Figure 17:
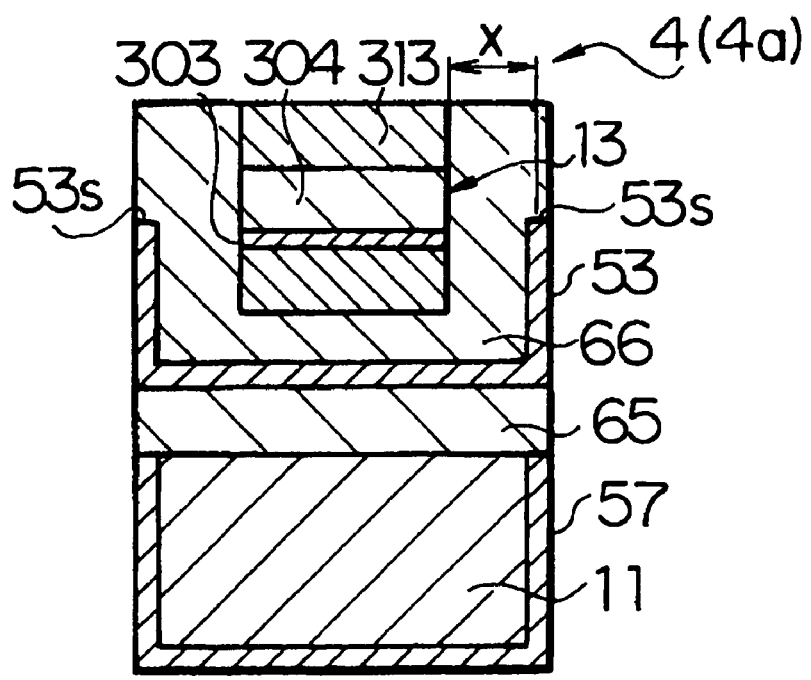
FIG. 17 is a schematic sectional view showing the structure of the fourth magnetic memory device of the first embodiment according to the present invention.

Next, a description is given below of the fourth magnetic memory device of the first embodiment according to the present invention with reference to FIG. 17, which is a schematic sectional view. FIG. 17 only shows the writing word line, TMR element, magnetic flux concentrator, and part of insulating film involved in the fourth magnetic memory device of the first embodiment, with other constituents being omitted. Like reference characters designate constituents corresponding to those in the first magnetic memory device mentioned above.

The fourth magnetic memory 4 (4a) of the first embodiment has a basic structure as a combination of the structures explained above with reference to FIGS. 8 and 16. In other words, as shown in FIG. 17, the fourth magnetic memory device 4 (4a) of the first embodiment has a first magnetic flux concentrator 57 and a second magnetic flux concentrator 53. The first magnetic flux concentrator 57 of high-permeability layer is so formed as to enclose at least the lateral sides of the writing word line 11 and the side of the writing word line 11 which is opposite to the side facing the TMR element 13. Insulating films 65 and 66 are formed between the writing word line 11 and the TMR element 13. Those parts of the magnetic flux concentrator 57, which are formed on the lateral sides of the writing word line 11, extend to the same height as the upper surface (facing the TMR element 13) of the writing word line 11.

The second magnetic flux concentrator 53 (of the same type as that explained above with reference to FIG. 16) is formed between the writing word line 11 and the TMR element 13. Both of the lateral parts of the magnetic flux concentrator 53 are formed along the lateral sides of the TMR element 13, with the insulating film 66 interposed therebetween. The end 53s of the magnetic flux concentrator 53 may extend up to the same height as the interface between the memory layer 304 and the cap layer 313 in the TMR element 13. The height should preferably range from the interface between the tunnel insulating film 303 and the memory layer 304 to the interface between the memory layer 304 and the cap layer 313. The distance x between the end 53s of the magnetic flux concentrator 53 and the TMR element 13 should preferably be no larger than 200 nm so that the magnetic flux concentrated at the end 53s of the magnetic flux concentrator 53 efficiently reaches the memory layer 304.

The magnetic flux concentrators 53 and 57 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

Figure 18:
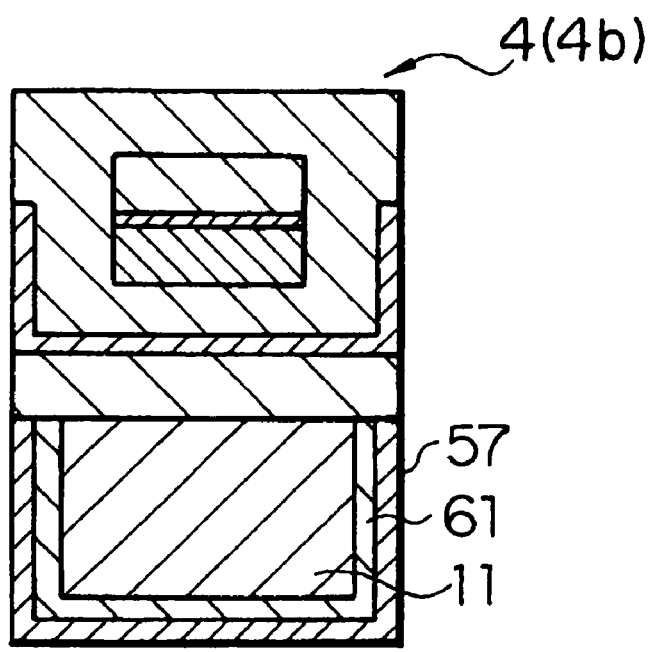
FIG. 18 is a schematic sectional view showing the structure of the fourth magnetic memory device of the second embodiment according to the present invention.

Next, a description is given below of the fourth magnetic memory device of the second embodiment according to the present invention with reference to FIG. 18, which is a schematic sectional view. FIG. 18 only shows the writing word line, TMR element, magnetic flux concentrator, and part of insulating film involved in the fourth magnetic memory device of the second embodiment, with other constituents being omitted. Like reference characters designate constituents corresponding to those in the first magnetic memory device mentioned above.

As shown in FIG. 18, the fourth magnetic memory device 4 (4b) of the second embodiment is similar in structure to the magnetic memory device 4a explained above with reference to FIG. 17, except that an insulating film 61 is formed between the first magnetic flux concentrator 57 and the writing word line 11.

Figure 19:
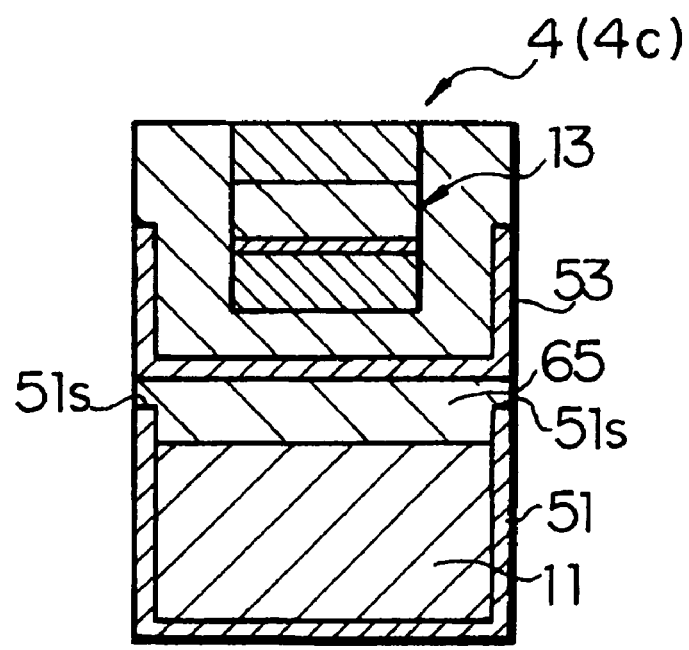
FIG. 19 is a schematic sectional view showing the structure of the fourth magnetic memory device of the third embodiment according to the present invention.

Next, a description is given below of the fourth magnetic memory device of the third embodiment according to the present invention with reference to FIG. 19, which is a schematic sectional view. FIG. 19 only shows the writing word line, TMR element, magnetic flux concentrator, and part of insulating film involved in the fourth magnetic memory device of the third embodiment, with other constituents being omitted. Like reference characters designate constituents corresponding to those in the first magnetic memory device mentioned above.

As shown in FIG. 19, the fourth magnetic memory device 4 (4c) of the third embodiment has a first magnetic flux concentrator 51 and a second magnetic flux concentrator 53. The first magnetic flux concentrator 51, which is the same one as that shown in FIG. 1A, is formed on the lateral sides and the lower side of the writing word line 11. The second magnetic flux concentrator 53, which is the same one as explained with reference to FIG. 16, is formed between the writing word line 11 and the TMR element 13. The end 51s of the side wall of the magnetic flux concentrator 51 is separated from the magnetic flux concentrator 53 by the insulating film 65. Incidentally, the end 51s of the magnetic flux concentrator 51 may be connected to the magnetic flux concentrator 53, although this is not shown in the figure.

Figure 20:
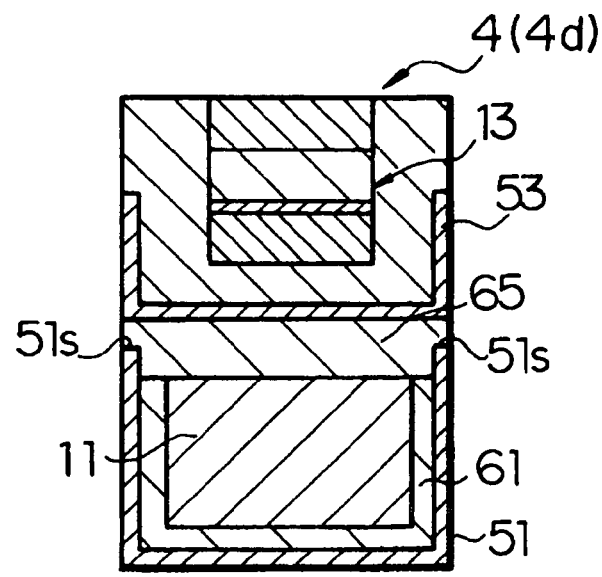
FIG. 20 is a schematic sectional view showing the structure of the fourth magnetic memory device of the fourth embodiment according to the present invention.

Next, a description is given below of the fourth magnetic memory device of the fourth embodiment according to the present invention with reference to FIG. 20, which is a schematic sectional view. FIG. 20 only shows the writing word line, TMR element, magnetic flux concentrator, and part of insulating film involved in the fourth magnetic memory device of the fourth embodiment, with other constituents being omitted. Like reference characters designate constituents corresponding to those in the first magnetic memory device mentioned above.

As shown in FIG. 20, the fourth magnetic memory device 4 (4d) of the fourth embodiment has a first magnetic flux concentrator 51 and a second magnetic flux concentrator 53. The first magnetic flux concentrator 51, which is the same one as explained with reference to FIG. 11, is formed on the lateral sides and the lower side of the writing word line 11, with the insulating film 61 interposed therebetween. The second magnetic flux concentrator 53, which is the same one as explained with reference to FIG. 16, is formed between the writing word line 11 and the TMR element 13. The end 51s of the magnetic flux concentrator 51 is separated from the magnetic flux concentrator 53 by the insulating film 65. Incidentally, the end 51s of the magnetic flux concentrator 51 may be connected to the magnetic flux concentrator 53, although this is not shown in the figure.

The magnetic flux concentrator in the fourth magnetic device of the first to fourth embodiments functions in the same was as the magnetic flux concentrator 51 in the magnetic memory device explained above with reference to FIG. 1B.

The fourth memory device 4 (4a to 4d) is constructed as follows. The first magnetic flux concentrator 51 or 57 of high-permeability layer is formed at least on the lateral sides of the writing word line 11 and on the side of the writing word line 11 which is opposite to the side facing the TMR element 13. The second magnetic flux concentrator 53 of high-permeability layer is formed between the writing word line 11 and the TMR element 13 and along the lateral sides of the TMR elements 13, with the insulating film 66 interposed therebetween. The end 53s thereof is as high as the memory layer 304. Therefore, the magnetic field generated by the writing word line 11 is efficiently concentrated at the memory layer 304 of the TMR element 13 by the magnetic flux concentrators 51, 57, and 53. The effect of the foregoing is that it is possible to reduce the current value necessary for writing. This leads to the saving of power consumption and extends the life on electromigration of the writing word line 11. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Figure 21:
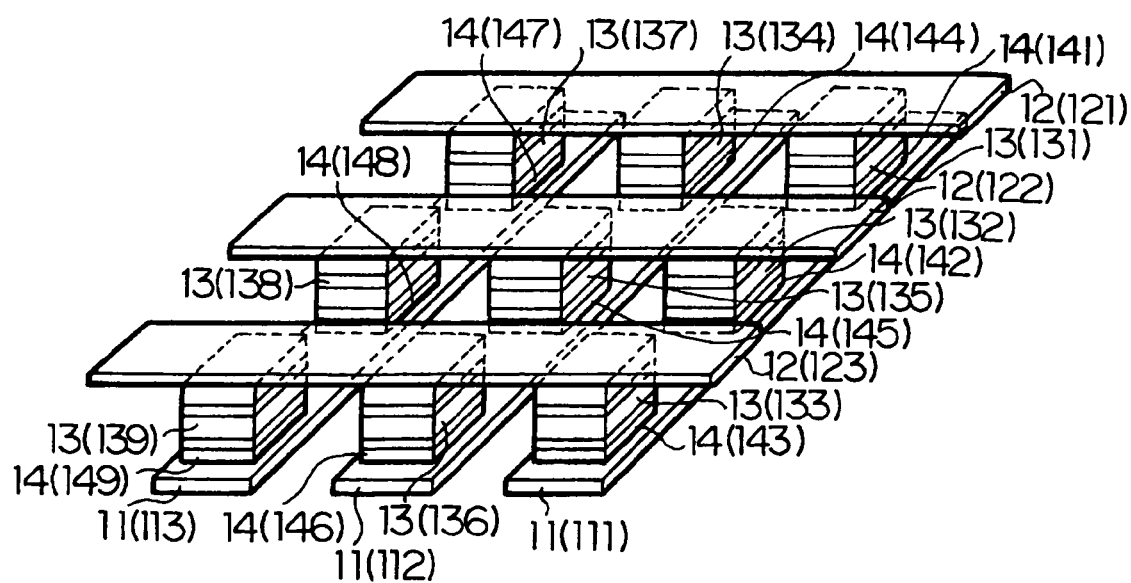
FIG. 21 is a simplified schematic perspective view showing the major parts of ordinary MRAM of cross-point type.

Before a description is made of the fifth magnetic memory device according to the present invention, a description is made of ordinary MRAM (Magnetic Random Access Memory) of cross-point type with reference to FIG. 21, which is a simplified schematic perspective view.

As shown in FIG. 21, the MRAM constitutes partly of nine memory cells, each held between the writing word line 11 (111, 112, and 113) and the bit line 12 (121, 122, and 123), which intersect with each other. In the region of intersection of the writing word line 11 and the bit line 12 are arranged the switching element 14 (141 to 149) and the tunnel magnetoresistance (TMR) element 13 (131 to 139). The switching element 14 is connected to the writing word line 11, and the TMR element 13 is connected to the switching element 14 and the bit line 12. The TMR element 13 is basically composed of a tunnel insulating film sandwiched between two layers of ferromagnetic material. The switching element 14 is a pn-junction element.

Writing to the TMR element 13 is accomplished by applying current to the writing word line 11 and the bit line 12. The applied current generates a combined magnetic field, which magnetizes in the parallel direction or anti-parallel direction the magnetization pinned layer 302 of the memory layer 304 of the TMR element 13. The TMR element 13 is formed in the region of intersection of the writing word line 11 and the bit line 12. (For more detail, refer to FIG. 5.)

Figure 22:
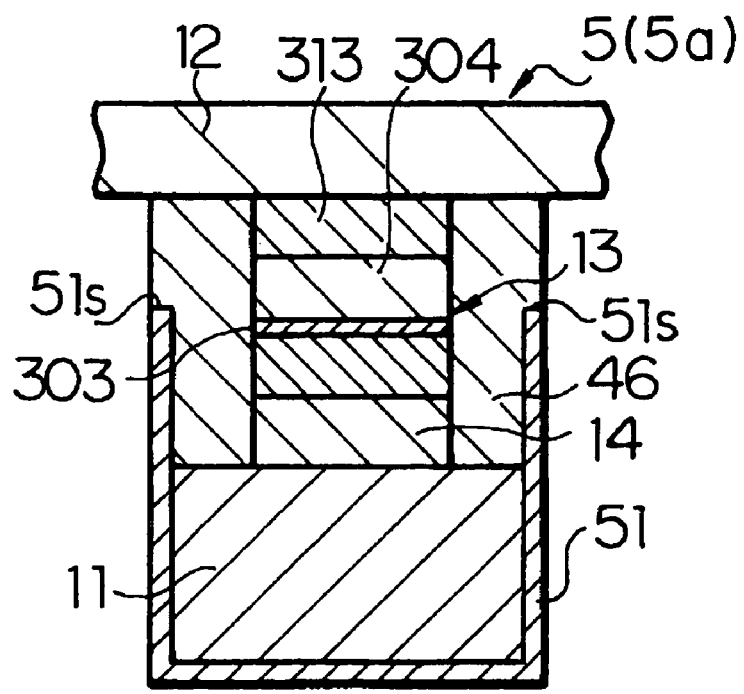
FIG. 22 is a schematic sectional view showing the structure of the fifth magnetic memory device of the first embodiment according to the present invention.

Next, a description is given below of the fifth magnetic memory device of the first embodiment according to the present invention with reference to FIG. 22, which is a schematic sectional view. The fifth magnetic memory device of the first embodiment is similar to the magnetic memory device explained above with reference to FIG. 21, except that it is so designed as to efficiently concentrate at the memory layer the magnetic field generated by the writing word line. FIG. 22 only shows the writing word line, switching element, TMR element, bit line, and part of insulating film, with other constituents being omitted. Incidentally, FIG. 22 is a schematic diagram and the constituents are not on the same scale.

As shown in FIG. 22, the fifth magnetic memory device 5 (5a) has the writing word line 11 and the bit line 12, which three-dimensionally intersect with each other. In the region of intersection of the writing word line 11 and the bit line 12 and on the word line 11 is formed the TMR element 13 (connected to the bit line 12), with the switching element 14 interposed therebetween. This switching element 14 is a pn-junction element. The TMR element 13 and the bit line 12 are connected to each other through the cap layer 313 as the uppermost layer of the TMR element.

Moreover, the writing word line 11 is enclosed by the magnetic flux concentrator 51 which is formed on both of the lateral sides of the writing word line 11 and on the side of the writing word line 11 which is opposite to the side facing the TMR element 13. The TMR element 13 is formed on the writing word line 11 with an insulating film 46 interposed therebetween. Yet, either or both (as illustrated) of the magnetic flux concentrators 51 formed on the lateral sides of the writing word line 11 project from the writing word line 11 toward the TMR element 13.

In other words, that part of the magnetic flux concentrator 51 which projects toward the TMR element 13 is formed in the vicinity of the lateral sides of the TMR element 13, with the insulating film interposed therebetween. The end 51s of the magnetic flux concentrator 51 may extend up to the same height as the interface between the memory layer 304 and the cap layer 313 in the TMR element 13. The height should preferably range from the interface between the tunnel insulating film 303 and the memory layer 304 to the interface between the memory layer 304 and the cap layer 313. The distance between the end 51s of the magnetic flux concentrator 51 and the TMR element 13 should preferably be no larger than 200 nm so that the magnetic flux concentrated at the end 51s of the magnetic flux concentrator 51 efficiently reaches the memory layer 304.

The magnetic flux concentrators 51 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

Incidentally, as shown in the figure, in the case where there exists no electrical insulating layer between the writing word line 11 and the magnetic flux concentrator 51, it is desirable to make the magnetic flux concentrator 51 from a soft magnetic film having a high resistivity so as to prevent current loss. Also, as shown in the figure, the magnetic flux concentrator 51 is formed such that those parts which are formed on both of the lateral sides of the writing word line 11 project from the writing word line 11 toward the TMR element 13. The projected part may be formed only on one side of the writing word line 11.

Figure 23:
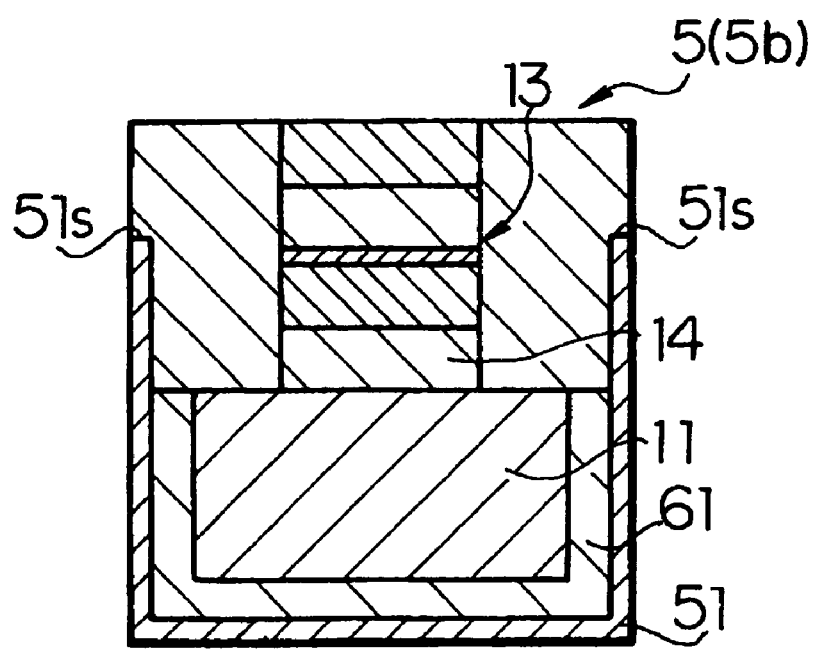
FIG. 23 is a schematic sectional view showing the structure of the fifth magnetic memory device of the second embodiment according to the present invention.

Next, a description is given below of the fifth magnetic memory device of the second embodiment according to the present invention with reference to FIG. 23, which is a schematic sectional view. FIG. 23 only shows the writing word line, TMR element, magnetic flux concentrator, and part of insulating film, with other constituents being omitted. Like reference characters designate constituents corresponding to those in the first magnetic memory device mentioned above.

As shown in FIG. 23, the fifth magnetic memory device 5 (5b) of the second embodiment has the same magnetic flux concentrator 51 as explained with reference to FIG. 10 for the structure shown in FIG. 21. That is, the memory device 5b has an insulating film 61 between the magnetic flux concentrator 51, which is explained with reference to FIG. 22, and the writing word line 11. In other words, in the structure shown in FIG. 11, the memory device 5b has a switching element 14 between the writing word line 11 and the TMR element 13. This switching element 14 connects the writing word line 11 and the TMR element 13 with each other.

In the fifth magnetic memory device of the first and second embodiments, the end 51s of the magnetic concentrator 51 is formed in the same way as the first magnetic memory device 1 of the second embodiment mentioned above.

The fifth memory device 5 is constructed as follows. The magnetic flux concentrator 51 of high-permeability layer is formed at least on the lateral sides of the writing word line 11 and the side of the writing word line 11 which is opposite to the side facing the TMR element 13. At least either of the high-permeability layer formed on the lateral sides of the writing word line 11 projects from the writing word line 11 toward the TMR element 13. Preferably, the high-permeability layer projects as high as the memory layer 304. Therefore, as in the case of the first magnetic memory device 1, the magnetic field generated by the writing word line 11 is transmitted to the end 51s of the magnetic flux concentrator 51 and most intensified between the ends 51s and 51s. Therefore, the magnetic field is efficiently concentrated at the memory layer 304 of the TMR element 13. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Figure 24:
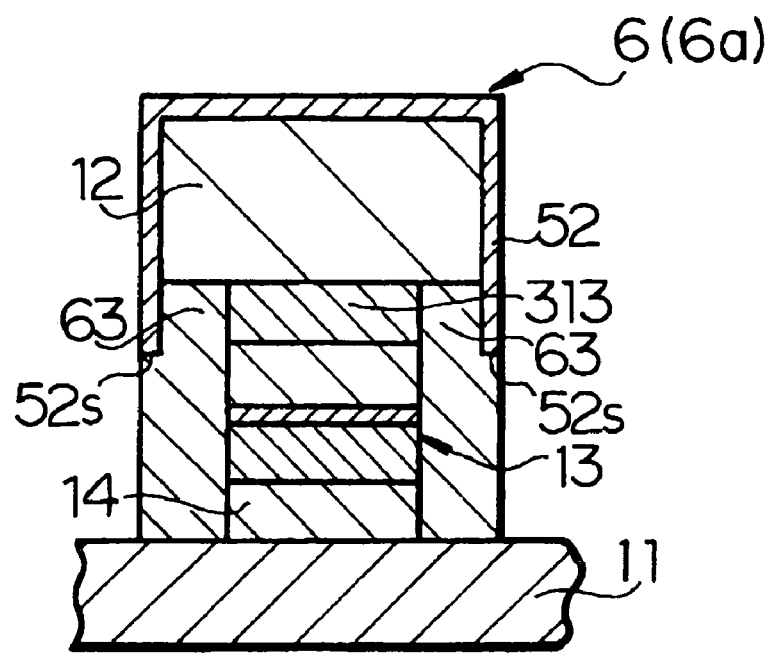
FIG. 24 is a schematic sectional view showing the structure of the sixth magnetic memory device of the first embodiment according to the present invention.

Next, a description is given below of the sixth magnetic memory device of the first embodiment according to the present invention with reference to FIG. 24, which is a schematic sectional view. The first embodiment is similar to the magnetic memory device explained with reference to FIG. 21, except that the first embodiment is designed such that the magnetic field generated by the bit line is efficiently concentrated at the memory layer. FIG. 24 only shows the switching element, TMR element, bit line, and part of insulating film as main constituents, with other constituents being omitted. Like reference characters designate constituents corresponding to those in the second magnetic memory device mentioned above.

As shown in FIG. 24, the sixth magnetic memory device 6 (6a) of the first embodiment has the writing word line 11 and bit line 12, which three-dimensionally intersect with each other. On the writing word line 11 and in the region of intersection of the writing word line 11 and the bit line 12 is formed the TMR element 13 with the switching element 14 interposed therebetween. The cap layer 313 of the TMR element 13 is connected to the bit line 12. Moreover, the bit line 12 is enclosed by the magnetic flux concentrator 52 of high-permeability layer. The concentrator 52 is formed on both of the lateral sides of the bit line 12 and on the side of the bit line 12 which is opposite to the side facing the TMR element 13, which is connected to the bit line 12. Yet, either or both (as illustrated) of the magnetic flux concentrators 52 formed on the lateral sides of the bit line 12 project from the bit line 12 toward the TMR element 13.

The projecting part of the magnetic flux concentrator 52 may extend along the lateral side of the TMR element 13, with the insulating film 63 interposed therebetween. Its end 52s may be formed up to the same height as the interface between the memory layer 304 and the tunnel insulating film 303 in the TMR element 13. The height should preferably range from the interface between the tunnel insulating film 303 and the memory layer 304 to the interface between the memory layer 304 and the cap layer 313. The distance between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304.

The magnetic flux concentrators 52 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys.

Incidentally, as shown in the figure, in the case where there exists no electrical insulating layer between the bit line 12 and the magnetic flux concentrator 52, it is desirable to make the magnetic flux concentrator 52 from a soft magnetic film having a high resistivity so as to prevent current loss. Also, as shown in the figure, the magnetic flux concentrator 52 is formed such that those parts which are formed on both of the lateral sides of the bit line 12 project from the bit line 12 toward the TMR element 13. The projected part may be formed only on one side of the bit line 12.

The sixth magnetic memory device 6 (6a) is constructed in the same way as the memory device explained above with reference to FIGS. 1A and 1B, except for the structure just mentioned above. Incidentally, the magnetic flux concentrator 51 explained with reference to FIGS. 1A and 1B may be omitted. However, the concentrator 51 should preferably be formed to effectively concentrate the magnetic field at the TMR element 13. In this case, the end 51s of the magnetic flux concentrator 51 should be separated from the end 52s of the magnetic flux concentrator 52.

Figure 25:
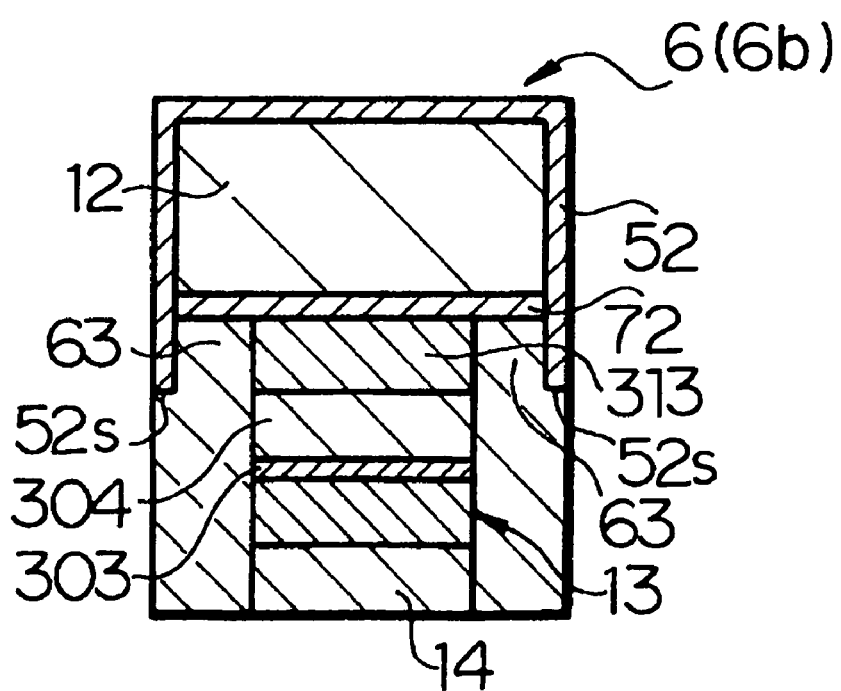
FIG. 25 is a schematic sectional view showing the structure of the sixth magnetic memory device of the second embodiment according to the present invention.

Next, a description is given below of the sixth magnetic memory device of the second embodiment according to the present invention with reference to FIG. 25, which is a schematic sectional view showing main constituents. FIG. 25 only shows the switching element, TMR element, bit line, and part of insulating film, with other constituents being omitted. Like reference characters designate constituents corresponding to those in the second magnetic memory device mentioned above.

As shown in FIG. 25, the sixth magnetic memory device 6 (6b) of the second embodiment is similar in structure to the magnetic memory device shown in FIG. 24, except that the memory device 6b has the same magnetic flux concentrator 52 as that explained above with reference to FIG. 14. In other words, the magnetic flux concentrator 52 of the first embodiment, which has been explained with reference to FIG. 24, has the high-permeability layer 72 also on the surface of the bit line 12 close to the TMR element 13. That is, the high-permeability layer 72 is formed to connect the bit line 12 with the uppermost cap layer 313 of the TMR element 13. The lower side of the TMR element 13 is connected to the writing word line (not shown) intersecting three-dimensionally with the bit line 12, with the switching element 14 interposed therebetween.

The above-mentioned magnetic flux concentrator 52 is formed such that either or both (as illustrated) of the high-permeability layer formed on the lateral sides of the bit line 12 project from the high-permeability layer 72 toward the TMR element 13, as in the case explained with reference to FIG. 14. The side wall of the magnetic flux concentrator 52 is insulated from the TMR element 13 by the insulating film 63. Its end 52s may be formed up to the same height as the interface between the memory layer 304 and the tunnel insulating film 303 in the TMR element 13. The height should preferably range from the interface between the tunnel insulating film 303 and the memory layer 304 to the interface between the memory layer 304 and the cap layer 313. The distance x between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304.

Figure 26:
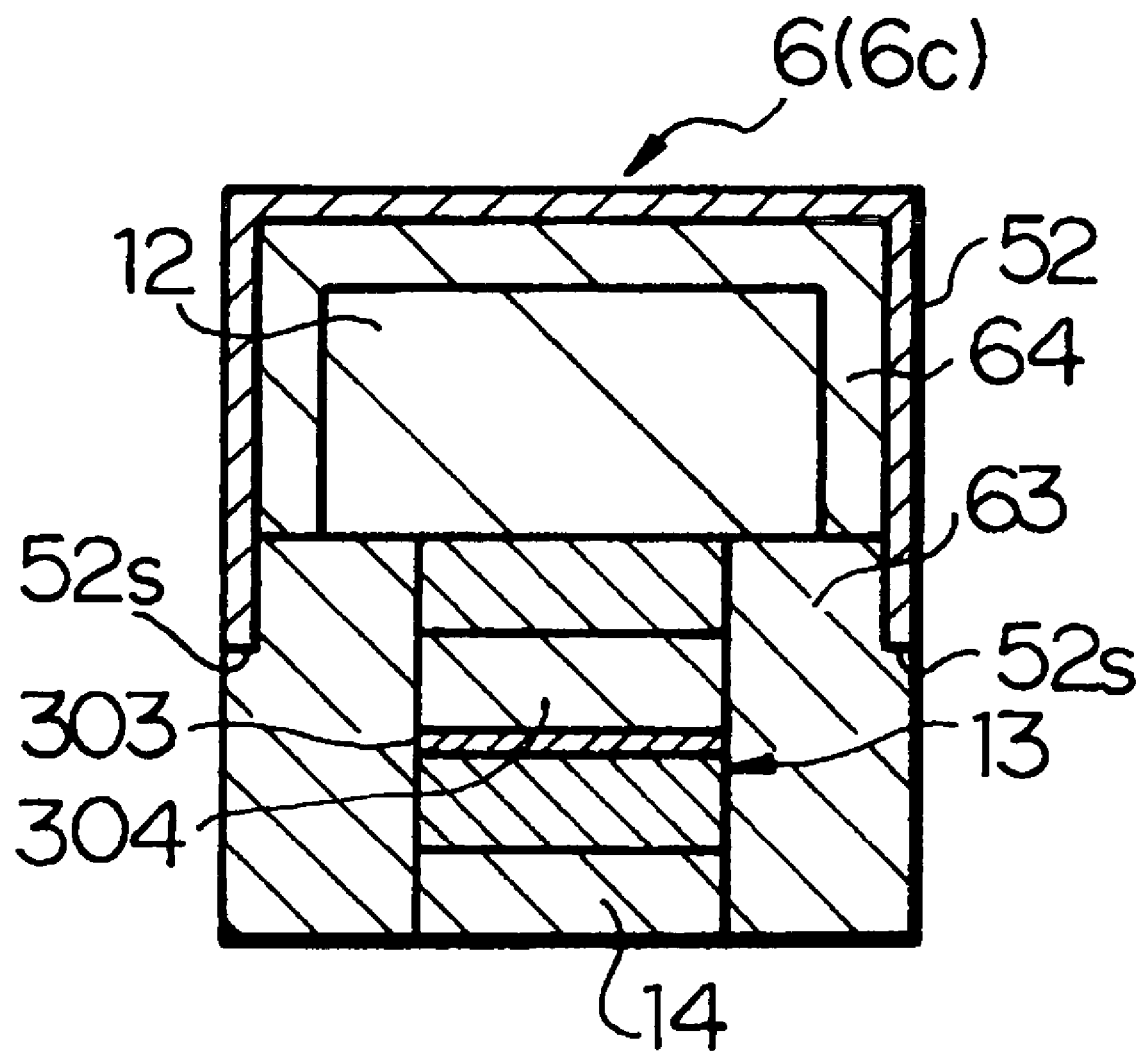
FIG. 26 is a schematic sectional view showing the structure of the sixth magnetic memory device of the third embodiment according to the present invention.

Next, a description is given below of the sixth magnetic memory device of the third embodiment according to the present invention with reference to FIG. 26, which is a schematic sectional view showing main constituents. FIG. 26 only shows the switching element, TMR element, bit line, and part of insulating film, with other constituents being omitted. Like reference characters designate constituents corresponding to those in the first magnetic memory device of the first embodiment mentioned above.

As shown in FIG. 26, the sixth magnetic memory device 6 (6c) of the third embodiment is similar in structure to the magnetic memory device shown in FIG. 24, except that the memory device 6c has the same magnetic flux concentrator 52 as that explained above with reference to FIG. 15. In other words, the memory device 6c has the insulating film 64 between the magnetic flux concentrator 52, which is explained above with reference to FIG. 24, and the bit line 12. The lower side of the TMR element 13 is connected to the writing word line (not shown) intersecting three-dimensionally with the bit line 12, with the switching element 14 interposed therebetween.

The above-mentioned magnetic flux concentrator 52 is formed such that either or both (as illustrated) of the high-permeability layer formed on the lateral sides of the bit line 12 project from the bit line 12 toward the TMR element 13, as in the case explained with reference to FIG. 15. The side wall of the magnetic flux concentrator 52 is insulated from the TMR element 13 by the insulating film 63. Its end 52s may be formed up to the same height as the interface between the memory layer 304 and the tunnel insulating film 303 of the TMR element 13. The height should preferably range from the interface between the tunnel insulating film 303 and the memory layer 304 to the interface between the memory layer 304 and the cap layer 313. The distance between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304.

The sixth memory device 6 (6a to 6c) is constructed as follows. The magnetic flux concentrator 52 of high-permeability layer is formed at least on the lateral sides of the bit line 12 and on the side of the bit line 12 which is opposite to the side facing the TMR element 13. At least either or both (as illustrated) of the high-permeability layer formed on the lateral sides of the bit line 12 projects from the bit line 12 toward the TMR element 13. The end 52s of the side wall of the magnetic flux concentrator 52 is as high as the memory layer 304. Therefore, as in the case of the second magnetic memory device 2, the magnetic field generated by the bit line 12 is transmitted to the end 52s of the magnetic flux concentrator 52 and most intensified between its ends 51s and 51s. Accordingly, the magnetic field is efficiently concentrated at the memory layer 304 of the TMR element 13. The effect of the foregoing is that it is possible to reduce the current value necessary for writing. This leads to the saving of power consumption and extends the life on electromigration of the bit line 12. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Next, a description is given below of the producing method of the first magnetic memory device of the first embodiment according to the present invention with reference to FIGS. 27A to 27E, which are schematic sectional views. The wirings under the writing word line and the reading element (such as field effect transistor of insulated gate type) are produced in the conventional way. Therefore, the description is omitted.

Figure 27A:
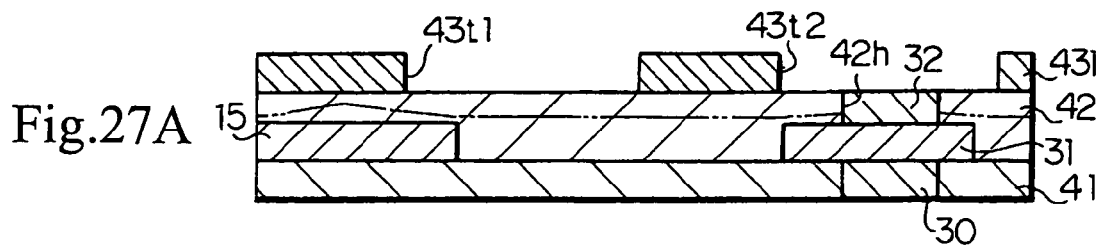
FIGS. 27A to 27E are schematic sectional views showing the producing method of the first magnetic memory device of the first embodiment according to the present invention.

In FIG. 27A, a sense line 15, a first landing pad 31, and the like are formed on a first insulating film 41. These wirings are formed from metal film, conductive metal compound film, or conductive polysilicon film, and are 600 nm thick. In addition, on the first insulating film 41 is formed a contact 30 (connected to the first landing pad 31) which is to be connected to the diffusion layer of the reading transistor (not shown). Incidentally, a contact for connection from the sense line 15 to another diffusion layer of the reading transistor is omitted.

On the first insulating film 41 are formed the second insulating film 42 that covers the sense line 15 and the first landing pad 31. The second insulating film 42 may be an HDP film of 800 nm thick formed by high-density plasma CVD (Chemical Vapor Deposition). The HDP film is covered with a P-TEOS film of 1200 nm thick by plasma TEOS (tetraethoxysilane)-CVD process. Subsequently, the second insulating film 42 is polished and planarized by chemical-mechanical polishing such that the second insulating film 42 of 700 nm thick is left on the sense line 15 and the first landing pad 31.

Then, a via hole 42h reaching the sense line 15 and the first landing pad 31 is made in the second insulating film 42 by lithography and etching technologies. The via hole reaching the sense line 15 is not shown.

The via hole 42h is filled with tungsten by the ordinary tungsten plug forming technology, so that a contact 32 of tungsten plug is formed. Tungsten film can be formed by the existing film forming technology such as chemical vapor deposition and sputtering. Excess tungsten film formed on the second insulating film 42 may be removed by Chemical-mechanical polishing or etch-back process.

Then, an insulating film 431, which becomes part of the third insulating film, is formed on the second insulating film 42. This insulating film 431 may be a P-TEOS film of 500 nm thick. The thickness of the insulating film 431 determines the height of the side walls of the magnetic flux concentrator to be mentioned later. Therefore, it is established such that the end of the side wall of the magnetic flux concentrator is as high as the memory layer of the TMR element. Then, a wiring trench 43t1 and a wiring trench 43t2 are formed in the insulating film 431 by lithography and etching technologies. The wiring trenches 43t1 and 43t2 are for forming the writing word line and the second landing pad respectively.

Figure 27B:
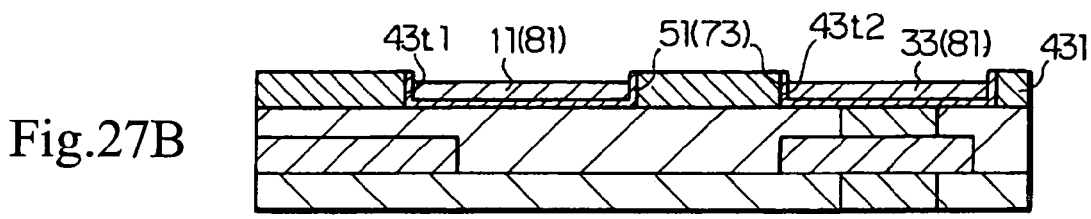

Then, as FIG. 27B shows, a barrier metal layer (not shown), a high-permeability layer 73, and a wiring material layer 81 are formed sequentially on the inside of the wiring trenches 43t1 and 43t2 and on the surface of the insulating film 431.

The barrier metal layer may be composed of a titanium (Ti) layer of 5 nm thick and a titanium nitride (TiN) layer of 20 nm thick which are sequentially deposited on top of the other.

The high-permeability layer 73 may be formed from a high-permeability material such as soft magnetic material having a maximum permeability $\mu_m$ no smaller than 100. The examples of the soft magnetic materials include nickel-iron-cobalt alloys, iron-aluminum (FeAl) alloys, and ferrite alloys. It may be 100 nm thick, for example. Metal compounds, metal oxides, or metal nitrides containing any of cobalt (Co), iron (Fe), and nickel (Ni) may also be used so long as the maximum permeability $\mu_m$ is no smaller than 100.

The wiring material layer 81 may be formed from aluminum (Al), copper (Cu), or aluminum-copper (Al—Cu) alloy. It is 450 nm thick, for example.

After that, excess part of the wiring material layer 81 and the barrier metal (not shown) is removed from the insulating film 431 by chemical-mechanical polishing, so that the wiring material layer 81 and barrier metal (not shown) are left in the wiring trenches 43t1 and 43t2. The writing word line 11 and the second landing pad 33 are formed. Etch back is performed so that only the wiring material layer 81 in the wiring trenches 43t1 and 43t2 retreats 100 nm, for example, and the high-permeability layer 73 is exposed on the upper side of the writing word line 11. In this way, the magnetic flux concentrator 51 of the high-permeability layer 73 is formed.

Figure 27C:
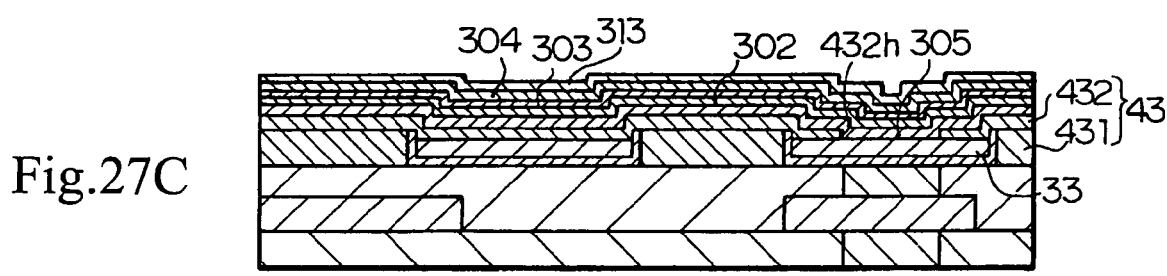

Next, as shown in FIG. 27C, an aluminum oxide ($Al_2O_3$) film of 20 nm thick is formed by deposition on the insulating film 431. This aluminum oxide film functions as the insulating film 432 constituting part of the third insulating film 43. In this way the third insulating film 43 is formed. After that, the insulating film 432 undergoes etching through a photoresist mask by lithography and etching technologies. This etching makes an opening 432h in the insulating film 432 on the second landing pad 33. The opening 432h connects the TMR element (to be formed later) and the second landing pad 33. Incidentally, the insulating film 432 may be formed from any other insulating materials (such as silicon oxide and silicon nitride) than aluminum oxide.

The next step is to sequentially form a barrier layer (not shown), an antiferromagnetic material layer 305, a magnetization pinned layer 302 of ferromagnetic material, a tunnel insulating film 303, a memory layer 304 of ferromagnetic material, and a cap layer 313 by PVD process on the third insulating film 43 having the opening 432h mentioned above.

The barrier layer mentioned above may be formed from titanium nitride, tantalum, or tantalum nitride.

The antiferromagnetic material layer 305 may be formed from any one of iron-manganese alloys, nickel-manganese alloys, platinum-manganese alloys, iridium-manganese alloys, rhodium-manganese alloys, cobalt oxide, and nickel oxide. This antiferromagnetic material layer 305 may function as an underlying conductor layer for connection of the switching element to be connected in series with the TMR element 13. Therefore, in this embodiment, the antiferromagnetic layer 305 is used as part of the wiring for connection of the TMR element 13 and the switching element (not shown).

The magnetization pinned layer 302 mentioned above may be formed from a ferromagnetic material such as nickel, iron, or cobalt or an alloy composed of at least two species of nickel, iron, and cobalt. This magnetization pinned layer 302 is formed to contact with the antiferromagnetic material layer 305. The layer 302 has a strong unidirectional magnetic anisotropy due to exchange interaction between the magnetization pinned layer 302 and the antiferromagnetic material layer 305. In other words, the magnetization pinned layer 302 has its magnetization direction pinned by exchange interaction with the antiferromagnetic material layer 305.

Incidentally, the magnetization pinned layer 302 mentioned above may be of laminate structure, with a conductor layer sandwiched between magnetic layers. For example, the layer 302 may be of multi-layered structure composed of a conductor layer, which antiferromagnetically couples the first magnetization pinned layer and the magnetic layer, and the second magnetization pinned layer 302 from the antiferromagnetic material layer 305 side. This magnetization pinned layer 302 may be of laminate structure composed of three or more ferromagnetic material layers sandwiched between conductor layers. The conductor layer mentioned above may be formed from any of ruthenium, copper, chromium, gold, and silver.

The tunnel insulating film 303 mentioned above functions to apply tunnel current and to cut magnetic linkage between the memory layer 304 and the magnetization pinned layer 302. Therefore, usually a 0.5 to 5 nm thick film of aluminum oxide is used as the insulating film 303. However, the insulating film 303 may also be formed from any of magnesium oxide, silicon oxide, aluminum nitride, magnesium nitride, silicon nitride, aluminum oxide nitride, magnesium oxide nitride, and silicon oxide nitride. As mentioned above, the tunnel insulating film 303 is as thin as 0.5 to 5 nm. Therefore, it is formed by ALD (Atomic Layer Deposition) process. Alternatively, the film 303 may also be formed by ensuing plasma oxidizing or nitriding after sputtering, which deposits metal film such as aluminum film.

The memory layer 304 mentioned above may be formed from a ferromagnetic material such as nickel, iron, cobalt, and alloy composed of at least two species of nickel, iron, and cobalt. This memory layer 304 has its magnetization direction changed parallel or antiparallel with respect to the underlying magnetization pinned layer 302 by an externally applied magnetic field.

The cap layer 313 mentioned above functions to prevent mutual diffusion between wirings connecting one TMR element to another TMR element. The layer 313 also functions to reduce contact resistance and to prevent oxidation of the memory layer 304. The layer 313 is usually formed from any of copper, tantalum nitride, tantalum, and titanium nitride.

Figure 27D:
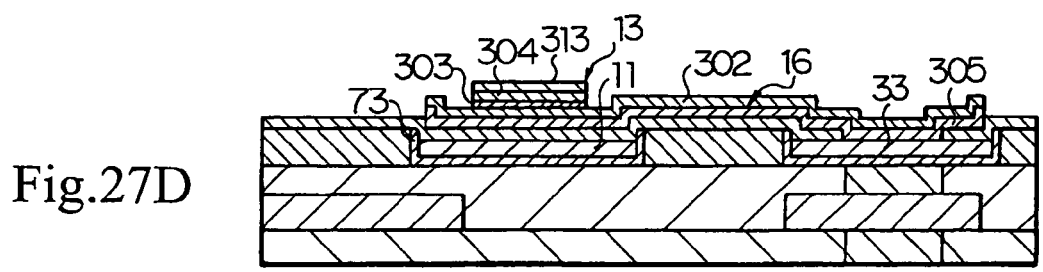

The next step shown in FIG. 27D is to perform etching on the laminate film (composed of the cap layer 313 to the antiferromagnetic material layer 305) to form the TMR element 13 (composed of the cap layer 313 to the magnetization pinned layer 302) by lithography technology and etching technology (e.g., reactive ion etching) that employ a photoresist mask. This etching is carried out such that etching terminates at an intermediate point between the tunnel insulating film 303 and the magnetization pinned layer 302. Etching gas may be a halogen gas containing chlorine (Cl) or a mixed gas of carbon monoxide (CO) and ammonia ($NH_3$). Etching is followed by removal of photoresist.

The next step is to form a by-pass line 16 from the magnetization pinned layer 302 and the antiferromagnetic material layer 305 by lithography technology and etching technology (e.g., reactive ion etching) that employ a photoresist mask. The by-pass line 16 connects the TMR element 13 with the second landing pad 33. In this structure, the high-permeability layer 73 formed on the lower part and the lateral sides of the writing word line 11 projects toward the TMR element 13 from the upper surface of the writing word line 11. Therefore, the magnetic field generated by the writing word line 11 is efficiently applied to the memory layer 304 of the TMR element 13.

Figure 27E:
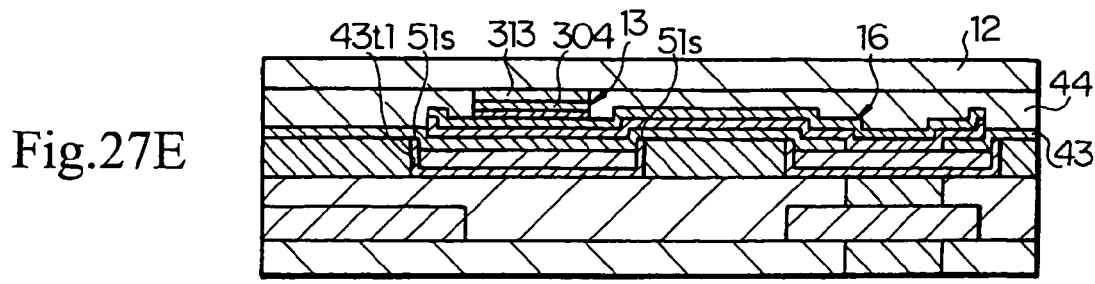

The next step shown in FIG. 27E is to form the fourth insulating film 44, which covers the TMR element 13 and the by-pass line 16, on the third insulating film 43. The fourth insulating film 44 may be formed from silicon oxide or aluminum oxide by CVD process or PVD process. The resulting fourth insulating film 44 is planarized by chemical-mechanical polishing, so that the top of the cap layer 313 of the TMR element 13 is exposed.

The next step is to form the bit line 12, the wiring (not shown) for the peripheral circuits, and the bonding pad region (not shown) by the standard wiring technique. The final step to complete the wafer process is to form the fifth insulating film (not shown) with plasma silicon nitride, as a protective film over the entire surface and to make an opening in the bonding pad. Incidentally, the end 51s of the magnetic flux concentrator 51 may be as high as the memory layer 304 of the TMR element 13. This object may be achieved by forming the wiring trench 43t1 deep.

Next, a description is given below of the producing method of the first magnetic memory device of the second embodiment according to the present invention with reference to FIGS. 28A to 28E, which are schematic sectional views. The wirings under the writing word line and the reading element (such as field effect transistor of insulated gate type) are produced in the conventional way; therefore, the description is omitted.

In FIG. 28A, a sense line 15 and a first landing pad 31 are formed on a first insulating film 41. These wirings are formed from metal film, conductive metal compound film, or conductive polysilicon film, and are 600 nm thick. In addition, on the first insulating film 41 is formed a contact 30 to be connected to the diffusion layer of the reading transistor (not shown). The contact 30 is connected to the first landing pad 31. Incidentally, a contact for connection from the sense line 15 to another diffusion layer of the reading transistor is omitted. On the first insulating film 41 are formed the second insulating film 42 that covers the sense line 15 and the first landing pad 31. The second insulating film 42 may be an HDP film of 800 nm thick formed by high-density plasma CVD process. The HDP film is covered with a P-TEOS film of 1200 nm thick by plasma TEOS (tetraethoxysilane)-CVD process. Subsequently, the second insulating film 42 is polished and planarized by chemical-mechanical polishing such that the second insulating film 42 of 700 nm thick is left on the sense line 15 and the first landing pad 31.

Then, a via hole 42h reaching the sense line 15 and the first landing pad 31 is made in the second insulating film 42 by lithography and etching technologies. The via hole reaching the sense line 15 is not shown. The via hole 42h is filled with tungsten by the ordinary tungsten plug forming technology, so that a contact 32 of tungsten plug is formed. Tungsten film can be formed by the existing film forming technology such as chemical vapor deposition and sputtering. Excess tungsten film formed on the second insulating film 42 may be removed by Chemical-mechanical polishing or etch-back process.

The next step is to form a barrier metal (not shown), the high-permeability layer 73, and the wiring material layer 81 on the surface of the second insulating film 42 by PVD process. The wiring material layer 81 is to form the writing word line and landing pad.

The barrier metal may be formed by sequentially depositing titanium (Ti) in a thickness of 5 nm and titanium nitride (TiN) in a thickness of 20 nm.

The high-permeability layer 73 may be formed from a soft magnetic material having a maximum permeability $\mu_m$ no smaller than 100. The examples of the soft magnetic materials include nickel-iron-cobalt alloys and ferrite alloys. It may be 100 nm thick, for example. Metal compounds, metal oxides, or metal nitrides containing any of cobalt (Co), iron (Fe), and nickel (Ni) may also be used so long as the maximum permeability $\mu_m$ is no smaller than 100.

The wiring material layer 81 may be formed from aluminum (Al), copper (Cu), or aluminum-copper (Al—Cu) alloy. It is 300 nm thick, for example.

Then, a dummy film 82, such as plasma silicon nitride film, is formed by deposition in a thickness of 40 nm.

Then, etching is performed sequentially on the dummy film 82, the wiring material layer 81, the high-permeability layer 73, and the barrier metal (not shown) through a photoresist mask by using the lithography and etching technologies, so as to form the writing word line 11 and the second landing pad 33 connected to the contact 32, with the dummy film 82 remaining thereon.

In the next step as shown in FIG. 28B, a high-permeability layer that covers the dummy film 82 (see FIG. 28A) is formed on the second insulating film 42 by PVD process. The entire surface of the high-permeability layer undergoes etch-back, so that the high-permeability side wall 74S is formed on each side wall of the second landing pad 33 and the writing word line 11 having the dummy film 82 thereon. In this way, the magnetic flux concentrator 51 composed of the high-permeability layer 73 and the high-permeability side wall 74S is formed. Then, only the dummy film 82 is removed by selective etching. Incidentally, in this step, the high-permeability side wall 74S, which is similar to the side wall of the writing word line 11, is also formed on the side wall of the second landing pad 33. This high-permeability side wall 74S constitutes the side wall of the magnetic flux concentrator 51 and hence the height of its end 51s is adjusted by the thickness of the dummy film 82. The end 51s may be as high as the interface between the memory layer and the cap layer of the TMR element to be formed later. The height should preferably range from the interface between the tunnel insulating film and the memory layer to the interface between the memory layer and the cap layer. The distance between the high-permeability side wall 74S and the TMR element 13 should preferably be no larger than 200 nm so that the magnetic flux concentrated at the end 51s efficiently reaches the memory layer.

The next step shown in FIG. 28C is to deposit aluminum oxide ($Al_2O_3$) in a thickness of 20 nm on the second insulating film 42 to form the third insulating film 43. The third insulating film 43 covers writing word line 11, the second landing pad 33, and the magnetic flux concentrator 51. After that, the third insulating film 43 undergoes etching through a photoresist mask by lithography and etching technologies. This etching makes an opening 43h for connection of the TMR element and the second landing pad 33.

The next step is to sequentially form a barrier layer (not shown), an antiferromagnetic material layer 305, a magnetization pinned layer 302 of ferromagnetic material, a tunnel insulating film 303, a memory layer 304 of ferromagnetic material, and a cap layer 313 by PVD process on the third insulating film 43 having the opening 43h mentioned above.

The barrier layer (not shown), the antiferromagnetic material layer 305, the magnetization pinned layer 302, the tunnel insulating layer 303, the memory layer 304 of ferromagnetic material, and the cap layer 313 may be formed from the same material as explained above for the first embodiment.

The next step shown in FIG. 28D is to perform etching on the laminate film (composed of the cap layer 313 to the antiferromagnetic material layer 305) to form the TMR element 13 (composed of the cap layer 313 to the magnetization pinned layer 302) by lithography technology and etching technology (e.g., reactive ion etching) that employ a photoresist mask. This etching is carried out such that etching terminates at an intermediate point between the tunnel insulating film 303 and the magnetization pinned layer 302. Etching gas may be a halogen gas containing chlorine (Cl) or a mixed gas of carbon monoxide (CO) and ammonia ($NH_3$). Etching is followed by removal of photoresist.

The next step is to form a by-pass line 16 from the magnetization pinned layer 302 and the antiferromagnetic material layer 305 by lithography technology and etching technology (e.g., reactive ion etching) that employ a photoresist mask. The by-pass line 16 connects the TMR element 13 with the second landing pad 33. In this structure, the magnetic flux concentrator 51 formed on the lower part and the lateral sides of the writing word line 11 projects toward the vicinity of the lateral sides of the TMR element 13. Therefore, the magnetic field generated by the writing word line 11 is efficiently applied to the memory layer 304 of the TMR element 13.

The next step shown in FIG. 28E is to form the fourth insulating film 44, which covers the TMR element 13 and the by-pass line 16, on the third insulating film 43. The fourth insulating film 44 may be formed from silicon oxide or aluminum oxide by CVD process or PVD process. The resulting fourth insulating film 44 is planarized by chemical-mechanical polishing, so that the top of the cap layer 313 of the TMR element 13 is exposed.

The next step is to form the bit line 12, the wiring (not shown) for the peripheral circuits, and the bonding pad region (not shown) by the standard wiring technique. The final step to complete the wafer process is to form the fifth insulating film (not shown) with plasma silicon nitride, as a protective film over the entire surface and to make an opening in the bonding pad.

Next, a description is given below of the producing method of the first magnetic memory device of the third embodiment according to the present invention with reference to FIGS. 29A to 29F, which are schematic sectional views. The wirings under the writing word line and the reading element (such as field effect transistor of insulated gate type) are produced in the conventional way; therefore, their description is omitted.

Figure 29A:
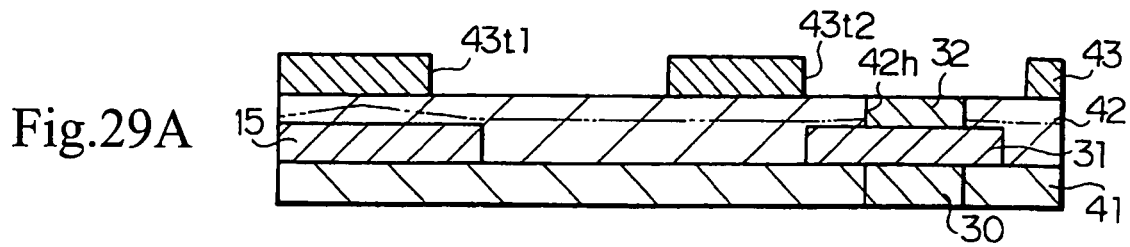
FIGS. 29A to 29F are schematic sectional views showing the producing method of the first magnetic memory device of the third embodiment according to the present invention.

In FIG. 29A, a sense line 15 and a first landing pad 31 are formed on a first insulating film 41. These wirings are formed from metal film, conductive metal compound film, or conductive polysilicon film, and are 600 nm thick. In addition, on the first insulating film 41 is formed a contact 30 to be connected to the diffusion layer of the reading transistor (not shown). The contact 30 is connected to the first landing pad 31. Incidentally a contact for connection from the sense line 15 to another diffusion layer of the reading transistor is omitted. On the first insulating film 41 are formed the second insulating film 42 that covers the sense line 15 and the first landing pad 31. The second insulating film 42 may be an HDP film of 800 nm thick formed by high-density plasma CVD process. The HDP film is covered with a P-TEOS film of 1200 nm thick by plasma TEOS (tetraethoxysilane)-CVD process. Subsequently, the second insulating film 42 is polished and planarized by chemical-mechanical polishing such that the second insulating film 42 of 700 nm thick is left on the sense line 15 and the first landing pad 31.

Then, a via hole 42h reaching the sense line 15 and the first landing pad 31 is made in the second insulating film 42 by lithography and etching technologies. The via hole reaching the sense line 15 is not shown. The via hole 42h is filled with tungsten by the ordinary tungsten plug forming technology, so that a contact 32 of tungsten plug is formed. Tungsten film can be formed by the existing film forming technology such as chemical vapor deposition and sputtering. Excess tungsten film formed on the second insulating film 42 may be removed by Chemical-mechanical polishing or etch-back process.

Then, a third insulating film 43 is formed on the second insulating film 42. This third insulating film 43 is a 400-nm thick film of P-TEOS. Then, a wiring trench 43t1 and a wiring trench 43t2 are formed in the third insulating film 43. The wiring trenches 43t1 and 43t2 are to form the writing word line and the second landing pad respectively.

Figure 29B:
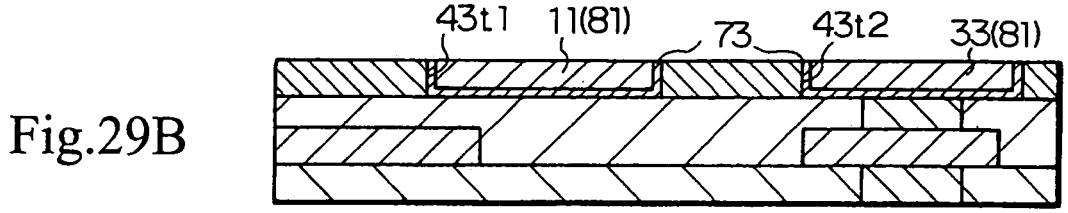

The next step shown in FIG. 29B is to form sequentially a barrier metal (not shown), a high-permeability layer 73, and a wiring material layer 81 inside the wiring trenches 43t1 and 43t2 and on the third insulating film 43. The barrier metal (not shown), the high-permeability layer 73, and the wiring material layer 81 may be formed from the same material as explained above for the first embodiment.

Then, excess part of the wiring material layer 81 and the barrier metal (not shown) on the third insulating film 43 is removed by chemical-mechanical polishing, so that the writing word line 11 and the second writing pad 33 are formed, with the wiring material layer 81 and the barrier metal (not shown) remaining inside the wiring trenches 43t1 and 43t2.

Figure 29C:
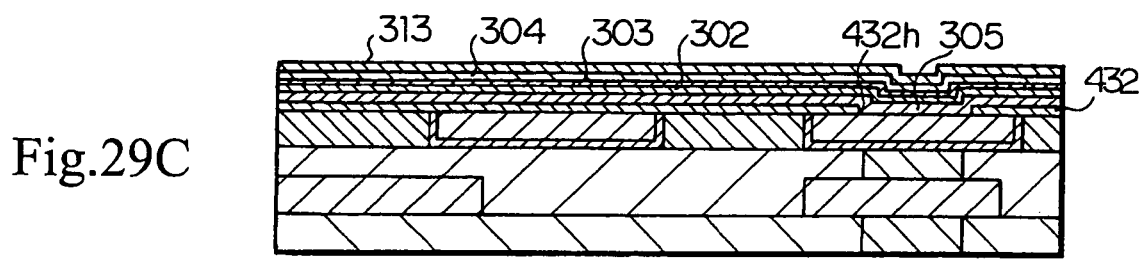

The next step shown in FIG. 29C is to deposit aluminum oxide ($Al_2O_3$) in a thickness of 20 nm to form the insulating film 432 as a part of the third insulating film 43. After that, the insulating film 432 undergoes etching through a photoresist mask by lithography and etching technologies. This etching forms, in the insulating film 432 on the second landing part 33, an opening 432h for connection of the TMR element (to be formed later) with the second landing pad 33. Incidentally, the insulating film 432 may be formed from any insulating materials (such as silicon oxide and silicon nitride) other than aluminum oxide.

The next step is to sequentially form a barrier layer (not shown), an antiferromagnetic material layer 305, a magnetization pinned layer 302 of ferromagnetic material, a tunnel insulating film 303, a memory layer 304 of ferromagnetic material, and a cap layer 313 by PVD process on the third insulating film 43 having the opening 432h mentioned above. The tunnel insulating film 303 mentioned above functions to apply tunnel current and to cut magnetic linkage between the memory layer 304 and the magnetization pinned layer 302. Therefore, it is usually a 0.5 to 5 nm thick.

The barrier layer (not shown), the antiferromagnetic material layer 305, the magnetization pinned layer 302, the tunnel insulating layer 303, the memory layer 304 of ferromagnetic material, and the cap layer 313 may be formed from the same material as explained above for the first embodiment.

Figure 29D:
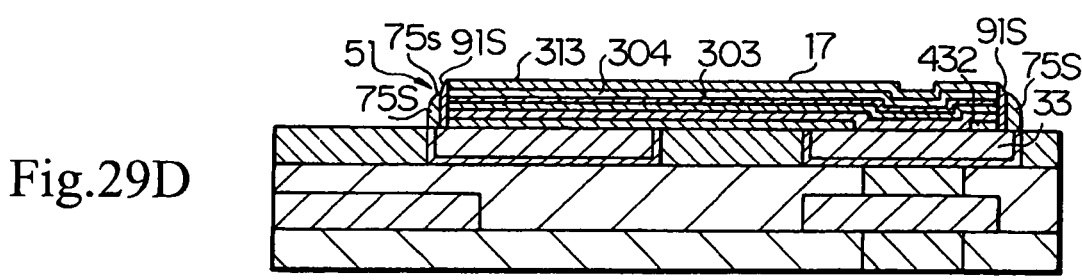

The next step shown in FIG. 29D is to perform etching on the laminate film, which is composed of the cap layer 313 to the insulating layer 432, to form the pattern 17 by lithography technology and etching technology (e.g., reactive ion etching) that employ a photoresist mask. The pattern 17 becomes the by-pass line to connect the TMR element (to be formed later) with the second landing pad 33. Then, an insulating film, about 30 nm thick, that covers the pattern 17 is formed with plasma silicon nitride film, silicon oxide film, or aluminum oxide film. The insulating film undergoes etch-back by anisotropic etching to form the insulating film side wall 91S. Further, the high-permeability layer is formed by PVD process, and then this high-permeability layer undergoes etch-back so as to form the high-permeability side wall 75S on the lateral side of the insulating film side wall 91S. In this way, the magnetic flux concentrator 51 composed of the high-permeability layer 73 and the high-permeability side wall 75S is formed. The height of the end 75s of the high-permeability side wall 75S of the magnetic flux concentrator 51 should be below the interface between the memory layer 304 and the cap layer 313. The height should preferably range from the interface between the tunnel insulating film 303 and the memory layer 304 to the interface between the memory layer 304 and the cap layer 313.

Figure 29E:
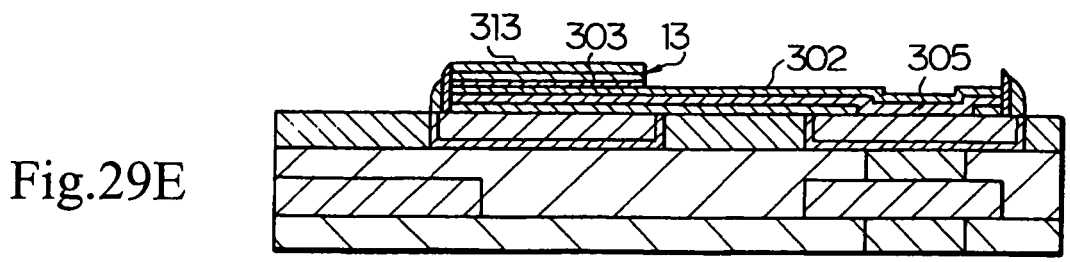

The next step shown in FIG. 29E is to perform etching on the laminate film (composed of the cap layer 313 to the antiferromagnetic material layer 305) to form the TMR element 13 by lithography technology and etching technology (e.g., reactive ion etching) that employ a photoresist mask. This etching is carried out such that etching terminates at an intermediate point between the tunnel insulating film 303 and the magnetization pinned layer 302. Etching gas may be a halogen gas containing chlorine (Cl) or a mixed gas of carbon monoxide (CO) and ammonia ($NH_3$). As the result, the TMR element 13 and the by-pass line 16, which connects the TMR element 13 to the second landing pad 33, are formed. The by-pass line 16 is composed of the antiferromagnetic material layer 305 and the magnetization pinned layer 302.

Figure 29F:
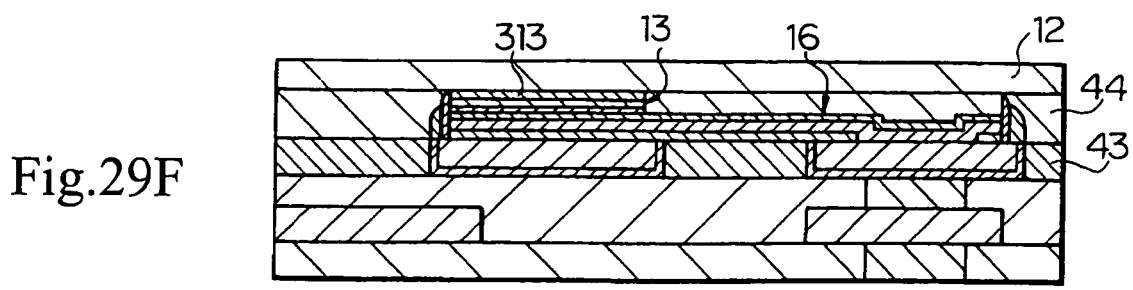

The next step shown in FIG. 29F is to form the fourth insulating film 44, which covers the TMR element 13 and the by-pass line 16, on the third insulating film 43. The fourth insulating film 44 may be formed from silicon oxide or aluminum oxide by CVD process or PVD process. The resulting fourth insulating film 44 is planarized by chemical-mechanical polishing, so that the top of the cap layer 313 of the TMR element 13 is exposed.

The next step is to form the bit line 12, the wiring (not shown) for the peripheral circuits, and the bonding pad region (not shown) by the standard wiring technique. The final step to complete the wafer process is to form the fifth insulating film (not shown) with plasma silicon nitride, as a protective film over the entire surface and to make an opening in the bonding pad.

The above-mentioned producing process gives a structure as follows. The high-permeability layer 73 formed around the writing word line 11 is connected to the high-permeability side wall 75S to constitute the magnetic flux concentrator 51, and the high-permeability side wall 75S of the magnetic flux concentrator 51 projects in the vicinity of the lateral side of the TMR element 13. The effect of this structure is that the magnetic field generated by the writing word line 11 is efficiently applied to the memory layer 304 of the TMR element 13.

Next, a description is given below of the producing method of the first magnetic memory device of the fourth embodiment according to the present invention with reference to FIGS. 30A and 30B, which are schematic sectional views. This producing method is intended to obtain the basic structure of the first magnetic memory device of the third embodiment explained above with reference to FIG. 10.

Figure 30A:
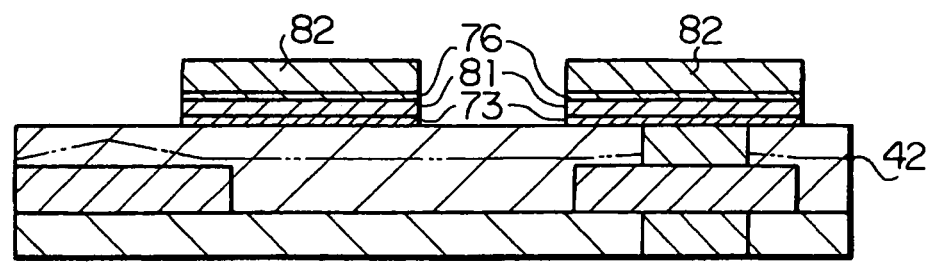
FIGS. 30A and 30B are schematic sectional views showing the producing method of the first magnetic memory device of the fourth embodiment according to the present invention.

As shown in FIG. 30A, this producing method is similar to that explained above with reference to FIG. 28A. The first step is to sequentially form a barrier metal (not shown), the high-permeability layer 73, the wiring material layer 81 for forming the writing word line and landing pad, and the high-permeability layer 76, on the surface of the second insulating film 42 by PVD process. Then, the dummy film 82 is formed by depositing plasma silicon nitride in a thickness of 40 nm. The subsequent steps are identical with those explained above with reference to FIGS. 28A to 28E.

Figure 30B:
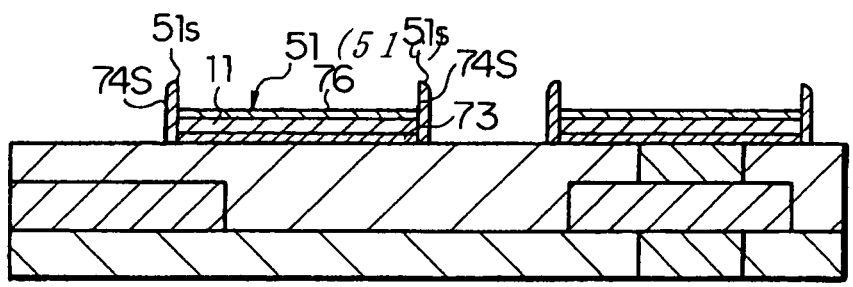

As the result, the structure of the magnetic flux concentrator 51 (51b) is obtained as shown in FIG. 30B. The high-permeability layer 73, the high-permeability side wall 74S, and the high-permeability layer 76 surround the writing word line 11. The high-permeability side wall 74S is extended along the lateral side of the TMR element 13. The end 51s of the high-permeability side wall 74S constituting the side wall of the magnetic flux concentrator 51 should be established and formed in the same way as the producing method of the first magnetic memory device of the second embodiment. The subsequent steps should follow the procedure mentioned above with reference to FIGS. 28C to 28E.

Next, a description is given below of the producing method of the first magnetic memory device of the fifth embodiment according to the present invention with reference to FIGS. 31A and 31B, which are schematic sectional views. This producing method is intended to obtain the basic structure of the first magnetic memory device of the third embodiment explained above with reference to FIG. 10.

Figure 31A:
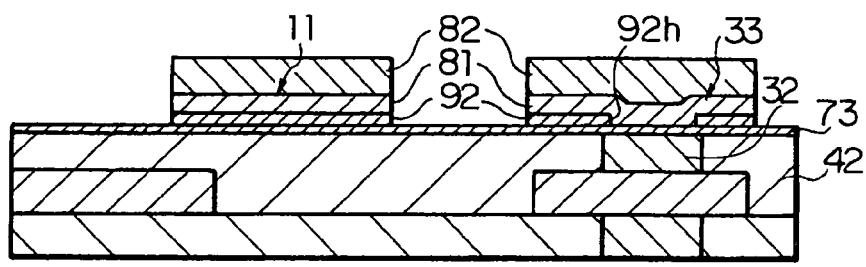
FIGS. 31A and 31B are schematic sectional views showing the producing method of the first magnetic memory device of the fifth embodiment according to the present invention.

As shown in FIG. 31A, this producing method is similar to that explained above with reference to FIG. 28A. The first step is to sequentially form a barrier metal (not shown), the high-permeability layer 73, and the insulating film 92 on the surface of the second insulating film 42 by PVD process. Then, the opening 92h, which penetrates the insulating film 92 and reaches the high-permeability layer 73 or contact 32, is made by lithography and etching technologies.

Then, the wiring material layer 81 to form the writing word line and landing pad is formed on the insulating film 92 containing the opening 92h, and the dummy film 82 is formed by depositing plasma silicon nitride in a thickness of 40 nm.

Then, etching is performed sequentially on the dummy film 82, the wiring material layer 81, and the insulating film 92 through a photoresist mask by lithography and etching technologies. This etching gives the writing word line 11 (of the wiring material layer 81) and the second landing pad 33 (connected to the contact 32), with the dummy film 82 remaining thereon.

Figure 31B:
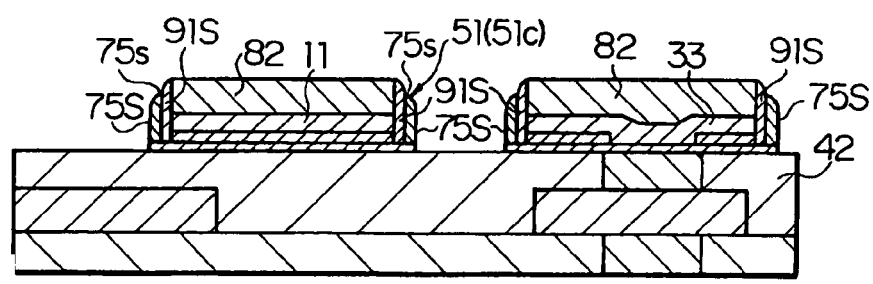

The next step as shown in FIG. 31B is to form an insulating film covering the dummy film 82 on the second insulating film 42 by CVD process. The entire surface of the insulating film undergoes etch-back, so that the insulating film side wall 91S is formed on the lateral side of the writing word line 11 carrying the dummy film 82 thereon and on the lateral side of the second landing pad 33. This insulating film side wall 91S is formed to be connected at least to the insulating film 92 and to cover the side wall of the dummy film 82.

Then, a high-permeability layer covering the plasma silicon nitride film and the insulating film side wall 91S is formed on the second insulating film 42 by PVD process. The entire surface of the high-permeability layer undergoes etch-back, so that the high-permeability side wall 75S is formed on the side wall of the writing word line 11 carrying the dummy film 82 thereon and on the side wall of the second landing pad 33. At this time, the end 75s of the high-permeability side wall 75S constituting the side wall of the magnetic flux concentrator 51 should be established and formed in the same way as the high-permeability side wall 74S in the producing method of the first magnetic memory device of the second embodiment. In this way, the structure of the magnetic flux concentrator 51 (51c) is obtained such that the insulating film 92 surrounds the writing word line 11. Further, the high-permeability layer 73, the high-permeability side wall 75S, and the high-permeability layer surround the writing word line 11 with the insulating film side wall 91S interposed. The high-permeability side wall 75S is extended along the lateral side of the TMR element 13.

Then, only the dummy film 82 is removed by selective etching. Incidentally, the high-permeability layer 73 and the barrier metal (not shown) are removed, when etch-back is performed to form the high-permeability side wall 75S. Incidentally, it is also possible to remove the unnecessary part of the high-permeability layer 73 and the barrier metal after the insulating side wall 91S has been formed. The subsequent steps are identical with those explained above with reference to FIGS. 28C to 28E.

Next, a description is given below of the producing method of the first magnetic memory device of the sixth embodiment according to the present invention with reference to FIGS. 32A and 32B, which are schematic sectional views. This producing method is intended to obtain the basic structure of the first magnetic memory device of the fourth embodiment explained above with reference to FIG. 11.

Figure 32A:
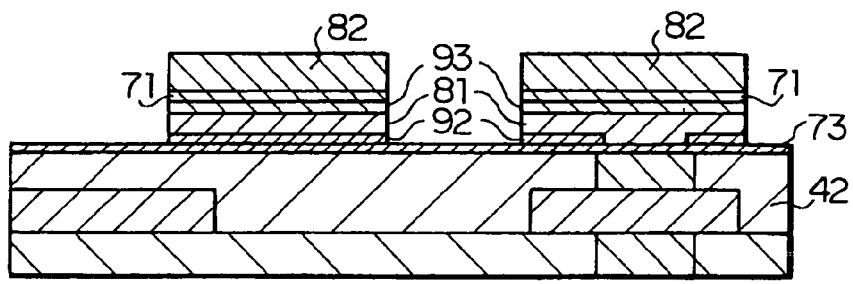
FIGS. 32A and 32B are schematic sectional views showing the producing method of the first magnetic memory device of the sixth embodiment according to the present invention.

As shown in FIG. 32A, this producing method is similar to that explained above with reference to FIG. 31A. The first step is to sequentially form a barrier metal (not shown), the high-permeability layer 73, the insulating film 92, the wiring material layer 81 for forming the writing word line and landing pad, the insulating film 93, and the high-permeability layer 71, on the surface of the second insulating film 42 by PVD process. Then, the dummy film 82 is formed by depositing plasma silicon nitride in a thickness of 40 nm. The subsequent steps are identical with those explained above with reference to FIGS. 31A and 31B.

Figure 32B:
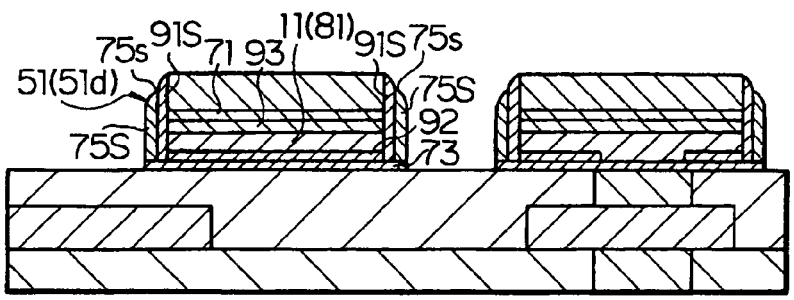

As the result, the structure of the magnetic flux concentrator 51 (51d) is obtained as shown in FIG. 32B. The insulating films 92 and 93 surround the writing word line 11 composed of the wiring material layer 81. Further, the high-permeability layer 73, the high-permeability side wall 75S, and the high-permeability layer 71 surround the writing word line 11 with the insulating film side wall 91S interposed. The high-permeability side wall 75S is extended along the lateral side of the TMR element 13. The insulating side wall 91S is formed to be connected to at least the insulating films 92 and 93. The end 51s of the high-permeability side wall 75S constituting the side wall of the magnetic flux concentrator 51 should be established and formed in the same way as the producing method of the first magnetic memory device of the second embodiment.

The method for producing the first magnetic memory device mentioned above includes a step of forming a magnetic flux concentrator 51 (51a to 51d) of high-permeability layers 71, 72, 73. The concentrator 51 is formed at least on both of the lateral sides of the writing word line 11 and on the side of the writing word line 11 which is opposite to the side facing the TMR element 13. At least either of the high-permeability side wall 75S formed on the lateral sides of the writing word line 11 projects from the writing word line 11 toward the TMR element 13. Therefore, the magnetic field generated by current flowing through the writing word line 11 is efficiently concentrated at the memory layer of the TMR element 13 by the high-permeability side wall 75S formed on both of the lateral sides of the writing word line and the high-permeability side wall 75S. The effect of the foregoing is that it is possible to reduce the current value necessary for writing. This leads to the saving of power consumption and extends the life on electromigration of the writing word line. The reduction of driving current permits the area of the current driving circuit to be reduced, which in turn leads to a higher degree of integration. Moreover, the reduced driving current decreases the leakage of magnetic field, thereby decreasing interference effect with adjacent cells.

Next, a description is given below of the producing method of the second magnetic memory device of the first embodiment according to the present invention with reference to FIGS. 33A to 33C, which are schematic sectional views. The TMR element 13 and the structure under the fourth insulating film 44 are produced by the conventional technology or by the producing method of the first memory device; therefore, their description is omitted here.

Figure 33A:
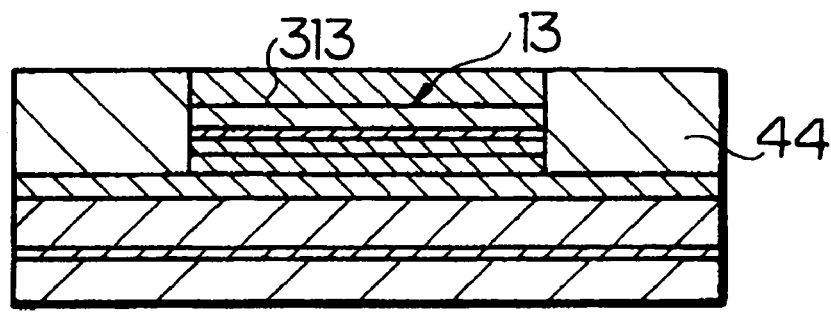
FIGS. 33A to 33C are schematic sectional views showing the producing method of the second magnetic memory device of the first embodiment according to the present invention.

As shown in FIG. 33A, the TMR element is formed on the surface of the fourth insulating film 44 such that its cap layer 313 is exposed. The surface of the fourth insulating film 44 is planarized. The TMR element 13 is formed by the producing method of the conventional magnetic memory device or by the producing method of the first memory device mentioned above.

Figure 33B:
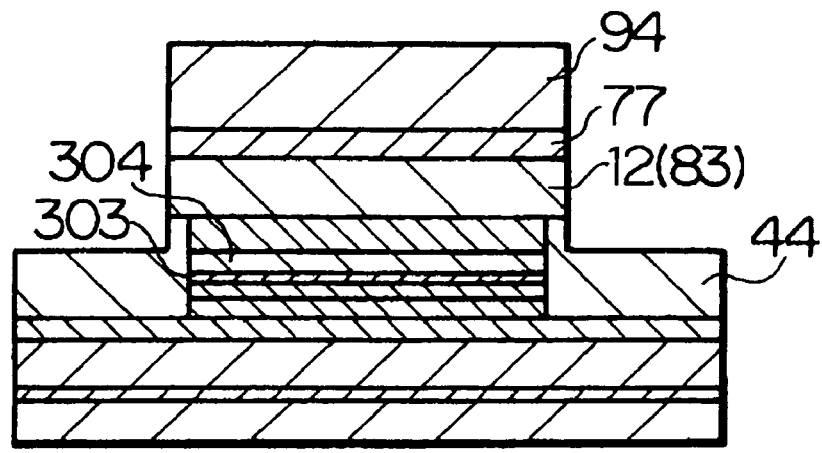

Then, as shown in FIG. 33B, barrier metal (not shown) is formed on the surface of the fourth insulating film 44 by PVD process. The barrier metal is composed of titanium (Ti) of 5 nm thick and titanium nitride (TiN) of 20 nm thick, which are sequentially deposited on top of the other. Then, the wiring material layer 83 for the bit line is formed by PVD process. The layer 83 is formed by depositing aluminum, copper, or aluminum-copper alloy in a thickness of 500 nm. Further, the high-permeability layer 77 of 30 nm thick is formed by PVD process.

Then, the resist mask 94 to be used to form the bit line is formed by lithography and etching technologies. Etching through the resist mask is performed sequentially on the high-permeability layer 77, the wiring material layer 83, barrier metal (not shown), and the fourth insulating film 44. Thus, the bit line 12 carrying the high-permeability layer 77 thereon is formed. This etching is carried out such that to terminate at an intermediate point in the fourth insulating film 44. The depth of etching should be the interface between the memory layer 304 and the tunnel insulating film 303 of the TMR element, preferably in the range from the interface between the memory layer 304 and the tunnel insulating film 303 to the interface between the memory layer 304 and the cap layer 313. With the depth established as mentioned above, the end of the side wall of the magnetic flux concentrator 52 (to be formed later) is so positioned as to permit the magnetic field to be concentrated easily at the memory layer of the TMR element.

Figure 33C:
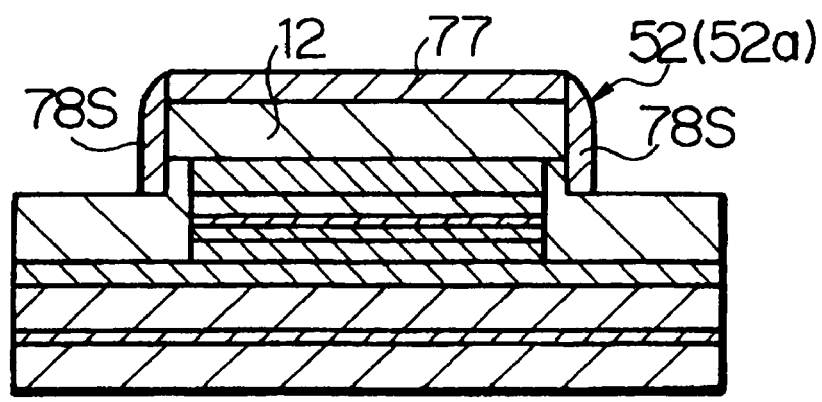

Then, as shown in FIG. 33C, a high-permeability layer, which covers the bit line 12 containing the high-permeability layer 77, is formed by PVD process. This high-permeability layer undergoes etch-back so that the high-permeability side wall 78S of high-permeability layer is formed on the side wall of the bit line 12. In this way, the magnetic flux concentrator 52 (52a) composed of the high-permeability layer 77 and the high-permeability side wall 78S connected thereto is formed.

The advantage of the above-mentioned producing method is that the magnetic flux concentrator 51 composed of the high-permeability layer 77 and the high-permeability side wall 78S constitutes the magnetic circuit. As a result, the magnetic field generated by the bit line 12 is efficiently concentrated at the memory layer of the TMR element 13.

Next, a description is given below of the producing method of the second magnetic memory device of the second embodiment according to the present invention with reference to FIGS. 34A to 34E, which are schematic sectional views. What is mentioned in this section is another method for producing the second magnetic memory device of the first embodiment explained above with reference to FIG. 13. The TMR element 13 and the structure under the fourth insulating film 44 are produced by the conventional method or by the method for producing the first magnetic memory device mentioned above; therefore, their description is omitted.

The first step is to form the TMR element 13 by the existing method or by the method for producing the first magnetic memory device mentioned above as shown in FIG. 34A. The TMR element 13, which has the cap layer 313 as the uppermost layer, is formed on the writing word line 11, with part of the third insulating film 43 interposed therebetween. Incidentally, the antiferromagnetic material layer 305, which constitutes the TMR element 13, and the by-pass line 16, which is composed of the magnetization pinned layer 302, extend in the direction perpendicular to the paper and are formed such that the TMR element 13 and the by-pass line 16 come across in the widthwise direction. The structure and producing method of the TMR element 13 are the same as those mentioned above. Of course, it is also possible to use the well-known structure and producing method.

Figure 34A:
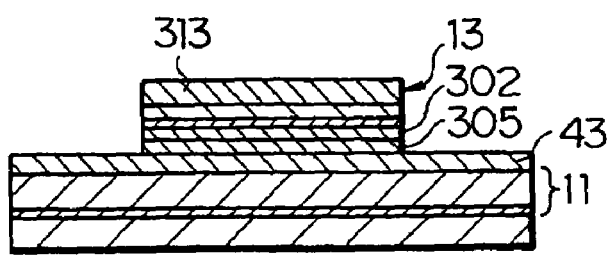
FIGS. 34A to 34E are schematic sectional views showing the producing method of the second magnetic memory device of the second embodiment according to the present invention.
Figure 34B:
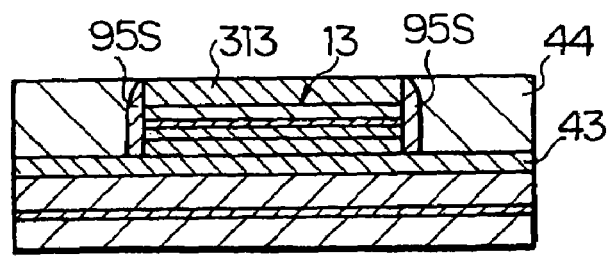

The next step shown in FIG. 34B is to form an insulating film on the third insulating film 43 by CVD process or PVD process. The insulating film covers the TMR element and the by-pass line (not shown) and is formed from plasma silicon nitride or aluminum oxide. This insulating film undergoes etch-back, so that the insulating film side wall 95S is formed on the side wall of the TMR element 13. Then, the fourth insulating film 44 of silicon oxide, which covers the TMR element 13, is formed by CVD process of PVD process. After that, the surface of the fourth insulating film is planarized by chemical-mechanical polishing, so that the cap layer 313, which is on the uppermost layer of the TMR layer 13, is exposed.

Figure 34C:
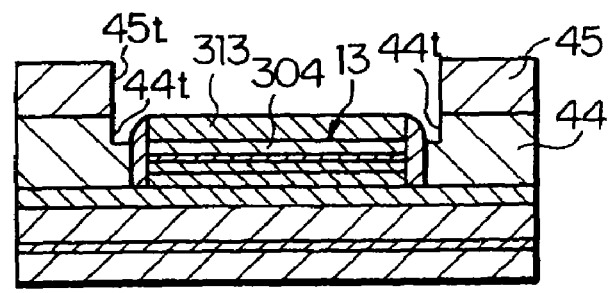

The next step shown in FIG. 34C is to form the fifth insulating film 45 of silicon oxide of 400 nm thick on the fourth insulating film 44. Then, a resist mask (not shown) is formed by lithography and etching technologies. This resist mask has an opening to form the trench pattern for the bit line to be wider than the TMR element. The wiring trench 45t for the bit line is formed in the fifth insulating film 45 on the TMR element 13 by using the resist mask. Etching is continued so as to form the trench 44t in the fourth insulating film 44 of the lateral side of the insulting film side wall 95S. This etching is anisotropic etching with high selectivity for silicon oxide and plasma silicon nitride or aluminum oxide. The extent of etching should be the interface between the cap layer 313 and the memory layer of the TMR element 13.

Figure 34D:
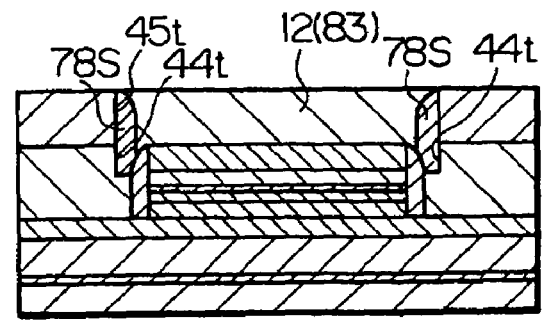

The next step shown in FIG. 34D is to fill the trench 44t and to form a high-permeability layer inside the wiring trench 45t by PVD process. Then, etch-back is performed to form the high-permeability side wall 78S, with the high-permeability layer remaining inside the trench 44t and on the lateral side of the wiring trench 45t.

Then, barrier metal (not shown) is formed inside the wiring trench 45t and on the surface of the fifth insulating film 45 by PVD process. The barrier metal is composed of titanium (Ti) of 5 nm thick and titanium nitride (TiN) of 20 nm thick, which are sequentially deposited on top of the other. Then, the wiring material layer 83 for the bit line is formed to fill the wiring trench 45t on the barrier metal by PVD process. The layer 83 is formed by depositing aluminum, copper, or aluminum-copper alloy in a thickness of 500 nm. After that, excess part of the wiring material layer 83 and the barrier metal on the fifth insulating film 45 are removed by polishing. In this way the bit line 12 of the wiring material layer is formed inside the wiring trench 45t, with the barrier metal interposed therebetween.

Figure 34E:
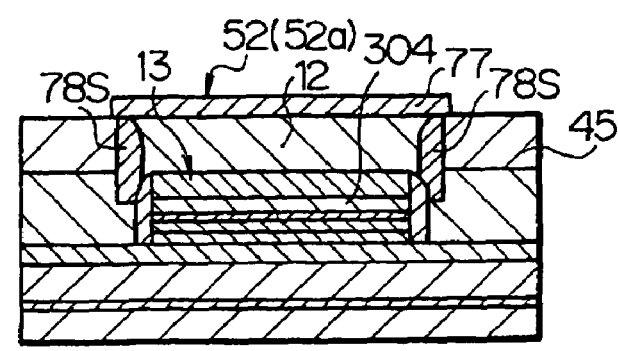

The next step shown in FIG. 34E is to form the high-permeability layer 77 of 50 nm thick, which covers the bit line 12, on the fifth insulating film 45 by PVD process. After that, a resist mask (not shown) that covers the bit line 12 is formed by lithography and etching technologies. Etching through this resist mask is performed on the high-permeability layer 77. As the result, the magnetic flux concentrator 52 (52a) composed of the high-permeability layer 77, which covers the upper side and lateral sides of the bit line 12, and the high-permeability side wall 78S is formed. The magnetic flux concentrator 52 constitutes the magnetic circuit, which efficiently concentrates the magnetic field generated by the bit line 12 at the memory layer 304 of the TMR element 13. This leads to highly efficient writing.

Next, a description is given below of the producing method of the second magnetic memory device of the third embodiment according to the present invention with reference to FIGS. 35A and 35B, which are schematic sectional views. What is mentioned in this section is one method for producing the second magnetic memory device of the second embodiment explained above with reference to FIG. 14.

Figure 35A:
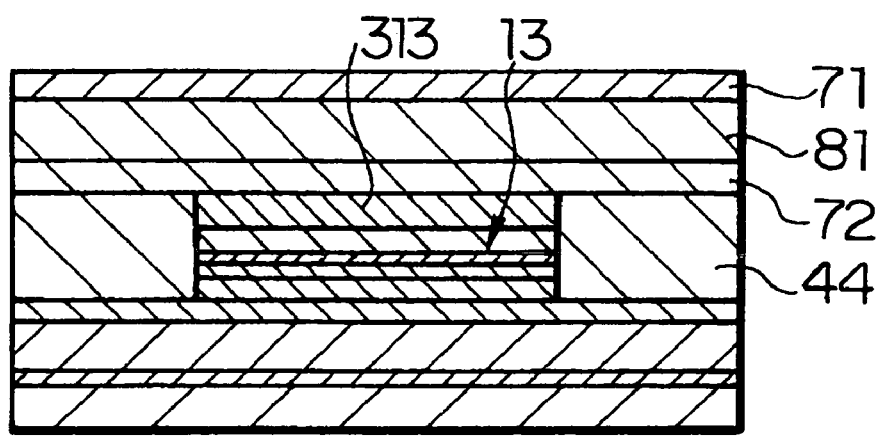
FIGS. 35A and 35B are schematic sectional views showing the producing method of the second magnetic memory device of the third embodiment according to the present invention.
Figure 35B:
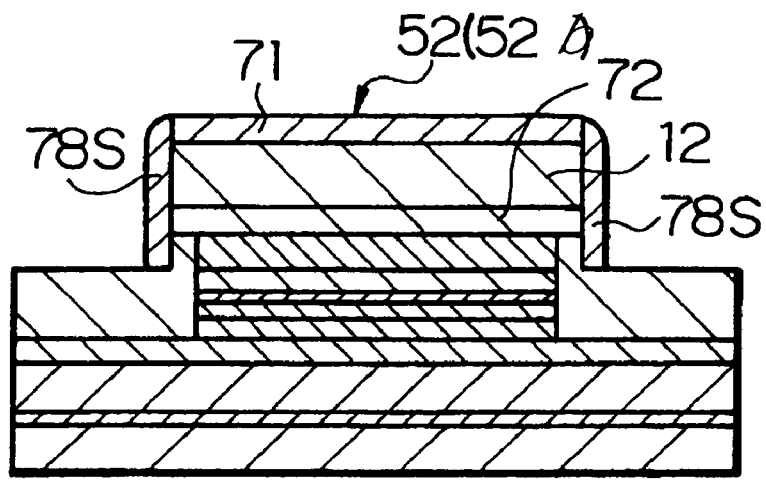

As shown in FIG. 35A, the fourth insulating film undergoes chemical-mechanical polishing so that the cap layer 313 of the TMR element 13 is exposed, and subsequently the high-permeability layer 72 is formed on the surface of the fourth insulating film 44 by PVD process. These steps are the same as those illustrated in FIG. 33A. Then, a barrier metal (not shown), the wiring material layer 81 for forming the bit line, and the high-permeability layer 71 are sequentially formed on the high-permeability layer 72 in the same way as explained above with reference to FIG. 33B.

The subsequent steps are the same as those explained above with reference to FIG. 33C. In these steps, etching to form the bit line is so carried out to etch the high-permeability layer 72 at the same time. As the results, as shown in FIG. 35B, the bit line 12 is formed with the wiring material layer 81, and the magnetic flux concentrator 52 (52b) is formed to cover the bit line 12 with the high-permeability layers 72 and 71 and the high-permeability side wall 78S. The end of the high-permeability side wall 78S is positioned in the same way as in the producing method of the second magnetic memory device of the first embodiment.

Next, a description is given below of the producing method of the second magnetic memory device of the fourth embodiment according to the present invention with reference to FIGS. 36A and 36B, which are schematic sectional views. What is mentioned in this section is one method for producing the third magnetic memory device of the second embodiment explained above with reference to FIG. 15.

Figure 36A:
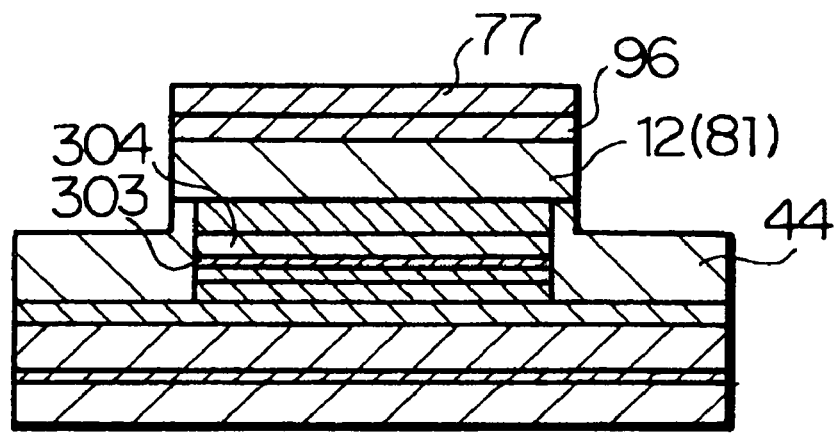
FIGS. 36A and 36B are schematic sectional views showing the producing method of the second magnetic memory device of the fourth embodiment according to the present invention.

As shown in FIG. 36A, a barrier metal (not shown), the wiring material layer 81 for forming the bit line, the insulating film 96, and the high-permeability layer 77 are formed sequentially. These steps are the same as those illustrated in FIG. 33B.

A resist mask (not shown), which is used to form the bit line to be connected to the cap layer 313 of the TMR element 13, is formed by lithography and etching technologies. Etching through the resist mask is performed sequentially on the high-permeability layer 77, the insulating layer 96, the wiring material layer 81, the barrier metal (not shown), and the fourth insulating film 44. The wiring material layer 81 forms the bit line 12 carrying the high-permeability layer 77 thereon with the insulating film 96 interposed therebetween. This etching terminates at an intermediate point of the fourth insulating film 44. The depth of etching should be approximately equal to the height of the cap layer 313 or the memory layer 304 of the TMR element.

Figure 36B:
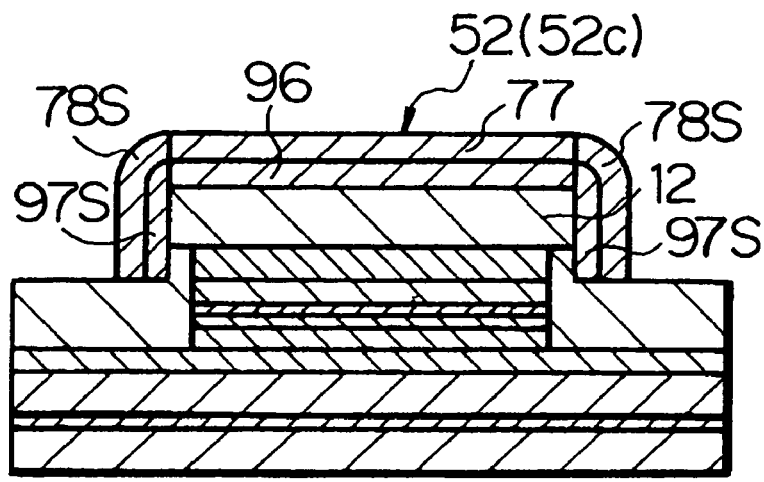

Then, as shown in FIG. 36B, an insulating film that covers the high-permeability layer 77 is formed by CVD process. Subsequently, etch-back is performed on the entire surface of the insulating film, thereby forming the insulating film side wall 97S on the side wall of the bit line 12. This insulating film side wall 97S is formed to cover at least the side wall of the insulating film 96 and causes the side wall of the high-permeability layer 77 to be exposed.

The next step is to form the high-permeability side wall 78S on the side wall of the bit line 12a with the insulating film side wall 97S interposed therebetween. A high-permeability layer is formed to cover the high-permeability layer 77 and the insulating film side wall 97S on the fourth insulating film 44 by PVD process. Then, etch-back is performed on the entire surface of the high-permeability layer. At this time, the high-permeability side wall 78S is formed to be connected to the high-permeability layer 77. In this way, the magnetic flux concentrator 52 (52c) composed of the high-permeability layer 77 and the high-permeability side wall 78S is formed. The end of the high-permeability side wall 78S is positioned in the same way as in the producing method of the second magnetic memory device of the first embodiment.

The steps in the third embodiment may be modified such that etch-back is not performed on the fourth insulating film 44, when the bit line 12 is formed. Alternatively, etch-back on the fourth insulating film 44 is performed after the insulating film side wall 97S has been formed. It is also possible to perform simultaneously etch-back on the fourth insulating film 44 and etch-back to form the insulating film side wall 97S.

Next, a description is given below of the producing method of the second magnetic memory device of the fifth embodiment according to the present invention with reference to FIGS. 37A and 37B, which are schematic sectional views.

Figure 37A:
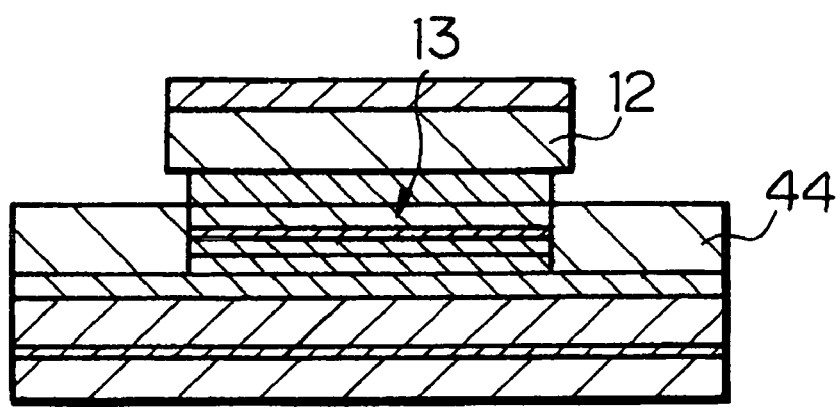
FIGS. 37A and 37B are schematic sectional views showing the producing method of the second magnetic memory device of the fifth embodiment according to the present invention.

As shown in FIG. 37A, the bit line 12 is formed wider than the TMR element 13. After etching on the fourth insulating film 44, side etching is performed on the fourth insulating film 44 under the bit line 12. These steps are the same as those illustrated in FIG. 33B.

Figure 37B:
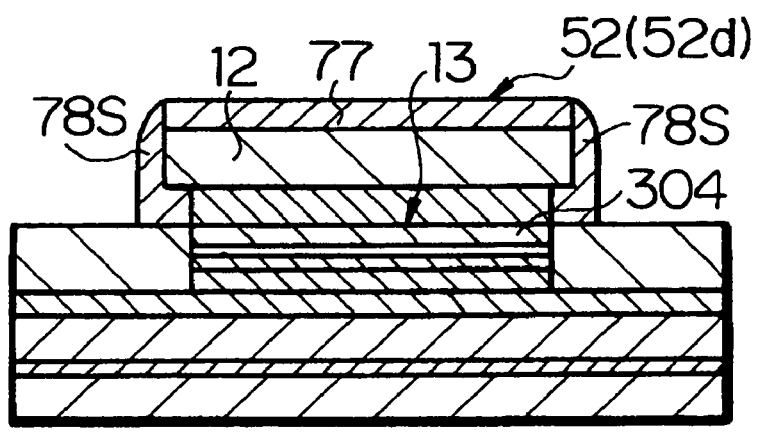

Then, as shown in FIG. 37B, the high-permeability side wall 78S is formed in the same way as explained above with reference to FIG. 33C. Thus, the high-permeability side wall 78S is formed closer to the TMR element 13 than in the case of the first embodiment explained above with reference to FIGS. 33A to 33C. In this way, the magnetic flux concentrator 52 (52d), which is composed of the high-permeability layer 77 and the high-permeability side wall 78S is formed, on the bit line 12.

The magnetic flux concentrator 52d formed in the above-mentioned manner is more effective in reducing the leakage of magnetic flux than the magnetic flux concentrator 52a formed by the method explained above for the first embodiment. Therefore, the concentrator 52d concentrates more efficiently the magnetic flux generated by the bit line 12 at the memory layer 304 of the TMR element 13 than the magnetic flux concentrator 52a in the first embodiment.

The method for side-etching the lower part of the bit line 12 in the fifth embodiment may also be applied to the third embodiment explained above with reference to FIGS. 35A and 35B. In the producing method of the second magnetic memory device of the fourth embodiment, each end 52s of the magnetic flux concentrators 52b and 52c should be formed wide. This object is achieved by forming the insulating film side wall 97S without performing etching on the fourth insulating film 44, when the bit line 12 is formed. After that, etch-back is performed on the fourth insulating film 44, side-etching is performed on the fourth insulating film 44 under the insulating side wall 97S, and the high-permeability side wall 78S is formed. The end of the high-permeability side wall 78S should be positioned in the same way as in the producing method of the second magnetic memory device of the first embodiment.

Next, a description is given below of the producing method of the third magnetic memory device according to the present invention with reference to FIGS. 38A to 38C, which are schematic sectional views. What is mentioned in this section is one method for producing the third magnetic memory device explained above with reference to FIG. 16.

Figure 38A:
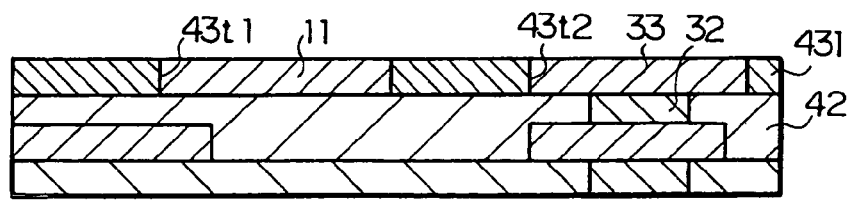
FIGS. 38A to 38C are schematic sectional views showing the producing method of the third magnetic memory device according to the present invention.

As shown in FIG. 38A, the insulating film 431, which becomes part of the third insulating film, is formed on the second insulating film 42 having the contact 32 formed thereon. This step is the same as that explained above with reference to FIG. 27A. Then, the trench 43t1 and the trench 43t2 are formed in the insulating film 431. The trench 43t1 is to form the word line, and the trench 43t2 is to form second landing pad for connection to the contact 32. Then, the wiring material layer is formed on the insulating film 431 containing the trenches 43t1 and 43t2, with a barrier metal (not shown) interposed therebetween which is the same one as explained above with reference to FIG. 27B. In this step, the high-permeability layer as explained with reference to FIGS. 27A to 27E is not formed. After that, excess part of the wiring material layer and the barrier metal on the insulating film 431 are removed. The writing word line 11, which fills the trench 43t1, and the second landing pad 33, which fills the trench 43t2, are formed.

Figure 38B:
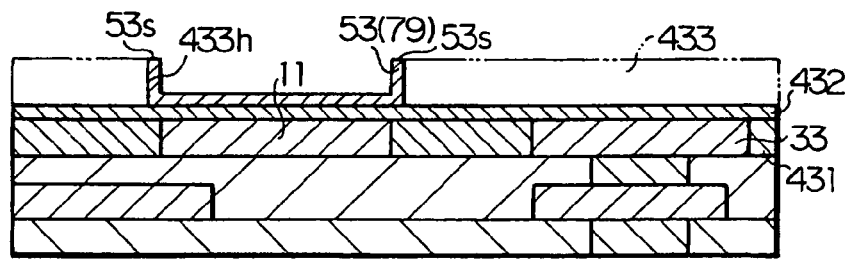
Figure 38C:
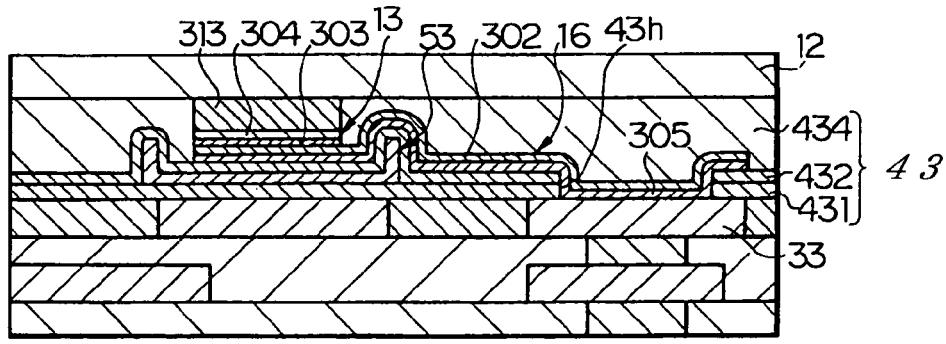

The next step as shown in FIG. 38B is to form the insulating film 432 out of aluminum oxide, silicon oxide, or silicon nitride. The insulating film 432 becomes a part of the third insulating film on the insulating film 431 which has the writing word line 11 and the second landing pad 33 formed thereon. The next step is to form the insulating film 433, which becomes a part of the third insulating film, out of an insulating material having etching selectivity with the insulating film 432. The insulating film 433 determines the height of the side wall of the magnetic flux concentrator to be formed later. Therefore, the film 433 should have an appropriate thickness so that the side wall of the magnetic flux concentrator will have a desired height. Then, by using lithography and etching technologies, a resist mask (not shown) is formed on the region in which the TMR element is to be formed. The resist mask has an opening which is larger than the TMR element. The insulating film 433 undergoes etching so that the opening 433h is formed in the insulating film 433 on the writing word line 12. After that, the resist mask is removed.

Then, the high-permeability layer 79 is formed on the insulating film 433 containing the inside of the opening 433h, and a planarized insulating film is formed. After that, excess part of the planarized insulting film and the high-permeability layer 79 on the insulating film 433 are removed by chemical-mechanical polishing. At this time, it is desirable that the planarized insulating film inside the opening 433h should be removed completely. This etching may be carried out such that the insulating film 433 undergoes etching. In this case, the insulating film 433 is removed by etching. As the result, the magnetic flux concentrator 53 composed of the high-permeability layer 79 is formed in the opening 433h. The end 53s of the side wall of the magnetic flux concentrator 53 should be lower than the interface between memory layer and the cap layer of the TMR element to be formed later. The height should preferably range from the interface between the tunnel insulating film and the memory layer to the interface between the memory layer and the cap layer.

The next step is to form the insulating film 434 covering the magnetic flux concentrator 53 on the insulating film 432 in the same way as explained above with reference to FIG. 28C. In this way, the third insulating film 43 is formed with the insulating films 431 to 434. Then, the opening 43h, which reaches the second landing pad 33, is formed in the third insulating film 43. After that, the antiferromagnetic material layer 305, the magnetization pinned layer 302, the tunnel insulating film 303, the memory layer 304, and the cap layer 313 are formed sequentially. After that, the same process as explained above with reference to FIGS. 28D to 28E is carried out so as to form the TMR element 13, the by-pass line 16, which connects the TMR element 13 and the second landing pad 33, the fourth insulating film 44, and the bit line 12, which is connected to the cap layer 13 of the TMR element 13.

Incidentally, in the case where the magnetic flux concentrator 53 is to be connected to the writing word line 11, it is unnecessary to form the insulating film 432. The other steps are the same as those explained above.

Next, a description is given below of the producing method of the fourth magnetic memory device of the first embodiment according to the present invention with reference to FIG. 39, which is a schematic sectional view. What is mentioned in this section is one method for producing the fourth magnetic memory device of the first embodiment explained above with reference to FIG. 17.

As explained above with reference to FIGS. 27A and 27B, the writing word line 11 and the second landing pad 33 are formed in the insulating film 431 which becomes a part of the third insulating film 43. At this time, etch-back on the writing word line 11 is not carried out. Consequently, the magnetic flux concentrator (first magnetic flux concentrator) 57 is formed only on the bottom and side wall of the writing word line 11. After that, the steps that follow the step of forming the insulating film 432 are carried out in the same way as explained above with reference to FIGS. 38B and 38C.

Figure 39:
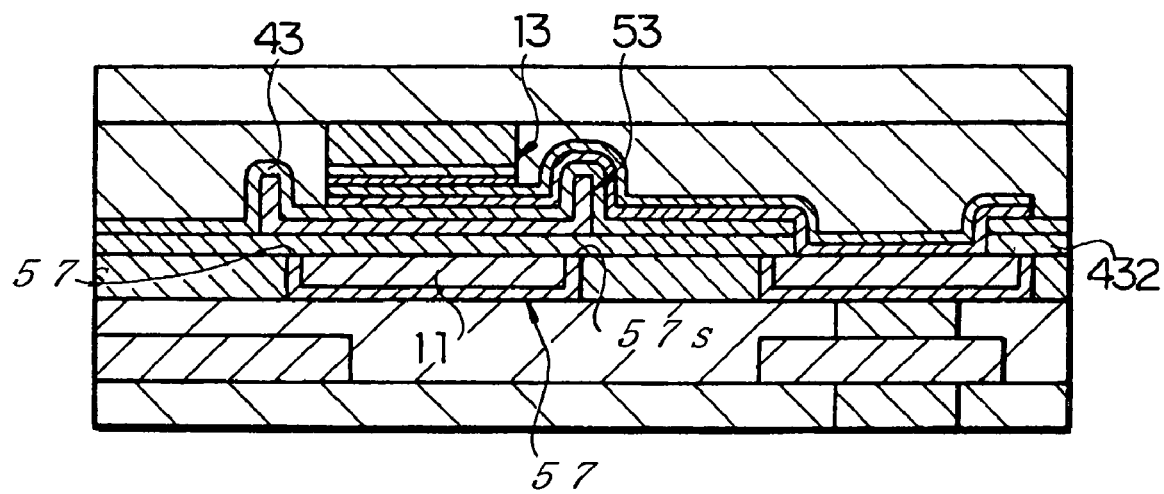
FIG. 39 is a schematic sectional view showing the producing method of the fourth magnetic memory device of the first embodiment according to the present invention.

As the result, as shown in FIG. 39, the magnetic flux concentrator (first magnetic flux concentrator) 57 composed of the high-permeability layer is formed on the underside and lateral sides of the writing word line 11, and the magnetic flux concentrator (second magnetic flux concentrator) 53 is formed between the writing word line 11 and the TMR element 13. The side wall of the first magnetic flux concentrator 57 is as high as the upper surface of the writing word line 11. The side wall of the second magnetic flux concentrator 53 is formed on the side wall of the TMR element 13, with the third insulating film 43 interposed therebetween. Its end 53s is formed in the same way as that of the magnetic flux concentrator 53 explained above in the method for producing the third magnetic memory device. Incidentally, it is not always necessary to form the insulating film 432. In this case, it is formed in such a way that the bottom of the second magnetic concentrator 53 is connected to the end 57s of the side wall of the first magnetic concentrator 57.

Next, a description is given below of the producing method of the fourth magnetic memory device of the second embodiment according to the present invention with reference to FIG. 40, which is a schematic sectional view. What is mentioned in this section is one method for producing the fourth magnetic memory device of the second embodiment explained above with reference to FIG. 18.

As explained above with reference to FIGS. 27A and 27B, the writing word line 11 and the second landing pad 33 are formed in the insulating film 431 which becomes a part of the third insulating film 43. At this time, after the high-permeability layer 73 has been formed, the insulating film 61 is formed, and subsequently the opening 61h connecting to the contact 32 is formed in the insulating film 61 in the trench in which the second landing pad 33 is to be formed later. It is desirable that the opening 61h should penetrate the high-permeability layer 73; however, this is not always necessary. After that, the wiring material layer 81 for forming the writing word line is formed. In this step, etch-back is not performed on the writing word line 11 as explained above with reference to FIGS. 27A to 27E. Therefore, the magnetic flux concentrator (first magnetic flux concentrator) 57 is formed only on the bottom and side wall of the writing word line 11, with the insulating film 61 interposed therebetween. On the other hand, even though the insulating film 61 is formed, the second landing pad 33 is connected to the contact 32 through the opening 61h. Incidentally, in the case where the opening 62h does not penetrate the high-permeability layer 73, the second landing pad 33 is connected through the high-permeability layer 73. The subsequent steps are the same as those which follow the step of forming the insulating film 432 as explained above with reference to FIGS. 38B and 38C.

Figure 40:
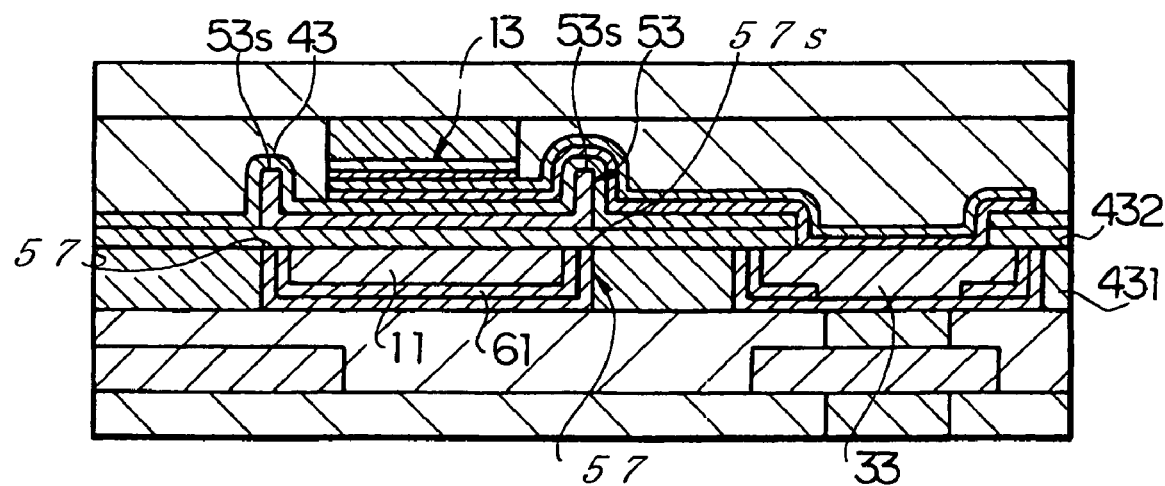
FIG. 40 is a schematic sectional view showing the producing method of the fourth magnetic memory device of the second embodiment according to the present invention.

As the result, as shown in FIG. 40, the magnetic flux concentrator (first magnetic flux concentrator) 57 composed of the high-permeability layer is formed on the underside and lateral sides of the writing word line 11, with the insulating film 61 interposed therebetween, and the magnetic flux concentrator (second magnetic flux concentrator) 53 is formed between the writing word line 11 and the TMR element 13. The height of the side wall of the first magnetic flux concentrator 57 is as high as the upper surface of the writing word line 11. The side wall of the second magnetic flux concentrator 53 is formed on the side wall of the TMR element 13, with the third insulating film 43 interposed therebetween. Its end 53s is formed in the same way as that of the magnetic flux concentrator 53 explained above in the method for producing the third magnetic memory device. Incidentally, it is not always necessary to form the insulating film 432. In this case, it is formed in such a way that the bottom of the second magnetic concentrator 53 is connected to the 57s of the side wall of the first magnetic concentrator 57.

Next, a description is given below of the producing method of the fourth magnetic memory device of the third embodiment according to the present invention with reference to FIGS. 41A and 41B, which are schematic sectional views. What is mentioned in this section is one method for producing the fourth magnetic memory device of the third embodiment explained above with reference to FIG. 19.

Figure 41A:
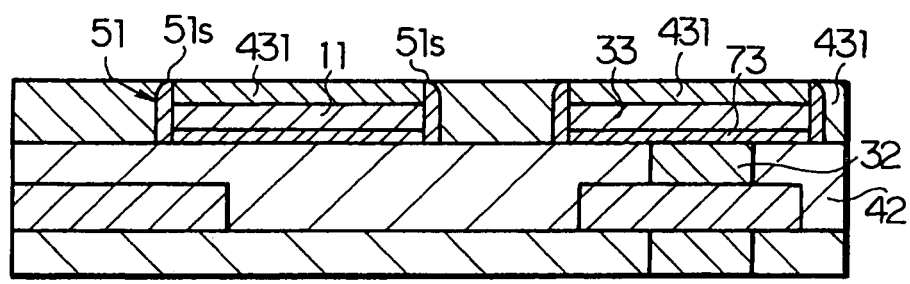
FIGS. 41A and 41B are schematic sectional views showing the producing method of the fourth magnetic memory device of the third embodiment according to the present invention.

The first step shown in FIG. 41A is to form the writing word line 11 and the second landing pad 33 on the second insulating film 42 by the steps explained above with reference to FIGS. 28A and 28B. The bottom and lateral sides of the writing word line 11 are surrounded by the magnetic flux concentrator (first magnetic flux concentrator) 51 of high-permeability layer. The second landing pad 33 is connected to the contact 32 through the high-permeability layer 73. After that, on the second insulating film 42 the insulating film 431, which becomes a part of the third insulating film covering the writing word line 11, the first magnetic flux concentrator 51, and the second landing pad 33, is formed. In this step, the insulating film 431 is formed thick to be higher than the first magnetic flux concentrator 51. After that, the surface of the insulating film 431 is planarized by chemical-mechanical polishing. At this time, the end 51s of the side wall of the first magnetic flux concentrator 51 may be exposed to the surface of the insulating film 431.

Figure 41B:
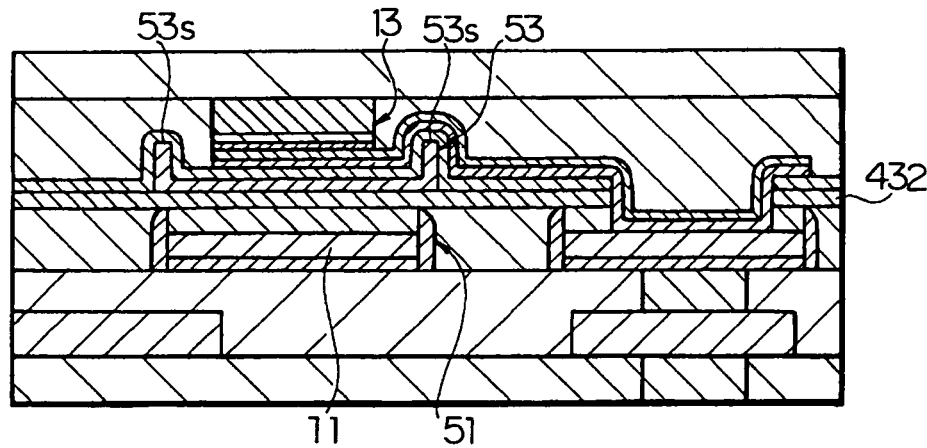

The subsequent steps as shown in FIG. 41B are the same as those which follow the step of forming the insulating film 432 which was explained with reference to FIG. 38B. Incidentally, it is not always necessary to form the insulating film 432. As the result, the magnetic flux concentrator (first magnetic flux concentrator) 51 of high-permeability layer is formed on the lower side and lateral sides of the writing word line 11 and the magnetic flux concentrator (second magnetic flux concentrator) 53 is formed between the writing word line 11 and the TMR element 13. The side wall of the first magnetic flux concentrator 51 projects from the upper surface of the writing word line 11 toward the TMR element 13, and the end 53s of the side wall of the second magnetic flux concentrator 53 is formed in the same way as the magnetic flux concentrator 53 explained above for producing the third magnetic memory device.

Figure 42:
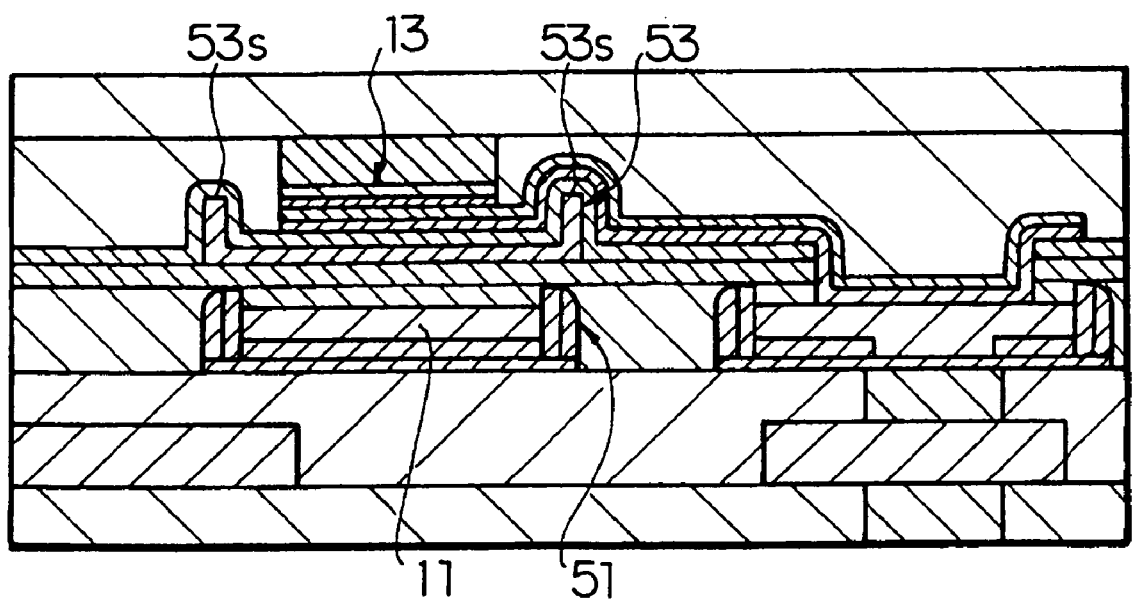
FIG. 42 is a schematic sectional view showing the producing method of the fourth magnetic memory device of the fourth embodiment according to the present invention.

Next, a description is given below of the producing method of the fourth magnetic memory device of the fourth embodiment according to the present invention with reference to FIG. 42, which is a schematic sectional view. What is mentioned in this section is one method for producing the fourth magnetic memory device of the fourth embodiment explained above with reference to FIG. 20.

The first step is to form the magnetic flux concentrator (first magnetic flux concentrator) 51, the writing word line 11, and the second landing pad 33 on the second insulating film 42 by the steps explained above with reference to FIGS. 31A and 31B. The first magnetic flux concentrator 51 is composed of the high-permeability layer 73 and the high-permeability side wall 75S. The bottom and lateral sides of the writing word line 11 are surrounded by the first magnetic flux concentrator 51, with the insulating film 92 and the insulating film side wall 91S interposed therebetween. The second landing pad 33 connects to the contact 32. After that, the dummy film 82 is removed. Then, on the second insulating film 42 the insulating film 431, which becomes a part of the third insulating film covering the writing word line 11, the first magnetic flux concentrator 51, and the second landing pad 33, is formed. In this step, the insulating film 431 is formed thick to be higher than the first magnetic flux concentrator 51. After that, the surface of the insulating film 431 is planarized by chemical-mechanical polishing. At this time, the end 51s of the side wall of the first magnetic flux concentrator 51 may be exposed to the surface of the insulating film 431.

The subsequent steps are the same as those which follow the step of forming the insulating film 432 which was explained with reference to FIG. 38B. Incidentally, it is not always necessary to form the insulating film 432. As the result, the magnetic flux concentrator (first magnetic flux concentrator) 51 of high-permeability layer is formed on the lower side and lateral sides of the writing word line 11, and the magnetic flux concentrator (second magnetic flux concentrator) 53 is formed between the writing word line 11 and the TMR element 13, as shown in FIG. 42. The side wall of the first magnetic flux concentrator 51 projects from the upper surface of the writing word line 11 toward the TMR element 13, and the end 53s of the side wall of the second magnetic flux concentrator 53 is formed in the same way as the magnetic flux concentrator 53 explained above for producing the third magnetic memory device.

Next, a description is given below of the producing method of the fifth magnetic memory device of the first embodiment according to the present invention with reference to FIG. 43, which is a schematic sectional view. What is mentioned in this section is one method for producing the fifth magnetic memory device of the first embodiment explained above with reference to FIG. 22.

Figure 43:
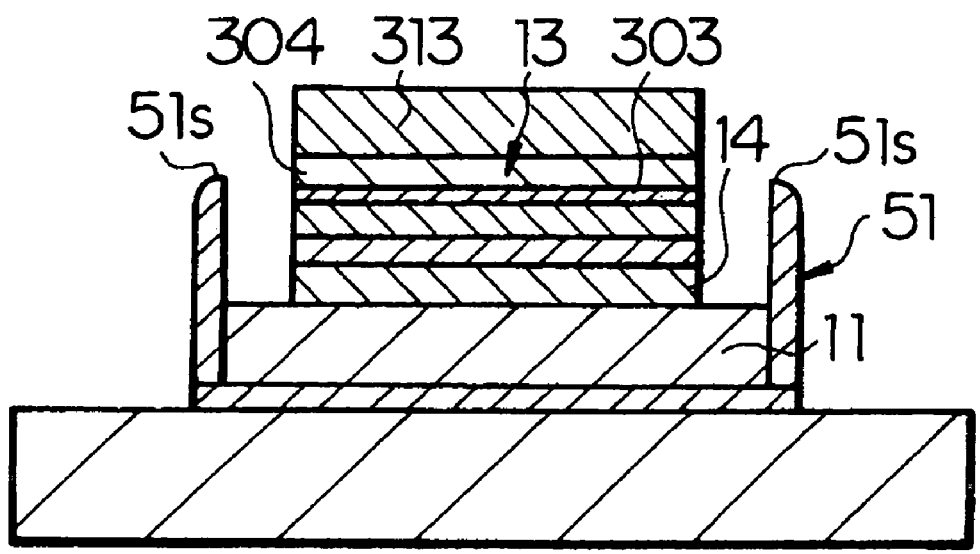
FIG. 43 is a schematic sectional view showing the producing method of the fifth magnetic memory device of the first embodiment according to the present invention.

The first step as shown in FIG. 43 is to form the magnetic flux concentrator 51 around the writing word line 11 in the same way as explained above with reference to FIGS. 27A to 27E and FIGS. 28A to 28E. After that, the switching element 14 and the TMR element 13 are formed on the writing word line 11 by the existing producing method.

In this case, too, the side wall of the magnetic flux concentrator 51 is formed so as to project from the upper surface of the writing word line 11 toward the TMR element 13. Its end 51s may be formed up to the height of the interface between the memory layer 304 and the cap layer 313 of the TMR element 13. The height should preferably range from the interface between the tunnel insulating film 303 and the memory layer 304 to the interface between the memory layer 304 and the cap layer 313. The distance between the end 51s of the magnetic flux concentrator 51 and the TMR element 13 should preferably be no larger than 200 nm so that the magnetic flux concentrated at the end 51s of the magnetic flux concentrator 51 efficiently reaches the memory layer 304.

Next, a description is given below of the producing method of the fifth magnetic memory device of the second embodiment according to the present invention with reference to FIG. 44, which is a schematic sectional view. What is mentioned in this section is one method for producing the fifth magnetic memory device of the second embodiment explained above with reference to FIG. 23.

Figure 44:
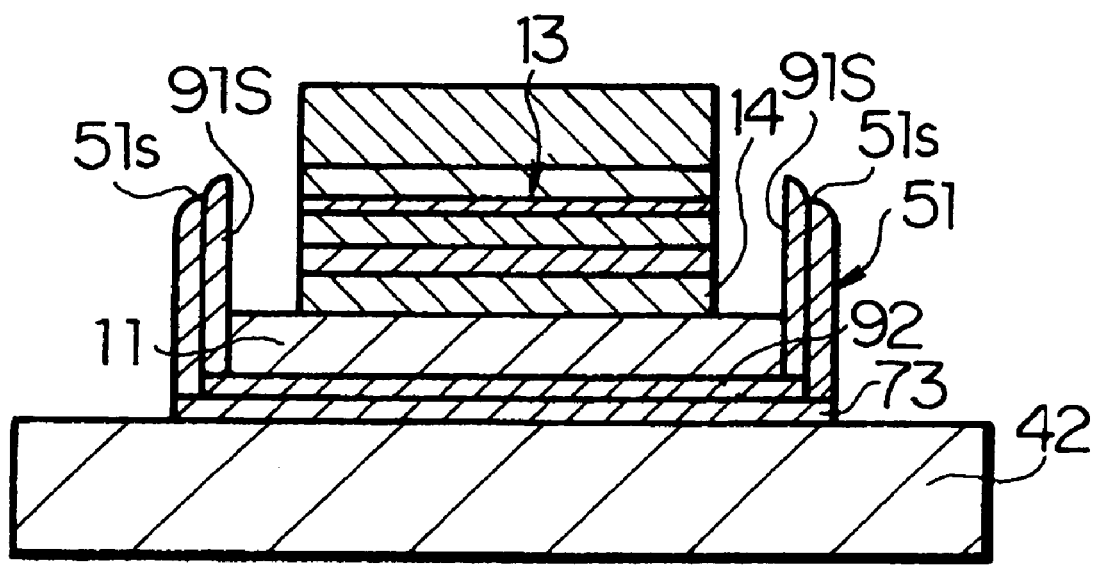
FIG. 44 is a schematic sectional view showing the producing method of the fifth magnetic memory device of the second embodiment according to the present invention.

The first step as shown in FIG. 44 is to form the writing word line 11 and the magnetic flux concentrator 51 in the same way as explained above with reference to FIGS. 31A and 31B. As the result, the high-permeability layer 73 is formed on the second insulating film 42, and the writing word line 11 is formed on the second insulating film 42, with the insulating film 92 interposed therebetween. Also, the magnetic flux concentrator 51 is formed on the bottom of the writing word line 11, with the insulating film 92 interposed therebetween, and the magnetic flux concentrator 51 is formed on the side wall of the writing word line 11, with the insulating film side wall 91S interposed therebetween. Incidentally, since the switching element 14 is formed on the writing word line 11, it is possible to form subsequently the writing word line 11, the switching element 14, and the TMR element 13 by the existing producing method.

In this case, too, the end 51s of the side wall of the magnetic flux concentrator 51 is formed at the same position as in the method for producing the fifth magnetic memory device of the first embodiment.

Next, a description is given below of the producing method of the sixth magnetic memory device of the first embodiment according to the present invention. What is mentioned in this section is one method for producing the sixth magnetic memory device of the first embodiment explained above with reference to FIG. 24. Incidentally, like reference characters designate constituents corresponding to those in the first to fifth magnetic memory devices mentioned above.

The writing word line 11, the switching element 14, the TMR element 13, and the fourth insulating film 44 covering the TMR element 13 are formed by the existing method or by the producing method explained above with reference to FIG. 42 or FIG. 43. Then, the bit line 12 is formed by the producing method explained above with reference to FIGS. 33B to 33C. The high-permeability layer 77 is formed on the upper surface of the bit line 12. Further, the high-permeability side wall 78S is formed on the lateral side of the bit line 12. Finally, the magnetic flux concentrator 52 is formed which is composed the high-permeability layer 77 and the high-permeability side wall 78S connected thereto.

In this case, too, the side wall of the magnetic flux concentrator 52 is formed in the same way as the method for producing the second magnetic memory device so as to project from the bit line 12 toward the TMR element 13. Its end 52s may be formed up to the height of the interface between the memory layer 304 and the tunnel insulating film 303 of the TMR element 13. The height should preferably range from the interface between the tunnel insulating film 303 and the memory layer 304 to the interface between the memory layer 304 and the cap layer 313. The distance between the end 52s of the magnetic flux concentrator 52 and the TMR element 13 should preferably be no larger than 200 nm so that the magnetic flux concentrated at the end 52s of the magnetic flux concentrator 52 efficiently reaches the memory layer 304.

The advantage of the above-mentioned producing method is that the magnetic flux concentrator 51 composed of the high-permeability layer 77 and the high-permeability side wall 78S constitutes the magnetic circuit, which efficiently concentrates the magnetic field generated by the bit line 12 at the memory layer 304 of the TMR element 13.

Alternatively, the magnetic flux concentrator 52 may be formed by the producing method explained above with reference to FIGS. 34A to 34E.

Next, a description is given below of the producing method of the sixth magnetic memory device of the second embodiment according to the present invention. What is mentioned in this section is one method for producing the sixth magnetic memory device of the second embodiment explained above with reference to FIG. 25. Incidentally, like reference characters designate constituents corresponding to those in the first to fifth magnetic memory devices mentioned above.

The writing word line 11, the switching element 14, the TMR element 13, and the fourth insulating film 44 covering the TMR element 13 are formed by the existing method or by the producing method explained above with reference to FIG. 42 or FIG. 43. Then, the bit line 12 is formed by the producing method explained above with reference to FIGS. 35A and 35B. The high-permeability layer 72 is formed on the lower surface of the bit line 12, and the high-permeability layer 77 is formed on the upper surface of the bit line 12. Further, the high-permeability side wall 78S is formed on the lateral side of the bit line 12. In this way, the high-permeability layers 72 and 77 and the magnetic flux concentrator 52 (52b) of the high-permeability side wall 78S connected thereto is formed.

In this case, too, the end 52s of the side wall of the magnetic flux concentrator 52 is formed at the same position as in the method for producing the sixth magnetic memory device of the first embodiment.

The advantage of the above-mentioned producing method is that the magnetic flux concentrator 52 composed of the high-permeability layers 72 and 77 and the high-permeability side wall 78S constitutes the magnetic circuit, which efficiently concentrates the magnetic field generated by the bit line 12 at the memory layer 304 of the TMR element 13.

Next, a description is given below of the producing method of the sixth magnetic memory device of the third embodiment according to the present invention. What is mentioned in this section is one method for producing the sixth magnetic memory device of the third embodiment explained above with reference to FIG. 26. Incidentally, like reference characters designate constituents corresponding to those in the first to fifth magnetic memory devices mentioned above.

The writing word line 11, the switching element 14, the TMR element 13, and the fourth insulating film 44 covering the TMR element 13 are formed by the existing method or by the producing method explained above with reference to FIG. 42 or FIG. 43. Then, the bit line 12 is formed by the producing method explained above with reference to FIGS. 36A and 36B. The high-permeability layer 77 is formed on the upper surface of the bit line 12, with the insulating film 96 interposed therebetween. Further, the high-permeability side wall 78S is formed on the lateral side of the bit line 12, with the insulating film side wall 97S interposed therebetween. In this way, the magnetic flux concentrator 52 (52c) composed of the high-permeability layer 77 and the high-permeability side wall 78S connected thereto is formed.

In this case, too, the end 52s of the side wall of the magnetic flux concentrator 52 is formed at the same position as in the method for producing the sixth magnetic memory device of the first embodiment.

The advantage of the above-mentioned producing method is that the magnetic flux concentrator 52 composed of the high-permeability layer 77 and the high-permeability side wall 78S constitutes the magnetic circuit, which efficiently concentrates the magnetic field generated by the bit line 12 at the memory layer 304 of the TMR element 13.

The first magnetic memory device mentioned above has a magnetic flux concentrator of high-permeability layer formed at least on the lateral sides of a first wiring and on the side of the first wiring which is opposite to the side facing the tunnel magnetoresistance element. At least either of the high-permeability layer formed on the lateral sides of the first wiring projects from the first wiring toward the tunnel magnetoresistance element. Therefore, the magnetic field generated by the first wiring is efficiently concentrated at the memory layer of the tunnel magnetoresistance element by the end of the magnetic flux concentrator projecting toward the tunnel magnetoresistance element. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells. This helps increase the reliability of writing.

The second magnetic memory device mentioned above has a magnetic flux concentrator of high-permeability layer formed at least on the lateral sides of a second wiring and on the side of the second wiring which is opposite to the side facing the tunnel magnetoresistance element. At least either of the high-permeability layer formed on the lateral sides of the second wiring projects from the second wiring toward the tunnel magnetoresistance element. Therefore, the magnetic field generated by the second wiring is efficiently concentrated at the memory layer of the tunnel magnetoresistance element by the end of the magnetic flux concentrator projecting toward the tunnel magnetoresistance element. The effect of the foregoing is that it is possible to reduce the current value necessary for writing. This leads to the saving of power consumption and extends the life on electromigration of the second wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells. This helps increase the reliability of writing.

The third magnetic memory device mentioned above has a magnetic flux concentrator of high-permeability layer formed between a first wiring and a tunnel magnetoresistance element and on the lateral sides of the tunnel magnetoresistance element, with an insulating film interposed therebetween. Therefore, the third magnetic memory device produces the same effect as the first magnetic memory device.

The fourth magnetic memory device mentioned above has a first magnetic flux concentrator and a second magnetic flux concentrator of high-permeability layers. The first magnetic flux concentrator is formed at least on both of the lateral sides of a first wiring and on the side of the first wiring which is opposite to the side facing the tunnel magnetoresistance element. The second magnetic flux concentrator is formed between the first wiring and the tunnel magnetoresistance element and on the lateral sides of the tunnel magnetoresistance element, with an insulating film interposed therebetween. Therefore, the fourth magnetic device produces the same effect as the first magnetic memory device.

The fifth magnetic memory device mentioned above has a magnetic flux concentrator of high-permeability layer formed at least on both of the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element. Therefore, the magnetic memory device of cross-point type also produces the same effect as the first magnetic memory device.

The sixth magnetic memory device mentioned above has a magnetic flux concentrator of high-permeability layer formed at least on both of the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element. Therefore, the magnetic memory device of cross-point type also produces the same effect as the second magnetic memory device.

The first, second, fourth, fifth, and sixth memory devices mentioned above may have an insulating film formed between the high-permeability layer and the first or second wiring. This modified structure also produces the same effect as mentioned above.

The method for producing the first magnetic memory device mentioned above includes a step of forming a magnetic flux concentrator of high-permeability layer at least on both of the lateral sides of the first wiring and on the side of the first wiring which is opposite to the side facing the tunnel magnetoresistance element. At least either of the high-permeability layer formed on the lateral sides of the first wiring projects from the first wiring toward the tunnel magnetoresistance element. Therefore, the magnetic field generated by current flowing through the first wiring is efficiently concentrated at the memory layer of the tunnel magnetoresistance element by the magnetic flux concentrator. The effect of the foregoing is that it is possible to reduce the current value necessary for writing. This leads to the saving of power consumption and extends the life on electromigration of the first wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The method for producing the second magnetic memory device mentioned above includes a step of forming a magnetic flux concentrator of high-permeability layer at least on both of the lateral sides of the second wiring and on the side of the second wiring which is opposite to the side facing the tunnel magnetoresistance element. At least either of the high-permeability layer formed on the lateral sides of the second wiring projects from the second wiring toward the tunnel magnetoresistance element. Therefore, the magnetic field generated by current flowing through the second wiring is efficiently concentrated at the memory layer of the tunnel magnetoresistance element by the magnetic flux concentrator. The effect of the foregoing is that it is possible to reduce the current value necessary for writing. This leads to the saving of power consumption and extends the life on electromigration of the second wiring. The reduction of driving current permits the area of the current driving circuit to be reduced, which in turn leads to a higher degree of integration. Moreover, the reduced driving current decreases the leakage of magnetic field, thereby decreasing interference effect with adjacent cells.

The method for producing the third magnetic memory device mentioned above includes a step of forming, after forming the first wiring, a magnetic flux concentrator of high-permeability layer between the first wiring and the tunnel magnetoresistance element and on the lateral sides of the tunnel magnetoresistance element, with an insulating film interposed therebetween. Therefore, the magnetic field generated by current flowing through the first wiring is efficiently concentrated at the memory layer of the tunnel magnetoresistance element by the magnetic flux concentrator. Therefore, this producing method produces the same effect as the producing method of the first magnetic memory device.

The method for producing the fourth magnetic memory device mentioned above includes a step of forming a first magnetic flux concentrator of high-permeability layer at least on both of the lateral sides of the first wiring and on the side of the first wiring which is opposite to the side facing the tunnel magnetoresistance element. The method also includes a step of forming, after forming the first wiring, a second magnetic flux concentrator of high-permeability layer between the first wiring and the tunnel magnetoresistance element and on the lateral sides of the tunnel magnetoresistance element, with an insulating film interposed therebetween. Therefore, the magnetic field generated by current flowing through the first wiring is transmitted from the first magnetic flux concentrator to the second magnetic flux concentrator. The second magnetic flux concentrator efficiently concentrates the magnetic field, which is transmitted through the first magnetic flux concentrator, at the memory layer of the tunnel magnetoresistance element. Therefore, this producing method produces the same effect as the producing method of the first magnetic memory device.

The method for producing the fifth magnetic memory device mentioned above includes a step of forming a magnetic flux concentrator of high-permeability layer at least on both of the lateral sides of the first wiring and on the side of the first wiring which is opposite to the side facing the tunnel magnetoresistance element. At least either of the high-permeability layers formed on both of the lateral sides of the first wiring projects from the first wiring toward the tunnel magnetoresistance element. Therefore, this producing method produce the same effect as the method for producing the first magnetic memory device also in the case of the magnetic memory device of cross-point type.

The method for producing the sixth magnetic memory device mentioned above includes a step of forming a magnetic flux concentrator of high-permeability layer at least on both of the lateral sides of the second wiring and on the side of the second wiring which is opposite to the side facing the tunnel magnetoresistance element. At least either of the high-permeability layers formed on both of the lateral sides of the second wiring projects from the second wiring toward the tunnel magnetoresistance element. Therefore, this producing method produce the same effect as the method for producing the second magnetic memory device also in the case of the magnetic memory device of cross-point type.

The above-mentioned method for producing the first, second, fourth, fifth, and sixth magnetic memory devices produces the same effect as mentioned above even if an insulating film is formed between the high-permeability layer and the first or second wiring.

The invention claimed is:

1. A nonvolatile magnetic memory device of the type having:
   a first wiring;
   a second wiring intersecting three-dimensionally with said first wiring; and
   a tunnel magnetoresistance element which is electrically insulated from said first wiring and electrically connected to said second wiring and which is formed in the region of intersection of said first wiring and said second wiring such that a tunnel insulating layer is sandwiched between ferromagnetic materials which change in resistance depending on whether the spin direction is parallel or antiparallel, thereby recording information; wherein
   said magnetic memory device comprises a first portion of a magnetic flux concentrator of high-permeability layer formed between said first wiring and said tunnel magnetoresistance element and a second portion of said magnetic flux concentrator of high permeability layer adjacent the lateral sides of said tunnel magnetoresistance element, with an insulating film interposed therebetween.

2. A nonvolatile magnetic memory device of the type having:
   a first wiring;
   a second wiring intersecting three-dimensionally with said first wiring; and
   a tunnel magnetoresistance element which is electrically insulated from said first wiring and electrically connected to said second wiring and which is formed in the region of intersection of said first wiring and said second wiring such that a tunnel insulating layer is sandwiched between ferromagnetic materials which change in resistance depending on whether the spin direction is parallel or antiparallel, thereby recording information; wherein
   said magnetic memory device comprises a first magnetic flux concentrator of high-permeability layer formed at least adjacent both of the lateral sides of said first wiring and on the side of said first wiring which is opposite to the side facing said tunnel magnetoresistance element, and a second magnetic flux concentrator of high-permeability layer formed between said first wiring and said tunnel magnetoresistance element and adjacent the lateral sides of said tunnel magnetoresistance element, with an insulating film interposed therebetween.

3. The magnetic memory device as defined in claim 2, wherein an insulating film is formed between the first magnetic flux concentrator and the first wiring.

4. The magnetic memory device as defined in claim 1, wherein at least the second portion of said magnetic flux concentrator of high permeability layer formed on the lateral sides of the first wiring projects beyond the first wiring and toward the tunnel magnetoresistance element.

5. The magnetic memory device as defined in claim 4, wherein an insulating film is formed between the first magnetic flux concentrator and the first wiring.

* * * * *